(12) United States Patent
Kojima

(10) Patent No.: US 6,222,197 B1
(45) Date of Patent: Apr. 24, 2001

(54) CHARGED-PARTICLE-BEAM PATTERN-TRANSFER METHODS AND APPARATUS

(75) Inventor: Shin-Ich Kojima, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/138,356

(22) Filed: Aug. 21, 1998

(30) Foreign Application Priority Data

Aug. 21, 1997 (JP) .................................. 9-224710
Jan. 30, 1998 (JP) ............................... 10-019780
Mar. 11, 1998 (JP) ............................... 10-059659

(51) Int. Cl.[7] .................................................. H01J 37/302
(52) U.S. Cl. .............................. 250/492.22; 250/492.23; 250/492.2; 250/491.1; 250/396 ML
(58) Field of Search ................... 250/492.22, 492.23, 250/492.2, 491.1, 396 ML

(56) References Cited

U.S. PATENT DOCUMENTS

| | | | |
|---|---|---|---|
| 4,544,847 | * 10/1985 | Taylor | 250/396 ML |
| 5,624,774 | 4/1997 | Okino et al. | 430/5 |
| 5,763,894 | * 6/1998 | Enichen et al. | 250/491.1 |
| 5,770,863 | 6/1998 | Nakasuji | 250/492.2 |

FOREIGN PATENT DOCUMENTS 08064522 3/1996 (JP) .
09129544 5/1997 (JP) .

OTHER PUBLICATIONS

Chu et al., "Numerical Analysis of Electron Beam Lithography Systems. Part III: Calculation of the Optical Properties of Electron Focusing Systems and Dual–Channel Deflection Systems with Combined Magnetic and Electrostatic Fields," *Optik*, 61, No. 2, pp. 121–145 (1982).

Zhu et al., "Dynamic Correction of Aberrations in Focusing and Deflection Systems with Shaped Beams," *SPIE Proceedings*, vol. 2522, pp. 66–77 (1995).

* cited by examiner

*Primary Examiner*—Jack Berman
(74) *Attorney, Agent, or Firm*—Klarquist Sparkman Campbell Leigh & Whinston, LLP

(57) ABSTRACT

Exposure methods are disclosed for high precision pattern transfer with reduced distortion using an evaluation mask containing distortion-measurement patterns. The distortion-measurement patterns are provided in multiple subfields on a mask, and images of the patterns are projected and exposed onto a wafer by sequentially irradiating the subfields. Distortions in the images are measured. These measurements are then used to correct distortions in subsequent images with a dynamic correcting system comprising focus-correction coils and astigmatism compensators. Additional methods and apparatus are provided in which simultaneous equations are solved to determine currents in focus-correction coils and astigmatism compensators.

19 Claims, 16 Drawing Sheets

CHARGED-PARTICLE-BEAM PATTERN-TRANSFER METHODS AND APPARATUS

FIELD OF THE INVENTION

The invention pertains to aberration compensation for charged-particle-beam pattern-transfer apparatus.

BACKGROUND OF THE INVENTION

High resolution pattern-transfer apparatus are required for the production of small-geometry integrated circuits. While pattern-transfer apparatus using optical radiation are widely used, charged-particle-beam ("CPB") apparatus using electron beams have also been used. CPB apparatus generally provide a higher resolution than that available with apparatus using optical radiation.

Integrated circuits are generally formed on a semiconductor wafer by forming a series of circuit patterns on a surface of the wafer. The circuit patterns are formed by transferring a sequence of circuit patterns sequentially onto the wafer surface. The resulting integrated circuit is a multi-layered structure in which planar circuits are layered parallel to the surface of the wafer.

In order to produce small-geometry integrated circuits, circuit patterns must be transferred with a high resolution and the various circuit patterns must precisely align on the wafer. Therefore, the individual circuit patterns must be correctly focused on the surface of the wafer and must be precisely registered with other circuit patterns. Registration errors must be kept within an acceptable tolerance.

In CPB pattern transfer, the mask defining the circuit pattern to be transferred to the wafer is usually divided into a plurality of smaller regions referred to as subfields; the pattern portion in a subfield is transferred to the wafer in a single exposure. The subfields are transferred so that they are accurately joined or "stitched" together on the wafer. One CPB system that stitches together subfield patterns is described in Japanese Kokai patent document No. HEI 8-64522.

In CPB pattern-transfer apparatus, aberration correction systems such as deflectors or dynamic compensators are provided to reduce image blurring and distortion in the subfield images caused by aberrations in the CPB optical system. The CPB optical systems use either electromagnetic or electrostatic lenses and high resolution is obtained by designing the deflectors and dynamic compensators to compensate the aberrations of the lenses.

Some pattern-transfer errors arise from variations in wafer thickness or rotational errors of the wafer with respect to the mask during exposure. These errors show up as rotational misalignments of a subfield image, magnification errors of the subfield image, and focus errors. With reference to FIG. 19A, illustrative subfield images a1, a2 are shown with respect to ideal subfield images b1, b2, respectively. The subfield images a1, a2 are tilted by an angle θ with respect to the ideal subfield images b1, b2 and are thus rotationally misaligned with respect to the ideal subfield images b1, b2. With reference to FIG. 19B, illustrative subfield images a1, a2 are shown with respect to ideal images b1, b2. The subfield images a1, a2 exhibit a magnification error, i.e., the subfield images a1, a2 are too large. In addition, the subfield images a1, a2 overlap along a seam c. With reference to FIG. 19C, subfield images are focused at a focal plane f that is a distance Δz above a wafer surface W. Thus, FIG. 19C illustrates a focus error. To correct the types of errors shown in FIGS. 19A–19C, the lens currents (or voltages if electrostatic lenses are used) are adjusted. Alternatively, one or more correcting lenses can be provided.

With reference to FIG. 20, a conventional electron-beam pattern-transfer apparatus includes an electron gun 901 that produces an electron beam EB. The electron beam EB propagates along an axis AX and is shaped into a desired transverse profile (e.g., a square) by an aperture 903. A condenser lens 902 then directs the electron beam EB to a selected subfield 951 of a reticle (mask) 905 with a subfield-selection deflector 904. The electron beam EB transmitted by the reticle 905 is then deflected by a deflector 908 and imaged with a predetermined demagnification onto the wafer 911 with projection lenses 909, 910. Deflector controllers 917, 918 control the magnitude and direction of the deflection produced by the deflectors 904 and 908, respectively.

The reticle 905 and wafer 911 are mounted on a reticle stage 906 and a wafer stage 912, respectively, that provide translations in an xy-plane as directed by respective stage controllers 907, 913. The locations of the stages 906, 912 are detected with corresponding position detectors 914, 915, typically, laser interferometers. A main controller 916 controls positioning so that the deflectors 904, 908 and stages 906, 912 are controlled based on the positions measured by the position detectors 914, 915.

With reference to FIG. 22, the mask 905 is divided into a plurality of subfields $951_1$–$951_n$, separated from each other by boundary regions 952 that either block or scatter the electron beam EB. The electron beam EB transmitted by a subfield such as the exemplary subfield $951_1$, that is displaced from the axis AX is imaged onto the wafer 911 at a corresponding transfer subfield $9111_1$, that is also displaced from the axis AX. The remaining subfields $951_2$–$951_n$ are similarly projected onto corresponding transfer subfields $9111_2$–$9111_n$ so that the circuit pattern is defined by the mask 905 transferred to a wafer field 9110.

The mask subfields 951 are separated by boundary regions 952 that are not transferred to the wafer 911. To prevent such transfer, appropriate deflection of the electron beam EB is controlled by the deflector 908. The mask subfields 951 are projected onto the wafer 911 such that the corresponding transfer subfields 9111 contact each other along their respective edges.

Unfortunately, aberration-correcting deflectors and dynamic compensators that correct CPB optical-system aberrations introduce additional aberrations. With reference to FIG. 21A, a portion of a circuit pattern that extends across transfer subfields 9111a and 9111b ideally joins accurately along a seam 9111c located between adjacent transfer subfields. Thus, conductors P extending from the subfield 9111a to the subfield 9111b extend cleanly and contiguously across the seam 9111c. Referring to FIG. 21B, if there is distortion in the CPB optical system, then subfield images Q1, Q2 are distorted, creating a gap Q3 between the subfield images Q1, Q2 and a corresponding break in the conductors P. With reference to FIG. 21C, distortion can also cause subfield images Q1, Q2 to overlap each other.

A CPB optical system comprises a series of electromagnetic or electrostatic lenses, each of which can exhibit manufacturing errors. In addition, these lenses also exhibit mounting errors so that the electromagnetic fields that focus and deflect the electron beam deviate from design values. The aberrations in CPB images are a function of the CPB path and the electromagnetic fields along the path. See, e.g., Chu and Munro, *Optik* 61:121–145 (1982). If the CPB optical system exhibits such manufacturing errors, aberrations such as defocus and distortion are introduced.

Dynamic correction of deflection aberrations has been achieved using astigmatism compensators comprising focus-correction coils or octopoles to reduce deflection image-plane distortions and deflection astigmatism. For example, X. Zhu et al., *SPIE Proceedings*, 2522:66–77 (1995) proposed using focus-correction coils and astigmatism compensators as an astigmatism corrector for 3rd-order deflection distortion and hybrid distortion aberrations. The apparatus of X. Zhu et al. uses two focus-correction coils and two astigmatism compensators and requires precise positioning. In some cases, to correct manufacturing errors, the positions of focus correctors and astigmatism compensators are recalculated and adjusted to reduce the aberrations. However, such readjustment is difficult and impractical.

Therefore, aberration correction methods and CPB apparatus are needed in which aberrations are reduced without a need for mechanical adjustment.

SUMMARY OF THE INVENTION

Methods for transferring a pattern from a subfield of a mask to a corresponding transfer region of a wafer or other substrate using a charged particle beam are provided. A correction system is provided that corrects rotational error, magnification error, or focus error in an image of the subfield projected onto the wafer. One or more error-correcting lenses are provided to correct one or more aberrations generated by the correction system by adjusting the correction system and the error-correcting lens.

Charged-particle-beam pattern-transfer apparatus are provided that project a pattern from a subfield of a mask onto a transfer region of a wafer or other substrate. The CPB apparatus comprises correction system that corrects rotational error, magnification error, or focus error in an image of the subfield projected onto the wafer and a number of error-correcting lenses greater than or equal to a number of aberrations generated by the correction system and corrected by the error-correcting lenses.

In an exemplary embodiment, the correction system and the error-correcting lenses of the CPB apparatus are adjusted to correct at least one of rotational error, magnification error, and focus error in an image of the subfield projected onto the wafer by adjusting a current supplied to the correction system or the error-correcting lenses.

In another embodiment, a CPB pattern transfer apparatus comprises (m+2n) error-correcting lenses, wherein m is a number of errors to be corrected and n is a number of aberrations to be corrected, exclusive of deflection field curvature. In another embodiment, a CPB pattern transfer apparatus comprises at least [m+1+2(n−1)] correcting lenses, wherein m is a number of errors to be corrected and n is a number of aberrations to be corrected, including deflection field curvature.

In a further embodiment, CPB pattern transfer apparatus are provided that comprise a correcting lens system including a first lens and a second lens, and a total number of lenses equal to the number of errors to be corrected. A first lens corrects at least one of rotational error, magnification error, and focal position error and a second correcting lens corrects at least one aberration generated by the first correcting lens, whereby the errors and aberrations are correcting by adjusting the first and second correcting lenses.

In yet another embodiment, a CPB pattern transfer apparatus deflects a charged particle beam to irradiate a subfield and a corresponding transfer region. The CPB pattern transfer apparatus comprises a dynamic correction system that corrects 3rd-order aberrations proportional to the square or cube of the deflection and 5th-order aberrations proportional to the 2nd–5th powers of the deflection. The dynamic correction system comprises a number of focus correction coils or astigmatism compensators that are at least the numbers listed in Table 2-4 and wherein the parameters are defined in the following tables:

| Variable Definitions | |
| --- | --- |
| α | aperture half-angle |
| β | coordinates within a subfield image subfield |
| γ | beam deflection |

| Third-order Aberration Coefficients | |
| --- | --- |
| Mfc(3) | deflection field curvature |
| Mas(3) | deflection astigmatism |
| Mdis(3) | deflection distortion |
| Hdis,1(3),Hdis,2(3) | hybrid distortion |

| Fifth-order Aberration Coefficients |
| --- |
| Mx,1(5)-Mx,3(5) |
| Mcoma,1(5)-Mcoma,3(5) |
| Hcoma,1(5)-Hcoma,5(5) |
| Mfc(5) |
| Hfc,1(5)-Hfc,5(5) |
| Mas(5) |
| Has,1(5)-Has,4(5) |
| Mdis(5) |
| Hdis,1(5)-Hdis,8(5) |

A method for projecting patterns from a subfield of a mask onto a corresponding transfer region of a wafer or other substrate with a charged particle beam in which the charged particle beam is deflected to irradiate the subfield and the corresponding transfer region is provided. The method comprises creating linear equations for 3rd-order and 5th-order aberrations to be corrected, the equations containing a term corresponding to the aberration to be corrected, a term corresponding to correction of the aberration with a focus-correction coil and a current supplied to the focus-correction coil, or a term corresponding to correction of the aberration with an astigmatism compensator and a current supplied to the astigmatism compensator. A number of focus-correction coils Nc and astigmatism compensators Ns are determined such that the equations can be satisfied. Currents supplied to the focus-correction coils and astigmatism compensators are then adjusted so that the currents satisfy the equations.

In a further embodiment, the method comprises providing Nc focus-correction coils and Ns astigmatism compensators and selecting equations corresponding to the aberrations to be corrected from Equation Set 2-1 for 3rd-order aberrations and Equation Set 2-2 for 5th-order aberrations, wherein Equation Sets 2-1 and 2-2 are:

Equation Set 2-1

$$Mfc(3) \cdot \alpha\gamma\langle\gamma\rangle + \alpha\sum_{j=1}^{Nc}\{\Delta Mfc, c, j(3) \cdot Ic^{(2)}, j\} = 0 \quad (1)$$

$$Mas(3) \cdot \langle\alpha\rangle\gamma^2 + \langle\alpha\rangle\sum_{j=1}^{Ns}\{\Delta Mas, s, j(3) \cdot Is^{(2)}, j\} = 0 \quad (2)$$

$$Mdis(3) \cdot \gamma^2\langle\gamma\rangle + \gamma\sum_{j=1}^{Nc}\{\Delta Mdis, c, j(3) \cdot Ic^{(2)}, j\} + \quad (3)$$

$$\langle\gamma\rangle\sum_{j=1}^{Ns}\{\Delta Mdis, s, j(3) \cdot Is^{(2)}, j\} = 0$$

$$Hdis, 1(3) \cdot \beta\gamma\langle\gamma\rangle + \beta\sum_{j=1}^{Nc}\{\Delta Hdis, c, j(3) \cdot Ic^{(2)}, j\} = 0 \quad (4)$$

$$Hdis, 2(3) \cdot \langle\beta\rangle\gamma^2 + \langle\beta\rangle\sum_{j=1}^{Ns}\{\Delta Hdis, s, j(3) \cdot Is^{(2)}, j\} = 0 \quad (5)$$

Equation Set 2-2

$$Mx, 1(5) \cdot \alpha^3\langle\gamma\rangle^2 + \alpha^3\sum_{j=1}^{Ns}\{\Delta Mx, 1s, j(5) \cdot \langle Is^{(2)}, j\rangle\} = 0 \quad (1)$$

$$Mx, 2(5) \cdot \alpha^2\langle\alpha\rangle\gamma\langle\gamma\rangle + \alpha^2\langle\alpha\rangle\sum_{j=1}^{Nc}\{\Delta Mx, 2c, j(5) \cdot Ic^{(2)}, j\} = 0 \quad (2)$$

$$Mx, 3(5) \cdot \alpha\langle\alpha\rangle^2\gamma^2 + \alpha\langle\alpha\rangle^2\sum_{j=1}^{Ns}\{\Delta Mx, 3s, j(5) \cdot Is^{(2)}, j\} = 0 \quad (3)$$

$$Mcoma, 1(5) \cdot \alpha^2\gamma\langle\gamma\rangle^2 + \alpha^2\langle\gamma\rangle\sum_{j=1}^{Nc}\{\Delta Mcoma, ic, j\{5\} \cdot Ic^{(2)}, j\} + \quad (4)$$

$$\alpha^2\gamma\sum_{j=1}^{Ns}\{\Delta Mcoma, 1s, j(5) \cdot \langle Is^{(2)}, j\rangle\} = 0$$

$$Mcoma, 2(5) \cdot \alpha\langle\alpha\rangle\gamma^2\langle\gamma\rangle + \alpha\langle\alpha\rangle\gamma\sum_{j=1}^{Nc}\{\Delta Mcoma, 2c, j(5) \cdot Ic^{(2)}, j\} + \quad (5)$$

$$\alpha\langle\alpha\rangle\langle\gamma\rangle\sum_{j=1}^{Ns}\{\Delta Mcoma, 2s, j(5) \cdot Is^{(2)}, j\} = 0$$

$$Mcoma, 3(5) \cdot \langle\alpha\rangle^2\gamma^3 + \langle\alpha\rangle^2\gamma\sum_{j=1}^{Ns}\{\Delta Mcoma, 3s, j(5) \cdot Is^{(2)}, j\} = 0 \quad (6)$$

$$Hcoma, 1(5) \cdot \alpha^2\langle\beta\rangle\gamma\langle\gamma\rangle + \alpha^2\langle\beta\rangle\sum_{j=1}^{Nc}\{\Delta Hcoma, 1c, j(5) \cdot Ic^{(2)}, j\} = 0 \quad (7)$$

$$Hcoma, 2(5) \cdot \alpha^2\beta\langle\gamma\rangle^2 + \alpha^2\beta\sum_{j=1}^{Ns}\{\Delta Hcoma, 2s, j(5) \cdot \langle Ic^{(2)}, j\rangle\} = 0 \quad (8)$$

$$Hcoma, \quad (9)$$

$$3(5) \cdot \alpha\langle\alpha\rangle\langle\beta\rangle\gamma^2 + \alpha\langle\alpha\rangle\langle\beta\rangle\sum_{j=1}^{Ns}\{\Delta Hcoma, 3s, j(5) \cdot Is^{(2)}, j\} = 0$$

$$Hcoma, 4(5) \cdot \alpha\langle\alpha\rangle\beta\gamma\langle\gamma\rangle + \alpha\langle\alpha\rangle\beta\sum_{j=1}^{Nc}\{\Delta Hcoma, 4c, j(5) \cdot Ic^{(2)}, j\} = 0 \quad (10)$$

$$Hcoma, 5(5) \cdot \langle\alpha\rangle^2\beta\gamma^2 + \langle\alpha\rangle^2\beta\sum_{j=1}^{Ns}\{\Delta Hcoma, 5s, j(5) \cdot Is^{(2)}, j\} = 0 \quad (11)$$

$$Mfc(5) \cdot \alpha\gamma^2\langle\gamma\rangle^2 + \alpha\gamma\langle\gamma\rangle\sum_{j=1}^{Nc}\{\Delta Mfc, c, j(5) \cdot Ic^{(2)}, j\} + \quad (12)$$

$$\alpha\gamma^2\sum_{j=1}^{Ns}\{\Delta Mfc, s1, j(5) \cdot \langle Is^{(2)}, j\rangle\} +$$

$$\alpha\langle\gamma\rangle^2\sum_{j=1}^{Ns}\{\Delta Mfc, s2, j(5) \cdot Is^{(2)}, j\} +$$

$$\alpha\sum_{j=1}^{Nc}\{\Delta Mfc, c, j(3) \cdot Ic^{(4)}, j\} = 0$$

$$Hfc, 1(5) \cdot \alpha\langle\beta\rangle\gamma^2\langle\gamma\rangle + \alpha\langle\beta\rangle\gamma\sum_{j=1}^{Nc}\{\Delta Hfc, 1c, j(5) \cdot Ic^{(2)}, j\} + \quad (13)$$

$$\alpha\langle\beta\rangle\langle\gamma\rangle\sum_{j=1}^{Ns}\{\Delta Hfc, 1s, j(5) \cdot Is^{(2)}, j\} = 0$$

$$Hfc, 2(5) \cdot \alpha\beta\gamma\langle\gamma\rangle^2 + \alpha\beta\langle\gamma\rangle\sum_{j=1}^{Nc}\{\Delta Hfc, 2c, j(5) \cdot Ic^{(2)}, j\} + \quad (14)$$

$$\alpha\beta\gamma\sum_{j=1}^{Ns}\{\Delta Hfc, 2s, j(5) \cdot \langle Is^{(2)}, j\rangle\} = 0$$

$$Hfc, 3(5) \cdot \alpha\langle\beta\rangle^2\gamma^2 + \alpha\langle\beta\rangle^2\sum_{j=1}^{Ns}\{\Delta Hfc, 3s, j(5) \cdot Is^{(2)}, j\} = 0 \quad (15)$$

$$Hfc, 4(5) \cdot \alpha\beta\langle\beta\rangle\gamma\langle\gamma\rangle + \alpha\beta\langle\beta\rangle\sum_{j=1}^{Nc}\{\Delta Hfc, 4c, j(5) \cdot Ic^{(2)}, j\} = 0 \quad (16)$$

$$Hfc, 5(5) \cdot \alpha\beta^2\langle\gamma\rangle^2 + \alpha\beta^2\sum_{j=1}^{Ns}\{\Delta Hfc, 5s, j(5) \cdot \langle Is^{(2)}, j\rangle\} = 0 \quad (17)$$

$$Mas(5) \cdot \langle\alpha\rangle\gamma^3\langle\gamma\rangle + \langle\alpha\rangle\gamma^2\sum_{j=1}^{Nc}\{\Delta Mas, c, j(5) \cdot Ic^{(2)}, j\} + \quad (18)$$

$$\langle\alpha\rangle\gamma\langle\gamma\rangle\sum_{j=1}^{Ns}\{\Delta Mas, s, j(5) \cdot Is^{(2)}, j\} +$$

$$\langle\alpha\rangle\sum_{j=1}^{Ns}\{\Delta Mas, s, j(3) \cdot Is^{(4)}, j\} = 0$$

$$Has, 1(5) \cdot \langle\alpha\rangle\langle\beta\rangle\gamma^3 + \langle\alpha\rangle\langle\beta\rangle\gamma\sum_{j=1}^{Ns}\{\Delta Has, 1s, j(5) \cdot Is^{(2)}, j\} = 0 \quad (19)$$

$$Has, 2(5) \cdot \langle\alpha\rangle\beta\gamma^2\langle\gamma\rangle + \langle\alpha\rangle\beta\gamma\sum_{j=1}^{Nc}\{\Delta Has, 2c, j(5) \cdot Ic^{(2)}, j\} + \quad (20)$$

$$\langle\alpha\rangle\beta\langle\gamma\rangle\sum_{j=1}^{Ns}\{\Delta Has, 2s, j(5) \cdot Is^{(2)}, j\} = 0$$

$$Has, 3(5) \cdot \langle\alpha\rangle\beta\langle\beta\rangle\gamma^2 + \langle\alpha\rangle\beta\langle\beta\rangle\sum_{j=1}^{Ns}\{\Delta Has, 3s, j(5) \cdot Is^{(2)}, j\} = 0 \quad (21)$$

$$Has, 4(5) \cdot \langle\alpha\rangle\beta^2\gamma\langle\gamma\rangle + \langle\alpha\rangle\beta^2\sum_{j=1}^{Nc}\{\Delta Has, 4c, j(5) \cdot Ic^{(2)}, j\} = 0 \quad (22)$$

$$Mdis(5) \cdot \gamma^3 \langle\gamma\rangle^2 + \gamma^2 \langle\gamma\rangle \sum_{j=1}^{Nc} \{\Delta Mdis, c, j(5) \cdot Ic^{(2)}, j\} + \quad (23)$$

$$\gamma^3 \sum_{j=1}^{Ns} \{\Delta Mdis, s1, j(5) \cdot \langle Is^{(2)}, j\rangle\} +$$

$$\gamma\langle\gamma\rangle^2 \sum_{j=1}^{Ns} \{\Delta Mdis, s2, j(5) \cdot Is^{(2)}, j\} +$$

$$\gamma \sum_{j=1}^{Nc} \{\Delta Mdis, c, j(3) \cdot Ic^{(4)}, j\} +$$

$$\langle\gamma\rangle \sum_{j=1}^{Ns} \{\Delta Mdis, s, j(3) \cdot Is^{(4)}, j\} = 0$$

$$Hdis, 1(5) \cdot \langle\beta\rangle\gamma^3\langle\gamma\rangle + \langle\beta\rangle\gamma^2 \sum_{j=1}^{Nc} \{\Delta Hdis, 1c, j(5) \cdot Ic^{(2)}, j\} + \quad (24)$$

$$\langle\beta\rangle\gamma\langle\gamma\rangle \sum_{j=1}^{Ns} \{\Delta Hdis, 1s, j(5) \cdot Is^{(2)}, j\} +$$

$$\langle\beta\rangle \sum_{j=1}^{Ns} \{\Delta Hdis, s, j(3) \cdot Is^{(4)}, j\} = 0$$

$$Hdis, 2(5) \cdot \beta\gamma^2\langle\gamma\rangle^2 + \beta\gamma\langle\gamma\rangle \sum_{j=1}^{Nc} \{\Delta Hdis, 2c, j(5) \cdot Ic^{(2)}, j\} + \quad (25)$$

$$\beta\gamma^2 \sum_{j=1}^{Ns} \{\Delta Hdis, 2s1, j(5) \cdot \langle Is^{(2)}, j\rangle\} +$$

$$\beta\langle\gamma\rangle^2 \sum_{j=1}^{Ns} \{\Delta Hdis, 2s2, j(5) \cdot Is^{(2)}, j\} +$$

$$\langle\beta\rangle \sum_{j=1}^{Nc} \{\Delta Hdis, c, j(3) \cdot Ic^{(4)}, j\} = 0$$

$$Hdis, 3(5) \cdot \langle\beta\rangle^2\gamma^3 + \langle\beta\rangle^2\gamma \sum_{j=1}^{Ns} \{\Delta Hdis, 3s, j(5) \cdot Is^{(2)}, j\} = 0 \quad (26)$$

$$Hdis, 4(5) \cdot \beta\langle\beta\rangle\gamma^2\langle\gamma\rangle + \beta\langle\beta\rangle\gamma \sum_{j=1}^{Nc} \{\Delta Hdis, 4c, j(5) \cdot Ic^{(2)}, j\} + \quad (27)$$

$$\beta\langle\beta\rangle\langle\gamma\rangle \sum_{j=1}^{Ns} \{\Delta Hdis, 4s, j(5) \cdot Is^{(2)}, j\} = 0$$

$$Hdis, 5(5) \cdot \beta^2\gamma\langle\gamma\rangle^2 + \beta^2\langle\gamma\rangle \sum_{j=1}^{Nc} \{\Delta Hdis, 5c, j(5) \cdot Ic^{(2)}, j\} + \quad (28)$$

$$\beta^2\gamma \sum_{j=1}^{Ns} \{\Delta Hdis, 5s, j(5) \cdot \langle Is^{(2)}, j\rangle\} = 0$$

$$Hdis, 6(5) \cdot \beta^3\langle\gamma\rangle^2 + \beta^3 \sum_{j=1}^{Ns} \{\Delta Hdis, 6s, j(5) \cdot \langle Is^{(2)}, j\rangle\} = 0 \quad (29)$$

$$Hdis, 7(5) \cdot \beta^2\langle\beta\rangle\gamma\langle\gamma\rangle + \beta^2\langle\beta\rangle \sum_{j=1}^{Nc} \{\Delta Hdis, 7c, j(5) \cdot Ic^{(2)}, j\} = 0 \quad (30)$$

$$Hdis, 8(5) \cdot \beta\langle\beta\rangle^2\gamma^2 + \beta\langle\beta\rangle^2 \sum_{j=1}^{Ns} \{\Delta Hdis, 8s, j(5) \cdot Is^{(2)}, j\} = 0 \quad (31)$$

wherein the parameters in these equations are defined as follows:

| Variable Definitions | |
|---|---|
| α | aperture half-angle |
| β | coordinates within a subfield image subfield |
| γ | beam deflection |

| Third-order Aberrations. | |
|---|---|
| Third-order Aberration Coefficients | |
| Mfc(3) | deflection field curvature |
| Mas(3) | deflection astigmatism |
| Mdis(3) | deflection distortion |
| Hdis,1(3),Hdis,2(3) | hybrid distortion |
| Aberration-correction Coefficients for the Focus-correction Coils | |
| ΔMfc,c,j(3), | deflection field curvature |
| ΔMdis,c,j(3), | deflection distortion |
| ΔHdis,c,j(3) | hybrid distortion |
| Aberration-correction Coefficients for the Astigmatism Compensators | |
| ΔMas,s,j(3), | deflection astigmatism |
| ΔMdis,s,j(3), | deflection distortion |
| ΔHdis,s,j(3) | hybrid distortion |

TABLE 2-3

| Fifth-order Aberrations. | |
|---|---|
| Mx,1(5)-Mx,3(5) | coefficients of the |
| Mcoma,1(5)-Mcoma,3(5) | 5th-order |
| Hcoma,1(5)-Hcoma,5(5) | aberrations |
| Mfc(5) | |
| Hfc,1(5)-Hfc,5(5) | |
| Mas(5) | |
| Has,1(5)-Has,4(5) | |
| Mdis(5) | |
| Hdis,1(5)-Hdis,8(5) | |
| ΔMx,2c,j(5) | 5th-order |
| ΔMcoma,1c,h(5), ΔMcoma,2c,j(5) | aberration |
| ΔHcoma,1c,j(5), ΔHcoma,4c,j(5) | correction |
| ΔMfc,c,j(5) | coefficients for |
| ΔHfc,1c,j(5), ΔHfc,2c,j(5), ΔHfc,4c,j(5) | the 5th-order |
| ΔMas,c,j(5) | aberrations for the |
| ΔHas,2c,j(5), ΔHas,4c,j(5) | focus-correction |
| ΔMdis,c,j(5) | coils |
| ΔHdis,1c,j(5), ΔHdis,2c,j(5), ΔHdis,4c,j(5) | |
| ΔHdis,5c,j(5), ΔHdis,7c,j(5) | |
| ΔMx,1s,j(5), ΔMx,3s,j(5) | 5th-order |
| ΔMcoma,1s,j(5)-ΔMcoma,3s,j(5) | aberration |
| ΔHcoma,2s,j(5), ΔHcoma,3s,j(5) | correction |
| ΔHcoma,5s,j(5) | coefficients for |
| ΔMfc,s1,j(5), ΔMfc,s2,j(5) | the 5th-order |
| ΔHfc,1s,j(5), ΔHfc,2s,j(5), ΔHfc,3s,j(5) | aberrations for the |
| ΔHfc,5s,j(5) | astigmatism |
| ΔMas,s,j(5) | compensators |
| ΔHas,1s,j(5)-ΔHas,3s,j(5) | |
| ΔMdis,s1,j(5), ΔMdis,s2,j(5) | |
| ΔHdis,1s,j(5), ΔHdis,2s1,j(5) ΔHdis,2s2,j(5) | |
| ΔHdis,3s,j(5)-ΔHdis,6s,j(5) | |
| ΔHdis,8s,j(5) | |

Currents Ic(2),j, Ic(4),j of the Nc focus-correction coils and currents Is(2),j, Is(4),j of the Ns astigmatism compensators are adjusted so that the equations are satisfied.

Yet another CPB pattern transfer apparatus is provided that comprises a dynamic correction system including Nc focus-correction coils and Ns astigmatism compensators. The dynamic correction system corrects 3rd-order aberrations proportional to the squares and cubes of the deflection of the charged particle beam. A controller is provided that controls the dynamic correction system and Nc and Ns are selected so that Equations 2-1 are satisfied and the controller adjusts the currents of each of the focus-correction coils to $Ic^{(2)},j$ and the astigmatism compensators to $Is^{(2)},j$, respectively, wherein $Ic^{(2)},j$ and $Is^{(2)},j$ are solutions of the simultaneous equations.

Equation Set 2 – 1

$$Mfc(3) \cdot \alpha\gamma\langle\gamma\rangle + \alpha\sum_{j=1}^{Nc} \{\Delta Mfc, c, j(3) \cdot Ic^{(2)}, j\} = 0 \quad (1)$$

$$Mas(3) \cdot \langle\alpha\rangle\gamma^2 + \langle\alpha\rangle\sum_{j=1}^{Ns} \{\Delta Mas, s, j(3) \cdot Is^{(2)}, j\} = 0 \quad (2)$$

$$Mdis(3) \cdot \gamma^2\langle\gamma\rangle + \gamma\sum_{j=1}^{Nc} \{\Delta Mdis, c, j(3) \cdot Ic^{(2)}, j\} + \quad (3)$$

$$\langle\gamma\rangle\sum_{j=1}^{Ns} \{\Delta Mdis, s, j(3) \cdot Is^{(2)}, j\} = 0$$

$$Hdis, 1(3) \cdot \beta\gamma\langle\gamma\rangle + \beta\sum_{j=1}^{Nc} \{\Delta Hdis, c, j(3) \cdot Ic^{(2)}, j\} = 0 \quad (4)$$

$$Hdis, 2(3) \cdot \langle\beta\rangle\gamma^2 + \langle\beta\rangle\sum_{j=1}^{Ns} \{\Delta Hdis, s, j(3) \cdot Is^{(2)}, j\} = 0 \quad (5)$$

A further CPB pattern transfer apparatus comprises a dynamic correction system including Nc focus-correction coils and Ns astigmatism compensators, the dynamic correction system correcting 5th-order aberrations proportional to the $2^{nd}$ through $5^{th}$ powers of the deflection. A controller controls the dynamic correction system and Nc and Ns are selected so that Equation Set 2-2 is satisfied. The controller adjusts the currents of each of the focus-correction coils and the astigmatism compensators to $Ic^{(2)},j$, $Ic^{(4)},j$, and $Is^{(2)},j$, $Is^{(4)},j$ respectively, wherein the currents are solutions of Equation Set 2-2.

Equation Set 2 – 2

$$Mx, 1(5) \cdot \alpha^3\langle\gamma\rangle^2 + \alpha^3\sum_{j=1}^{Ns} \{\Delta Mx, 1s, j(5) \cdot \langle Is^{(2)}, j\rangle\} = 0 \quad (1)$$

$$Mx, 2(5) \cdot \alpha^2\langle\alpha\rangle\gamma\langle\gamma\rangle + \alpha^2\langle\alpha\rangle\sum_{j=1}^{Nc} \{\Delta Mx, 2c, j(5) \cdot Ic^{(2)}, j\} = 0 \quad (2)$$

$$Mx, 3(5) \cdot \alpha\langle\alpha\rangle^2\gamma^2 + \alpha\langle\alpha\rangle^2\sum_{j=1}^{Ns} \{\Delta Mx, 3s, j(5) \cdot Is^{(2)}, j\} = 0 \quad (3)$$

$$Mcoma, 1(5) \cdot \alpha^2\gamma\langle\gamma\rangle^2 + \alpha^2\langle\gamma\rangle\sum_{j=1}^{Nc} \{\Delta Mcoma, ic, j\{5\} \cdot Ic^{(2)}, j\} + \quad (4)$$

$$\alpha^2\gamma\sum_{j=1}^{Ns} \{\Delta Mcoma, 1s, j(5) \cdot \langle Is^{(2)}, j\rangle\} = 0$$

$$Mcoma, 2(5) \cdot \alpha\langle\alpha\rangle\gamma^2\langle\gamma\rangle + \alpha\langle\alpha\rangle\gamma\sum_{j=1}^{Nc} \{\Delta Mcoma, 2c, j(5) \cdot Ic^{(2)}, j\} + \quad (5)$$

$$\alpha\langle\alpha\rangle\langle\gamma\rangle\sum_{j=1}^{Ns} \{\Delta Mcoma, 2s, j(5) \cdot Is^{(2)}, j\} = 0$$

-continued $$Mcoma, 3(5) \cdot \langle\alpha\rangle^2\gamma^3 + \langle\alpha\rangle^2\gamma\sum_{j=1}^{Ns} \{\Delta Mcoma, 3s, j(5) \cdot Is^{(2)}, j\} = 0 \quad (6)$$

$$Hcoma, 1(5) \cdot \alpha^2\langle\beta\rangle\gamma\langle\gamma\rangle + \alpha^2\langle\beta\rangle\sum_{j=1}^{Nc} \{\Delta Hcoma, 1c, j(5) \cdot Ic^{(2)}, j\} = 0 \quad (7)$$

$$Hcoma, 2(5) \cdot \alpha^2\beta\langle\gamma\rangle^2 + \alpha^2\beta\sum_{j=1}^{Ns} \{\Delta Hcoma, 2s, j(5) \cdot \langle Ic^{(2)}, j\rangle\} = 0 \quad (8)$$

$$Hcoma, \quad (9)$$

$$3(5) \cdot \alpha\langle\alpha\rangle\langle\beta\rangle\gamma^2 + \alpha\langle\alpha\rangle\langle\beta\rangle\sum_{j=1}^{Ns} \{\Delta Hcoma, 3s, j(5) \cdot Is^{(2)}, j\} = 0$$

$$Hcoma, 4(5) \cdot \alpha\langle\alpha\rangle\beta\gamma\langle\gamma\rangle + \alpha\langle\alpha\rangle\beta\sum_{j=1}^{Nc} \{\Delta Hcoma, 4c, j(5) \cdot Ic^{(2)}, j\} = 0 \quad (10)$$

$$Hcoma, 5(5) \cdot \langle\alpha\rangle^2\beta\gamma^2 + \langle\alpha\rangle^2\beta\sum_{j=1}^{Ns} \{\Delta Hcoma, 5s, j(5) \cdot Is^{(2)}, j\} = 0 \quad (11)$$

$$Mfc(5) \cdot \alpha\gamma^2\langle\gamma\rangle^2 + \alpha\gamma\langle\gamma\rangle\sum_{j=1}^{Nc} \{\Delta Mfc, c, j(5) \cdot Ic^{(2)}, j\} + \quad (12)$$

$$\alpha\gamma^2\sum_{j=1}^{Ns} \{\Delta Mfc, s1, j(5) \cdot \langle Is^{(2)}, j\rangle\} +$$

$$\alpha\langle\gamma\rangle^2\sum_{j=1}^{Ns} \{\Delta Mfc, s2, j(5) \cdot Is^{(2)}, j\} +$$

$$\alpha\sum_{j=1}^{Nc} \{\Delta Mfc, c, j(3) \cdot Ic^{(4)}, j\} = 0$$

$$Hfc, 1(5) \cdot \alpha\langle\beta\rangle\gamma^2\langle\gamma\rangle + \alpha\langle\beta\rangle\gamma\sum_{j=1}^{Nc} \{\Delta Hfc, 1c, j(5) \cdot Ic^{(2)}, j\} + \quad (13)$$

$$\alpha\langle\beta\rangle\langle\gamma\rangle\sum_{j=1}^{Ns} \{\Delta Hfc, 1s, j(5) \cdot Is^{(2)}, j\} = 0$$

$$Hfc, 2(5) \cdot \alpha\beta\gamma\langle\gamma\rangle^2 + \alpha\beta\langle\gamma\rangle\sum_{j=1}^{Nc} \{\Delta Hfc, 2c, j(5) \cdot Ic^{(2)}, j\} + \quad (14)$$

$$\alpha\beta\gamma\sum_{j=1}^{Ns} \{\Delta Hfc, 2s, j(5) \cdot \langle Is^{(2)}, j\rangle\} = 0$$

$$Hfc, 3(5) \cdot \alpha\langle\beta\rangle^2\gamma^2 + \alpha\langle\beta\rangle^2\sum_{j=1}^{Ns} \{\Delta Hfc, 3s, j(5) \cdot Is^{(2)}, j\} = 0 \quad (15)$$

$$Hfc, 4(5) \cdot \alpha\beta\langle\beta\rangle\gamma\langle\gamma\rangle + \alpha\beta\langle\beta\rangle\sum_{j=1}^{Nc} \{\Delta Hfc, 4c, j(5) \cdot Ic^{(2)}, j\} = 0 \quad (16)$$

$$Hfc, 5(5) \cdot \alpha\beta^2\langle\gamma\rangle^2 + \alpha\beta^2\sum_{j=1}^{Ns} \{\Delta Hfc, 5s, j(5) \cdot \langle Is^{(2)}, j\rangle\} = 0 \quad (17)$$

$$Mas(5) \cdot \langle\alpha\rangle\gamma^3\langle\gamma\rangle + \langle\alpha\rangle\gamma^2\sum_{j=1}^{Nc} \{\Delta Mas, c, j(5) \cdot Ic^{(2)}, j\} + \quad (18)$$

$$\langle\alpha\rangle\gamma\langle\gamma\rangle\sum_{j=1}^{Ns} \{\Delta Mas, s, j(5) \cdot Is^{(2)}, j\} +$$

$$\langle\alpha\rangle\sum_{j=1}^{Ns} \{\Delta Mas, s, j(3) \cdot Is^{(4)}, j\} = 0$$

$$Has, 1(5) \cdot \langle\alpha\rangle\langle\beta\rangle\gamma^3 + \langle\alpha\rangle\langle\beta\rangle\gamma \sum_{j=1}^{Ns} \{\Delta Has, 1s, j(5) \cdot Is^{(2)}, j\} = 0 \quad (19)$$

$$Has, 2(5) \cdot \langle\alpha\rangle\beta\gamma^2\langle\gamma\rangle + \langle\alpha\rangle\beta\gamma \sum_{j=1}^{Nc} \{\Delta Has, 2c, j(5) \cdot Ic^{(2)}, j\} + \quad (20)$$

$$\langle\alpha\rangle\beta\langle\gamma\rangle \sum_{j=1}^{Ns} \{\Delta Has, 2s, j(5) \cdot Is^{(2)}, j\} = 0$$

$$Has, 3(5) \cdot \langle\alpha\rangle\beta\langle\beta\rangle\gamma^2 + \langle\alpha\rangle\beta\langle\beta\rangle \sum_{j=1}^{Ns} \{\Delta Has, 3s, j(5) \cdot Is^{(2)}, j\} = 0 \quad (21)$$

$$Has, 4(5) \cdot \langle\alpha\rangle\beta^2\gamma\langle\gamma\rangle + \langle\alpha\rangle\beta^2 \sum_{j=1}^{Nc} \{\Delta Has, 4c, j(5) \cdot Ic^{(2)}, j\} = 0 \quad (22)$$

$$Mdis(5) \cdot \gamma^3\langle\gamma\rangle^2 + \gamma^2\langle\gamma\rangle \sum_{j=1}^{Nc} \{\Delta Mdis, c, j(5) \cdot Ic^{(2)}, j\} + \quad (23)$$

$$\gamma^3 \sum_{j=1}^{Ns} \{\Delta Mdis, s1, j(5) \cdot \langle Is^{(2)}, j\rangle\} +$$

$$\gamma\langle\gamma\rangle^2 \sum_{j=1}^{Ns} \{\Delta Mdis, s2, j(5) \cdot Is^{(2)}, j\} +$$

$$\gamma \sum_{j=1}^{Nc} \{\Delta Mdis, c, j(3) \cdot Ic^{(4)}, j\} +$$

$$\langle\gamma\rangle \sum_{j=1}^{Ns} \{\Delta Mdis, s, j(3) \cdot Is^{(4)}, j\} = 0$$

$$Hdis, 1(5) \cdot \langle\beta\rangle\gamma^3\langle\gamma\rangle + \langle\beta\rangle\gamma^2 \sum_{j=1}^{Nc} \{\Delta Hdis, 1c, j(5) \cdot Ic^{(2)}, j\} + \quad (24)$$

$$\langle\beta\rangle\gamma\langle\gamma\rangle \sum_{j=1}^{Ns} \{\Delta Hdis, 1s, j(5) \cdot Is^{(2)}, j\} +$$

$$\langle\beta\rangle \sum_{j=1}^{Ns} \{\Delta Hdis, s, j(3) \cdot Is^{(4)}, j\} = 0$$

$$Hdis, 2(5) \cdot \beta\gamma^2\langle\gamma\rangle^2 + \beta\gamma\langle\gamma\rangle \sum_{j=1}^{Nc} \{\Delta Hdis, 2c, j(5) \cdot Ic^{(2)}, j\} + \quad (25)$$

$$\beta\gamma^2 \sum_{j=1}^{Ns} \{\Delta Hdis, 2s1, j(5) \cdot \langle Is^{(2)}, j\rangle\} +$$

$$\beta\langle\gamma\rangle^2 \sum_{j=1}^{Ns} \{\Delta Hdis, 2s2, j(5) \cdot Is^{(2)}, j\} +$$

$$\langle\beta\rangle \sum_{j=1}^{Nc} \{\Delta Hdis, c, j(3) \cdot Ic^{(4)}, j\} = 0$$

$$Hdis, 3(5) \cdot \langle\beta\rangle^2\gamma^3 + \langle\beta\rangle^2\gamma \sum_{j=1}^{Ns} \{\Delta Hdis, 3s, j(5) \cdot Is^{(2)}, j\} = 0 \quad (26)$$

$$Hdis, 4(5) \cdot \beta\langle\beta\rangle\gamma^2\langle\gamma\rangle + \beta\langle\beta\rangle\gamma \sum_{j=1}^{Nc} \{\Delta Hdis, 4c, j(5) \cdot Ic^{(2)}, j\} + \quad (27)$$

$$\beta\langle\beta\rangle\langle\gamma\rangle \sum_{j=1}^{Ns} \{\Delta Hdis, 4s, j(5) \cdot Is^{(2)}, j\} = 0$$

$$Hdis, 5(5) \cdot \beta^2\gamma\langle\gamma\rangle^2 + \beta^2\langle\gamma\rangle \sum_{j=1}^{Nc} \{\Delta Hdis, 5c, j(5) \cdot Ic^{(2)}, j\} + \quad (28)$$

$$\beta^2\gamma \sum_{j=1}^{Ns} \{\Delta Hdis, 5s, j(5) \cdot \langle Is^{(2)}, j\rangle\} = 0$$

$$Hdis, 6(5) \cdot \beta^3\langle\gamma\rangle^2 + \beta^3 \sum_{j=1}^{Ns} \{\Delta Hdis, 6s, j(5) \cdot \langle Is^{(2)}, j\rangle\} = 0 \quad (29)$$

$$Hdis, 7(5) \cdot \beta^2\langle\beta\rangle\gamma\langle\gamma\rangle + \beta^2\langle\beta\rangle \sum_{j=1}^{Nc} \{\Delta Hdis, 7c, j(5) \cdot Ic^{(2)}, j\} = 0 \quad (30)$$

$$Hdis, 8(5) \cdot \beta\langle\beta\rangle^2\gamma^2 + \beta\langle\beta\rangle^2 \sum_{j=1}^{Ns} \{\Delta Hdis, 8s, j(5) \cdot Is^{(2)}, j\} = 0 \quad (31)$$

Still another CPB pattern-transfer apparatus is provided that comprises a dynamic correction system including focus-correction coils and astigmatism compensators, numbers of the focus-correction coils and astigmatism compensators determined according to aberrations to be corrected, and wherein the dynamic correction system corrects aberrations proportional to powers of the deflection of 2 or higher.

Methods for aberration correction method for a CPB pattern transfer are provided that comprises correcting aberrations at a plurality of deflections to be within a predetermined range by adjusting the correction system according the aberration to be canceled from among the aberrations expressed as functions that show the dependence on an aperture half-angle α, a position within the transfer region β, and a deflection γ in the following expressions:

$$f(\gamma, \langle\gamma\rangle)$$

$$f_i(\gamma, \langle\gamma\rangle) \cdot X_i$$

$$f_{i,j}(\gamma, \langle\gamma\rangle) \cdot X_i X_j$$

$$f_{i,j,k}(\gamma, \langle\gamma\rangle) \cdot X_1 X_j X_k$$

wherein the functions $f$, $f_i$, $f_{i,j}$, $f_{i,j,k}$ are functions of $\gamma, \langle\gamma\rangle$, $X1=\alpha$, $X2=\langle\alpha\rangle$, $X3=\beta$, and $X4=\langle\beta\rangle$, and $i,j,k$ are integers from 1 to 4 such that $i \geq j \geq k$ except for $(i,j,k)=(2,2,2)$, $(4,2,2)$, $(4,4,2)$, $(4,4,4)$.

Methods for transferring patterns from subfields of a mask to corresponding transfer regions of a wafer or other substrate with a charged particle beam and a charged particle beam optical system by sequentially deflecting the charged particle beam to irradiate a selected subfield and a corresponding transfer region are provided. The methods comprise projecting a pattern from an evaluation mask, the pattern projected at a plurality of charged particle beam deflections and measuring distortion in the projected pattern for the plurality of charged particle beam deflections. A CPB optical system then compensates the measured distortion. In a further method, a dynamic correction system is provide that includes focus-correction coils and astigmatism compensators that are adjusted to compensate the measured distortion. In yet another method, a plurality of test patterns are provide on subfield of the evaluation mask and distortion is measured by irradiating a plurality of the test patterns and measuring the distortion of the test patterns.

In still another method, the measured distortion is separated into a linear distortion component and a higher-order distortion component. Linear equations are created for the distortion of the linear distortion component and the higher-order distortion component, the equations each containing (a) an aberration term pertaining to the distortion component and (b) an aberration correction term for a focus-correction coil proportional to a current supplied to the focus-correction coil or (c) an aberration correction term for an astigmatism compensator proportional to a current supplied to the astigmatism compensator. A number of focus-correction coils and astigmatism compensators is determined so that the equations can be satisfied and the currents of the focus-correction coils and astigmatism compensators are adjusted to currents that satisfy the equations.

In yet another method, the simultaneous equations are selected from Equations 1-1:

Equation Set 1 – 1

$$f_1(\gamma) \cdot \beta + \beta \sum_{j=1}^{Nc} \left[ \Delta W_{dc1,j}(1) \cdot \Delta I_{c,j} \right] = 0 \quad (1)$$

$$f_2(\gamma) \cdot \langle\beta\rangle + \langle\beta\rangle \sum_{j=1}^{Ns} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{Ns} \left[ \Delta H_{dis,j}(3) \cdot \langle\Delta I_{s,j}\rangle \right] = 0 \quad (3)$$

$$g_2(\gamma) \cdot \beta\langle\beta\rangle + \beta\langle\beta\rangle\langle\gamma\rangle \sum_{j=1}^{Ns} \left[ \Delta H_{dis2,j}(3) \cdot \langle\Delta I_{s,j}\rangle \right] = 0 \quad (4)$$

$$g_3(\gamma) \cdot \langle\beta\rangle^2 + \langle\beta\rangle^2 \gamma \sum_{j=1}^{Ns} \left[ \Delta H_{dis3,j}(3) \cdot \langle\Delta I_{s,j}\rangle \right] = 0 \quad (5)$$

where $f_1(\gamma)$ and $f_2(\gamma)$ are linear components of distortion, $g_1(\gamma)$, $g_2(\gamma)$, and $g_3(\gamma)$ are higher-order components of distortion, and $\gamma$ is deflection, $\Delta Wdc1,j(1)$ and $\Delta Wdc2,j(1)$ are coefficients of a charged particle beam path caused by the focus-correction coils and the astigmatism compensators, respectively, and proportional to $\beta$ or $<\beta>$, $\Delta Hdis1,j(3)$, $\Delta Hdis2,j(3)$, and $\Delta Hdis3,j(3)$ are coefficients of 3rd-order distortion aberrations caused by the astigmatism compensators. Nc focus-correction coils and Ns astigmatism compensators are provided for the dynamic correction system and the respective currents of the Nc focus-correction coils $\Delta Ic,j$ and the Ns astigmatism compensators $\Delta Is,j$ are adjusted so that Equations 1-1 are satisfied.

In another method, the measured distortion is separated into a linear distortion component and a higher-order distortion component. Linear equations are created for the distortion of the linear distortion component and the higher-order distortion component, the equations each containing (a) an aberration term pertaining to the distortion component and (b) an aberration correction term for a focus-correction coil proportional to a current supplied to the focus-correction coil or (c) an aberration correction term for an astigmatism compensator proportional to a current supplied to the astigmatism compensator. A number of focus-correction coils and astigmatism compensators is determined so that the equations can be satisfied and the currents of the focus-correction coils and astigmatism compensators are adjusted so that the equations are satisfied. In an illustrative embodiment, the equations are selected from Equations 1-1:

Equation Set 1 – 1

$$f_1(\gamma) \cdot \beta + \beta \sum_{j=1}^{Nc} \left[ \Delta W_{dc1,j}(1) \cdot \Delta I_{c,j} \right] = 0 \quad (1)$$

$$f_2(\gamma) \cdot \langle\beta\rangle + \langle\beta\rangle \sum_{j=1}^{Ns} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{Ns} \left[ \Delta H_{dis,j}(3) \cdot \langle\Delta I_{s,j}\rangle \right] = 0 \quad (3)$$

$$g_2(\gamma) \cdot \beta\langle\beta\rangle + \beta\langle\beta\rangle\langle\gamma\rangle \sum_{j=1}^{Ns} \left[ \Delta H_{dis2,j}(3) \cdot \langle\Delta I_{s,j}\rangle \right] = 0 \quad (4)$$

$$g_3(\gamma) \cdot \langle\beta\rangle^2 + \langle\beta\rangle^2 \gamma \sum_{j=1}^{Ns} \left[ \Delta H_{dis3,j}(3) \cdot \langle\Delta I_{s,j}\rangle \right] = 0 \quad (5)$$

where $f_1(\gamma)$ and $f_2(\gamma)$ are linear components of distortion, $g_1(\gamma)$, $g_2(\gamma)$, and $g_3(\gamma)$ are higher-order components of distortion, and $\gamma$ is deflection, $\Delta Wdc1,j(1)$ and $\Delta Wdc2,j(1)$ are coefficients of a charged particle beam path caused by the focus-correction coils and the astigmatism compensators, respectively, and proportional to $\beta$ or $<\beta>$, $\Delta Hdis1,j(3)$, $\Delta Hdis2,j(3)$, and $\Delta Hdis3,j(3)$ are coefficients of 3rd-order distortion aberrations caused by the astigmatism compensators.

Another CPB pattern transfer apparatus is provided comprising a memory that stores distortion data corresponding to one or more subfields and a dynamic correction system that corrects transferred patterns based on the distortion data stored in the memory.

In a further embodiment, the dynamic correcting system includes two focus-correction coils and four astigmatism compensators, and a controller that adjusts currents of the focus-correction coils and astigmatism compensators to Ic,j and Is,j, respectively, that satisfy Equations 1-1:

Equation Set 1 – 1

$$f_1(\gamma) \cdot \beta + \beta \sum_{j=1}^{Nc} \left[ \Delta W_{dc1,j}(1) \cdot \Delta I_{c,j} \right] = 0 \quad (1)$$

$$f_2(\gamma) \cdot \langle\beta\rangle + \langle\beta\rangle \sum_{j=1}^{Ns} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{Ns} \left[ \Delta H_{dis,j}(3) \cdot \langle\Delta I_{s,j}\rangle \right] = 0 \quad (3)$$

$$g_2(\gamma) \cdot \beta\langle\beta\rangle + \beta\langle\beta\rangle\langle\gamma\rangle \sum_{j=1}^{Ns} \left[ \Delta H_{dis2,j}(3) \cdot \langle\Delta I_{s,j}\rangle \right] = 0 \quad (4)$$

$$g_3(\gamma) \cdot \langle\beta\rangle^2 + \langle\beta\rangle^2 \gamma \sum_{j=1}^{Ns} \left[ \Delta H_{dis3,j}(3) \cdot \langle\Delta I_{s,j}\rangle \right] = 0 \quad (5)$$

where $f_1(\gamma)$ and $f_2(\gamma)$ are linear components of distortion, $g_1(\gamma)$, $g_2(\gamma)$, and $g_3(\gamma)$ are higher-order components of distortion, and $\gamma$ is deflection, $\Delta Wdc1,j(1)$ and $\Delta Wdc2,j(1)$ are coefficients of a charged particle beam path caused by the focus-correction coils and the astigmatism compensators, respectively, and proportional to $\beta$ or $<\beta>$, $\Delta Hdis1,j(3)$, $\Delta Hdis2,j(3)$, and $\Delta Hdis3,j(3)$ are coefficients of 3rd-order distortion aberrations caused by the astigmatism compensators.

The foregoing and other features and advantages of the invention will become more apparent from the following detailed description of example embodiments which proceeds with reference to the accompanying drawings.

BRIEF DESCRIPTION OF THE DRAWINGS

FIGS. 18A–18B illustrate the measurement of magnification and rotational errors of a subfield image, wherein FIG. 18A is a plan view of an exemplary subfield on a mask; and FIG. 18B is a plan view of the subfield of FIG. 18B as projected.

DETAILED DESCRIPTION

For convenience in describing example embodiments, the brackets <> denote a complex conjugate and i is $(-1)^{1/2}$.

In addition, some symbols used to represent mathematical variables are written both with and without subscripts. As a particular example, both Hfc,1(5) and $H_{fc,1}(5)$ are used to represent the same quantity. As another example, X1 and $X_i$ (for i=1) represent the same quantity. Other variables are similarly expressed with and without subscripts.

Example Embodiment 1

Figure 1:
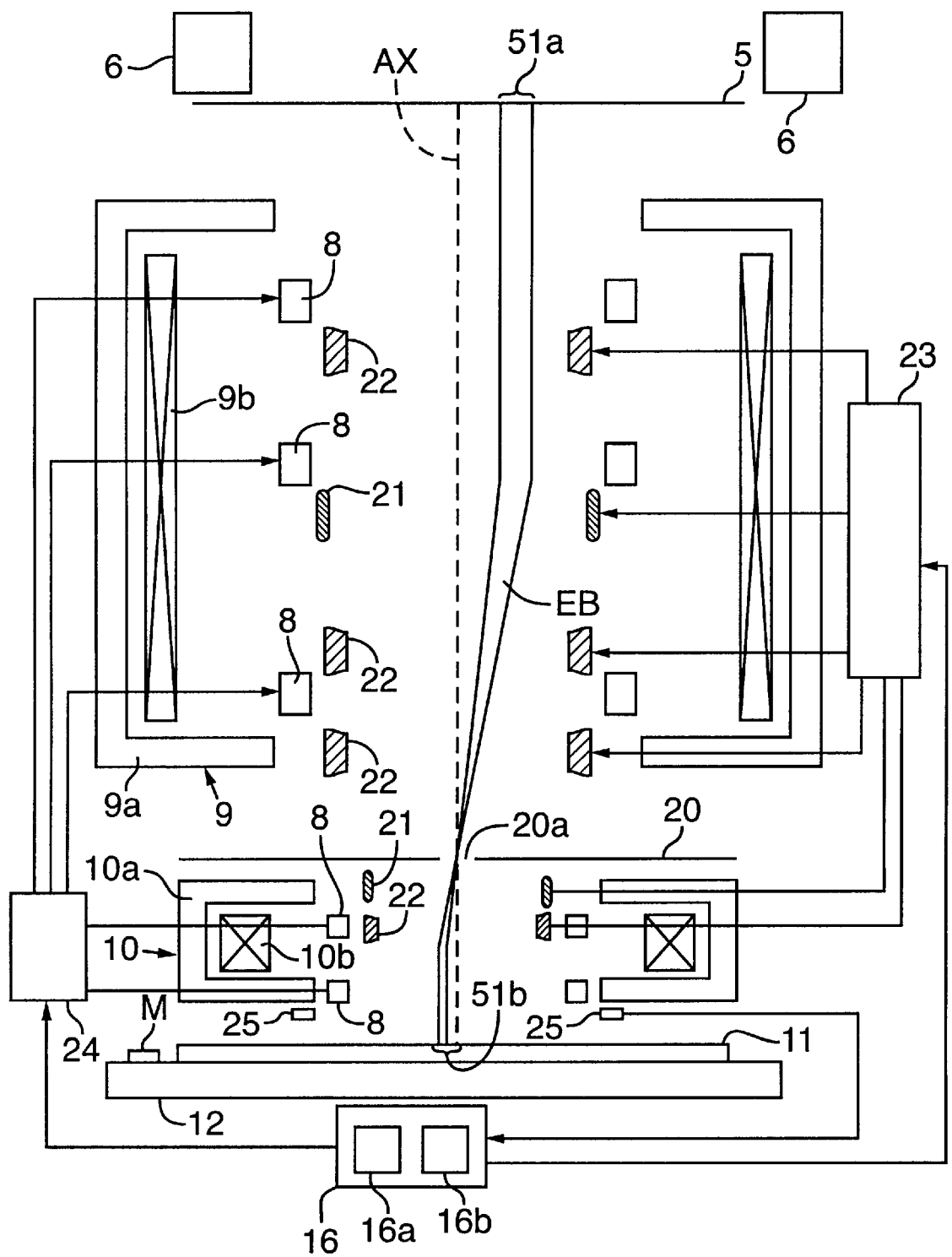
FIG. 1 is a schematic elevational diagram of a first respective embodiment of a charged-particle-beam ("CPB") pattern-transfer apparatus according to the present invention.

With reference to FIG. 1, a charged-particle-beam pattern-transfer apparatus according to this example embodiment comprises an electron gun (not shown in FIG. 1 but understood to be located upstream of the components shown in FIG. 1) that produces an electron beam EB. The electron beam EB is directed onto an exemplary subfield 51a of a reticle (mask) 5 by an illumination optical system (not shown in FIG. 1 but understood to be located between the electron gun and the reticle 5) parallel to an optical axis AX. A first projection lens 9 directs the electron beam EB through an aperture 20a defined by an aperture plate 20. The projection lens 9 and a second projection lens 10 image the subfield 51a onto a corresponding transfer subfield 51b of a wafer 11 or other suitable substrate. The projection lenses 9, 10 comprise respective pole pieces 9a, 10a and lens coils 9b, 10b. The wafer 11 is coated with an electron-beam-sensitive resist and is retained by a wafer stage 12.

An alignment mark M is provided on the wafer stage 12 and an electron detector 25 is provided to detect electrons scattered by the alignment mark M. The alignment mark M comprises, for example, a series of alternating lines and spaces, similar to patterns 306 shown in FIG. 3B. To increase the reflectance of the alignment pattern M, the lines of the alignment pattern M are made from a heavy metal or other electron beam reflective material.

Focus-correction coils 21 and astigmatism compensators 22 form a dynamic correction system and are controlled by a dynamic-correction controller 23 based on correction data stored in a memory 16b of a main controller 16. In addition, a controller 24 regulates a deflector 8 that directs the image of the subfield 51a to the transfer subfield 51b. The controllers 23, 24 operate under the control of the main controller 16.

If the subfield 51a were to be imaged onto the wafer 11 without activation of the focus-correction coils 21 and the astigmatism compensators 22 (i.e., without the dynamic correcting system being operational), then the image would be distorted or exhibit other image defects. With reference to FIGS. 2A–2E, a subfield image A exhibiting no distortion or other image defect ("ideal image") is shown with respect to some exemplary distorted or otherwise degraded images.

Figure 2A:
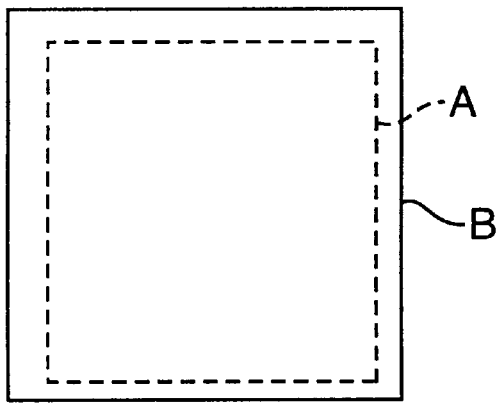
FIGS. 2A–2E are schematic plan views illustrating representative distorted subfield images.
Figure 2B:
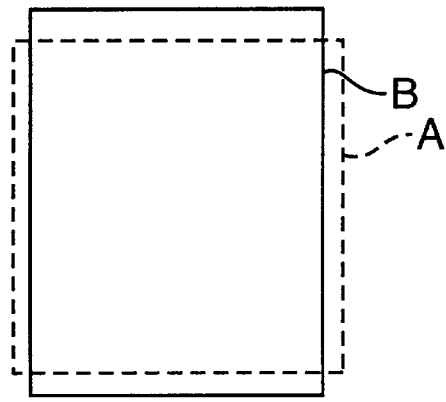
Figure 2C:
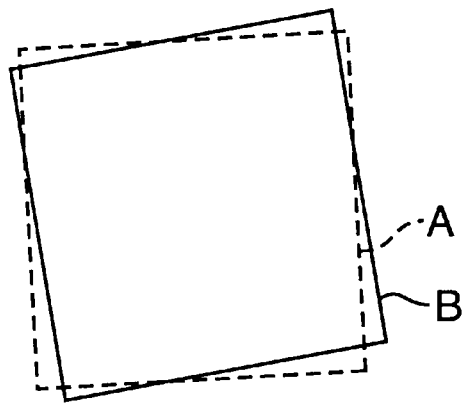
Figure 2D:
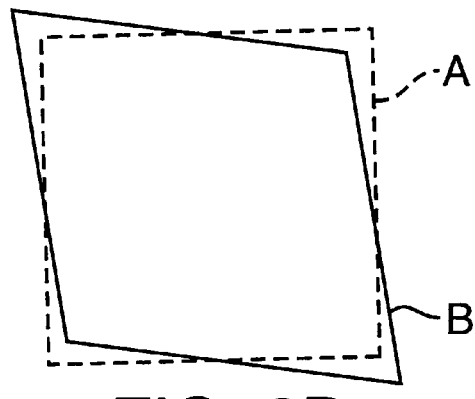
Figure 2E:
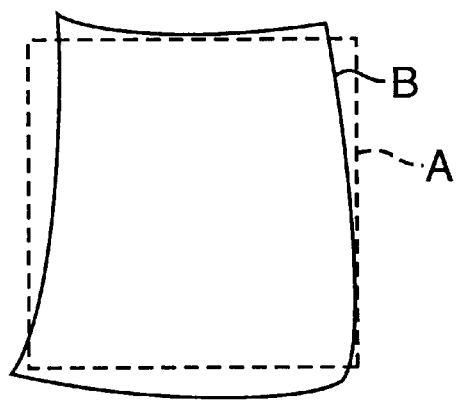

Referring to FIG. 2A, a subfield image B is shown that is imaged at a magnification larger than the magnification of the ideal image A. Referring to FIG. 2B, the subfield image B is rectangular while the ideal subfield image A is square. Referring to FIG. 2C, the subfield image B is rotated relative to the ideal subfield image A; in FIG. 2D, the subfield image B is distorted to a rhomboidal shape. Referring to FIG. 2E, the subfield image B is distorted.

Subfield-image distortion usually consists of a combination of the basic distortions shown in FIGS. 2A–2D. Distortion correction of a distorted subfield image is accomplished by dividing the distortion actually exhibited by the subfield image into the basic distortion components corresponding to these distortions. The focus-correction coils 21 and astigmatism compensators 22 then correct these distortion components.

Figure 3A:
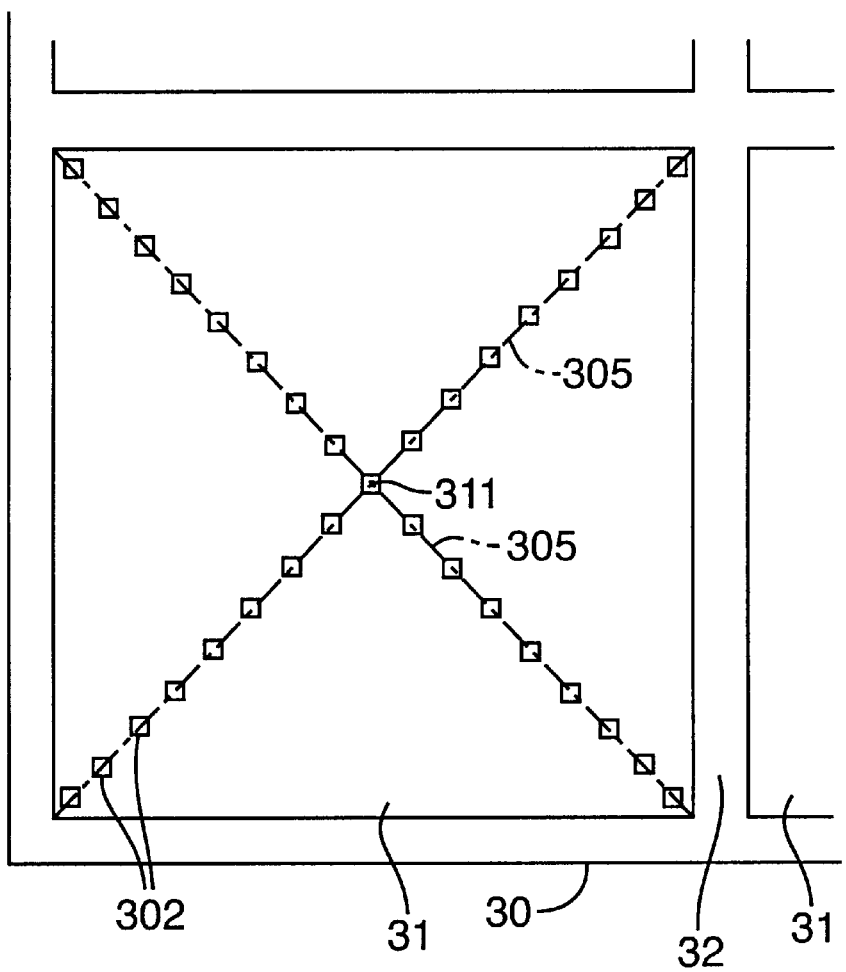
FIG. 3A is a schematic plan view of a portion of a first representative embodiment of an evaluation mask according to the invention, comprising multiple test patterns.
Figure 3B:
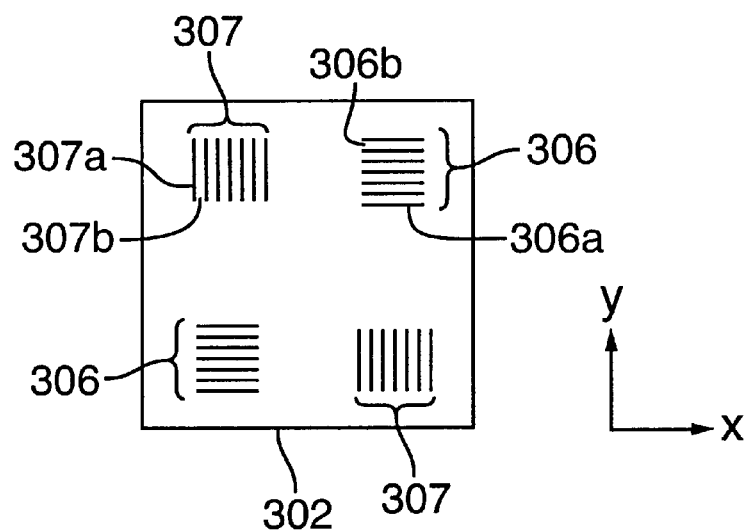
FIG. 3B is a schematic plan view of a test pattern of the evaluation mask of FIG. 3A.

Distortion correction begins with a measurement of the distortion. With reference to FIG. 3A, an evaluation mask 30 is used that comprises a plurality of evaluation subfields 31 separated by boundary regions 32. The evaluation subfield 31 comprises an array of test patterns 302 arranged along diagonals 305 of the subfield 31. Referring to FIG. 3B, each test pattern 302 comprises alignment patterns 306, 307 that consist of alternating lines 306a, 307a and intervening spaces 306b, 307b, respectively.

Figure 4:
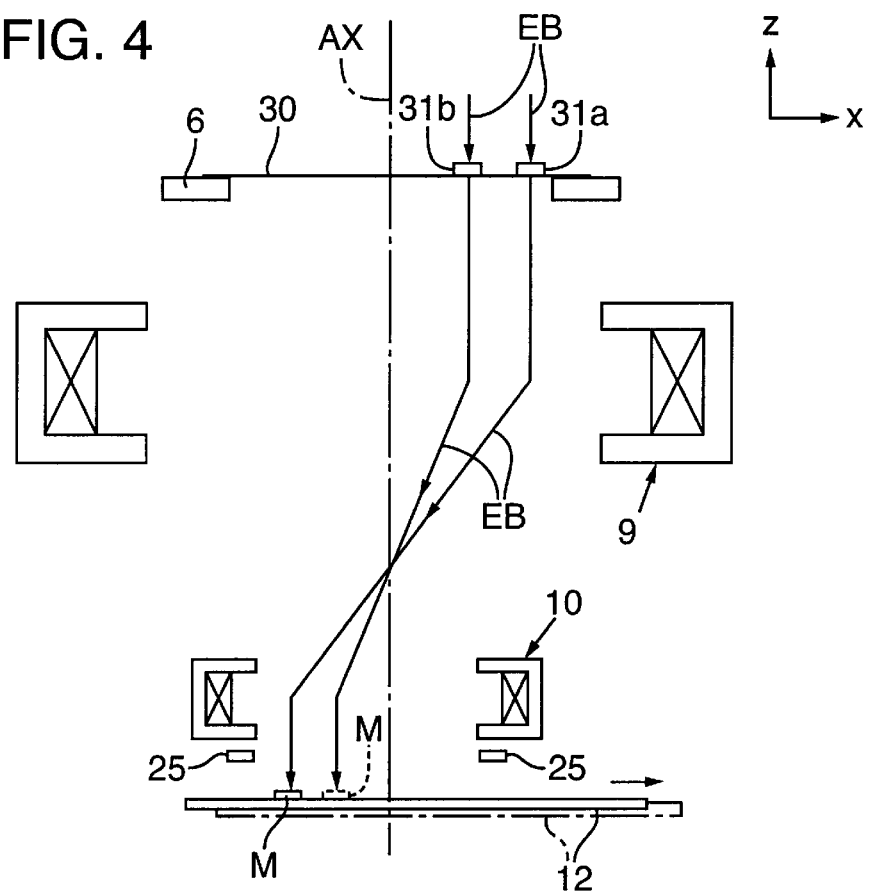
FIG. 4 is a schematic elevational view of a CPB pattern-transfer apparatus according to the invention, illustrating distortion measurement using the evaluation mask of FIG. 3A.
Figure 5:
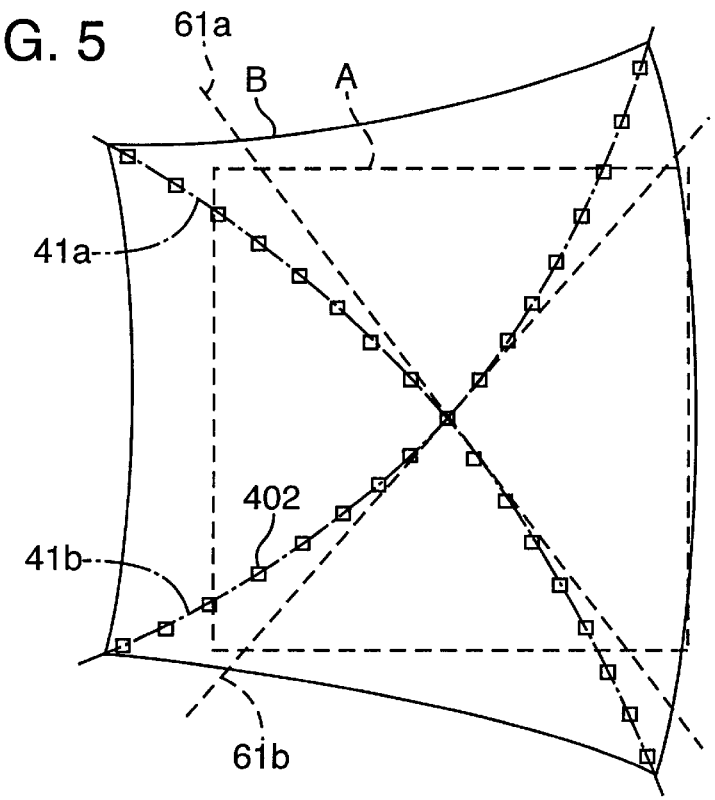
FIG. 5 shows, in plan view, an exemplary distorted subfield image.

With reference to FIG. 4, the evaluation mask 30 is placed on a mask stage 6 and exemplary evaluation subfields 31a, 31b are imaged onto the wafer stage 12. With reference to FIG. 5, a subfield image B of the evaluation subfield 31a is distorted with respect to the ideal image A of the evaluation subfield. The diagonals 305 are imaged as curves 41a, 41b, and test-pattern images 402 of the test patterns 302 appear along the curves 41a, 41b.

Distortion is measured by recording the coordinates of the various test-pattern images 402. For example, the electron beam EB irradiates the evaluation subfield 31a and the wafer stage 12 translates so that the alignment mark M is positioned at the subfield image B. The electron detector 25 detects the test pattern images 402 by detecting electrons reflected from the alignment mark M. The electron beam EB is simultaneously deflected by the deflector 8, using a position detector 15 to measure the position of the wafer stage 12.

Figure 20:
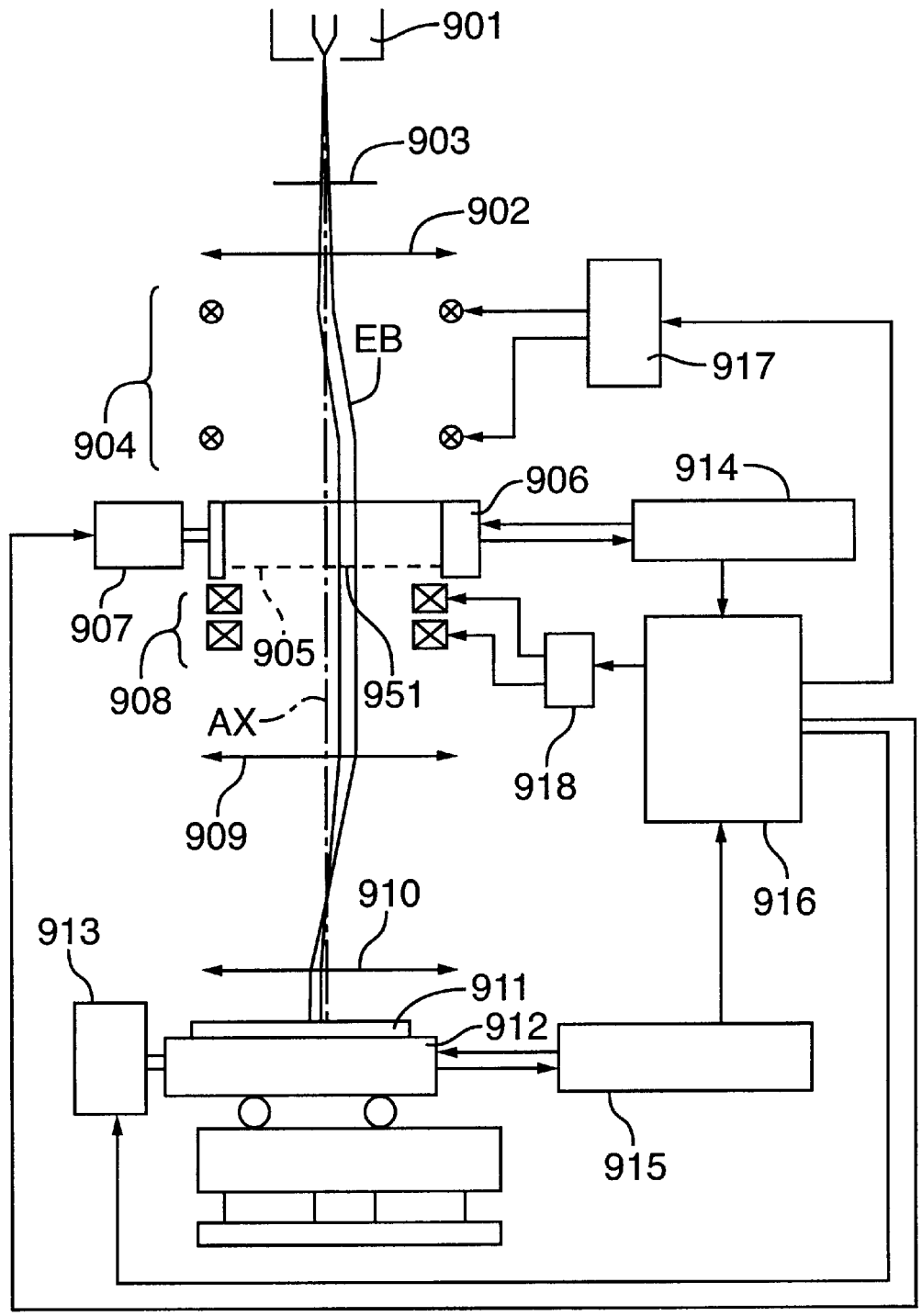
FIG. 20 is a schematic elevational view of a prior art CPB pattern-transfer apparatus.
Figure 21A:
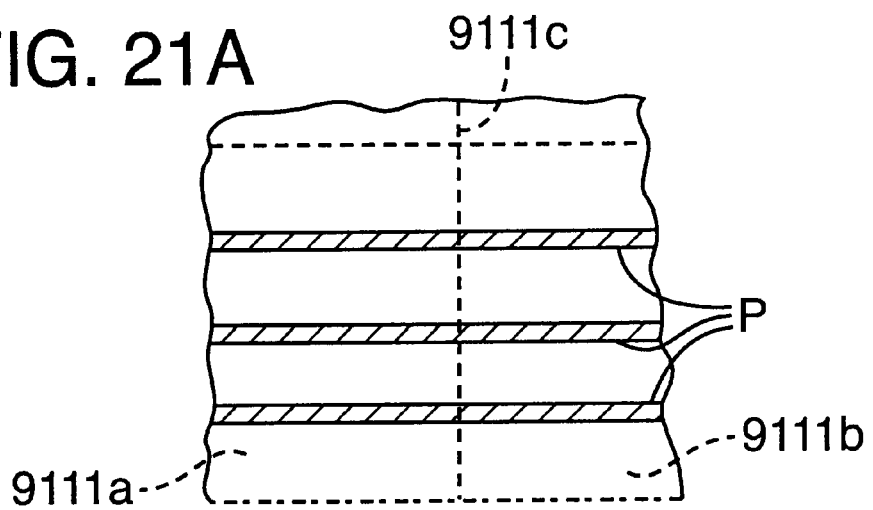
FIG. 21A is a schematic plan view of an ideal image of two adjacent subfields.
Figure 21B:
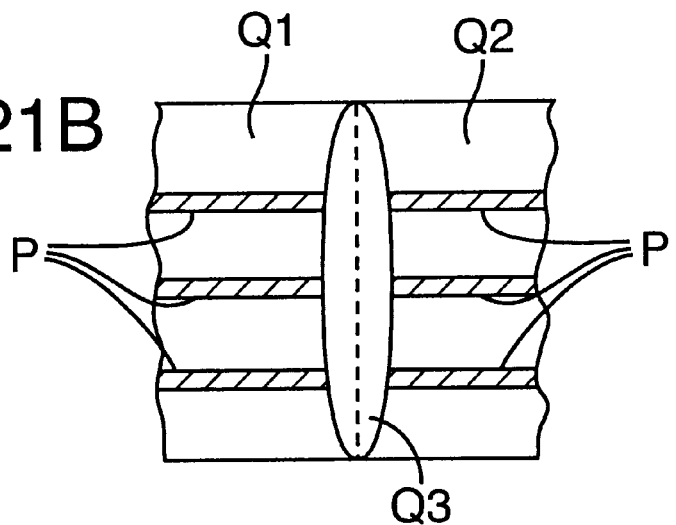
FIGS. 21B–21C are schematic plan views of distorted images of two adjacent subfields.
Figure 21C:
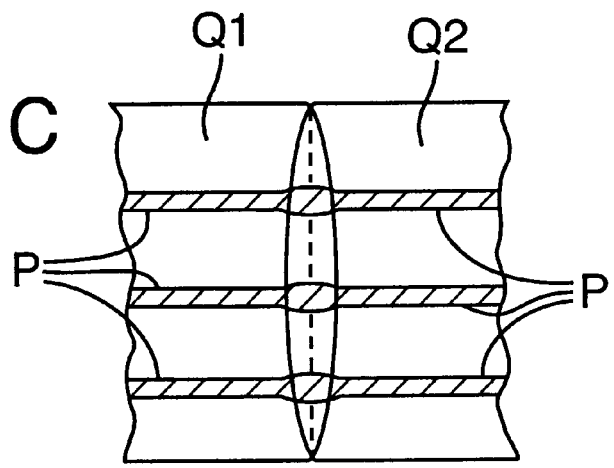
Figure 22:
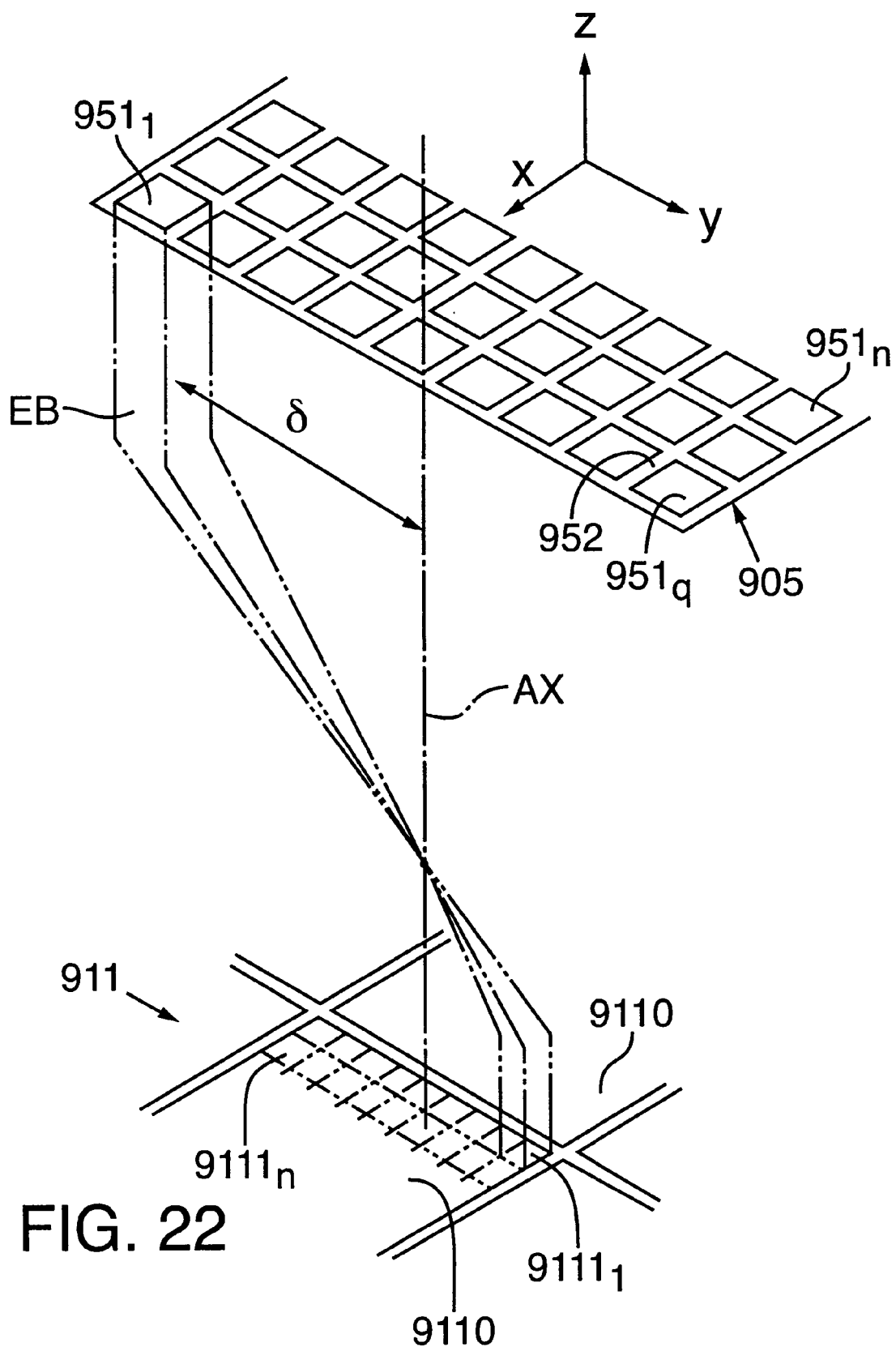
FIG. 22 is a perspective view illustrating sequential transfer of mask subfields using a cPB pattern-transfer apparatus.

After the positions of the images 402 of the test patterns 302 are measured, an adjacent subfield is imaged onto the wafer stage 12 and similarly measured. By performing similar measurements for all of the evaluation subfields 31 of the evaluation mask 30, subfield-image distortion for each of the subfields 31 is measured. The number of subfields 31 on the evaluation mask 30 need not equal the number of subfields 51a, so long as the full range of deflections of the electron beam EB is measured. The positions of the images 402 are calculated by an arithmetic processing unit 16a of the main control system 16, based on signals from position detectors (similar to position detectors 914, 915 of FIG. 20) and the reflected electron detector 25, and are stored in the memory 16b.

In FIG. 3A, the test patterns 302 are arranged in the subfield 31 along the diagonal lines 305. However, other test-pattern arrangements are suitable. For example, with reference FIG. 11, the test patterns 302 are arranged along the diagonals 305 and along a square 309. With reference to FIG. 12, the test patterns 302 are placed at the perimeter 310 and in an array placed at a center 311 of the subfield.

Figure 6:
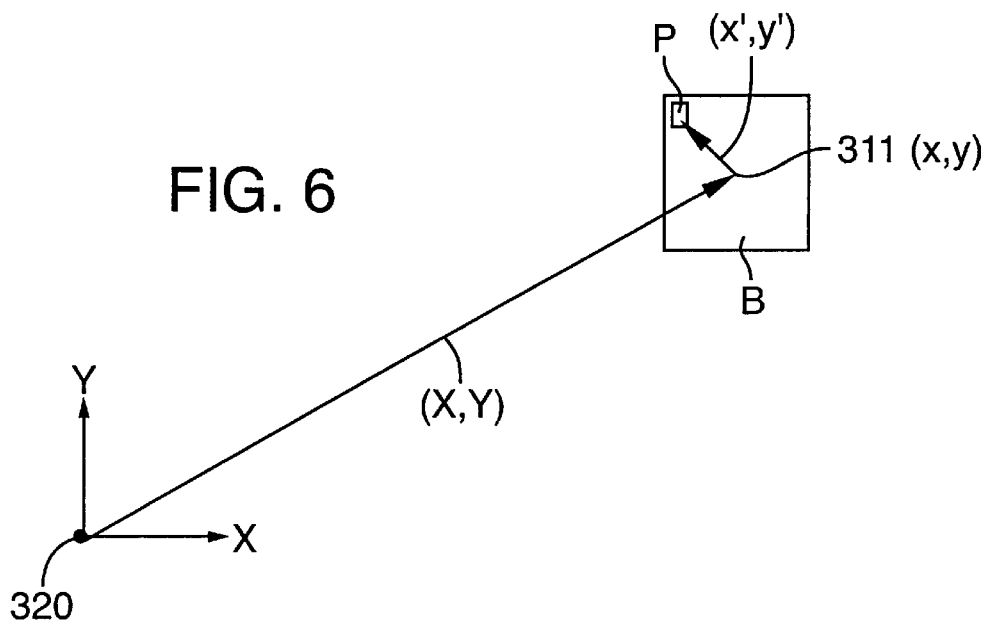
FIG. 6 illustrates coordinate systems used to quantify distortion according to the invention.

With reference to FIG. 6, an origin 320 of an XY-coordinate system at the wafer 12 is placed at the intersection of the optical axis AX and the wafer stage 12. Using an XY-coordinate system, the coordinates of the image of the center 311 of the subfield are (x,y). Further defining an X'Y'-coordinate system having an origin at the center 311, coordinates within an image of a subfield 31 are (x',y'). The respective (X,Y) and (X',Y') coordinates are conveniently expressed as complex coordinates $\gamma$, $\beta$ wherein $\gamma=X+iY$, and $\beta=X'+iY'$, respectively. In addition, complex conjugates of the coordinates $\gamma$, $\beta$ are $<\gamma>=X-iY$, and $<\beta>=X'-iY'$. The position of each pattern image within each subfield image is then expressed in terms of the coordinates $\gamma,<\gamma>,\beta,<\beta>$.

The distortion in the subfield image B is separated into linear distortion components (e.g., the distortion components shown in FIGS. 2A–2D) and higher-order distortion components (e.g., shown in FIG. 2E). These distortions are corrected by linear transformation and quadratic transformation to the coordinates $\gamma,<\gamma>,\beta,<\beta>$.

Linear transformation is described with reference to the subfield image B of FIG. 5. Because the images 402 of the test patterns 302 are located on the curves 41a, 41b (corresponding to the diagonal lines 305), lines 61a, 61b that intersect at the intersection of curves 41a, 41b are determined using the distortion measurements. The lines 61a, 61b exhibit the distortions of FIGS. 2A–2D. Therefore, a linear transformation that transforms the curves 41a, 41b of a subfield image to match the diagonals 61a, 61b is found.

Figure 7:
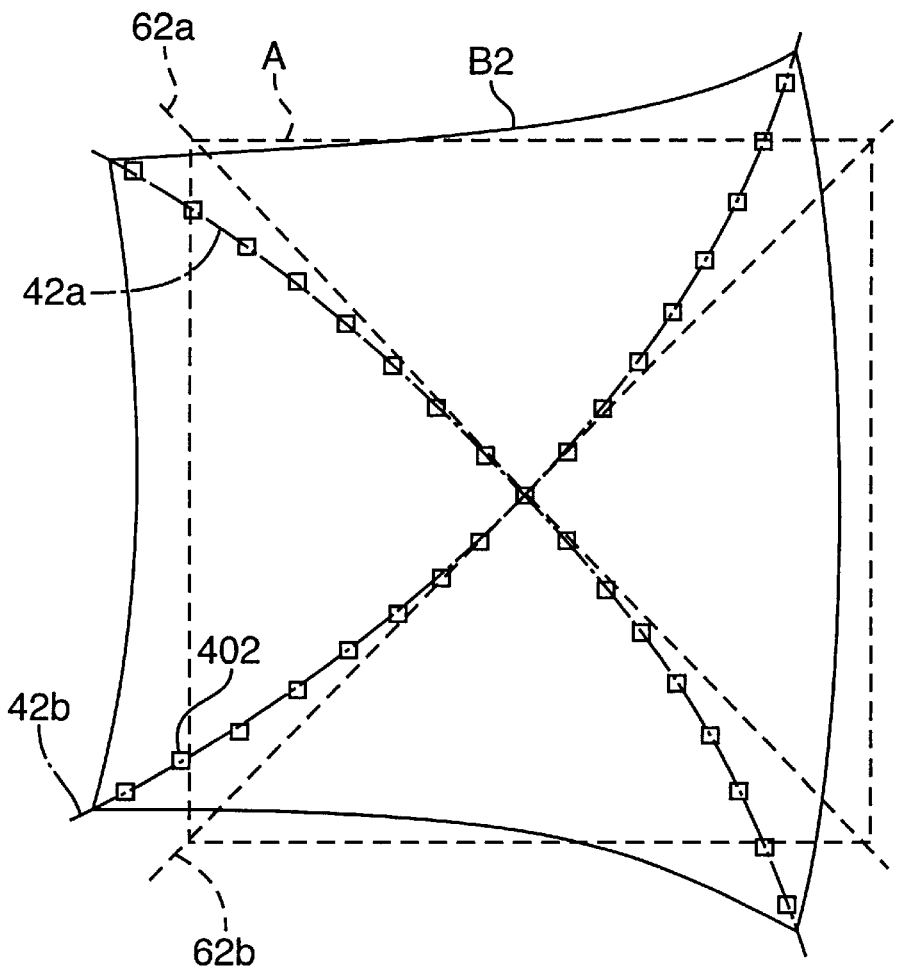
FIG. 7 illustrates, in plan view, correction of linear distortion according to the invention.

A linear transformation is then performed so that the spacing of the test-pattern images 402 matches the spacing of the corresponding ideal image, i.e., so that, e.g., the magnification of the actual subfield image B matches that of the ideal subfield image A (a "magnification matching" transformation). Because the spacing of the test-pattern images 402 differs due to distortion that is dependent upon position within the subfield image ($\beta,<\beta>$), the linear transformation to achieve this magnification is based on measurement data for test-pattern images 402 near the intersection of the straight lines 61a, 61b. Combining the magnification-matching linear transformation and the linear transformation described above into a single linear transformation equation $\phi(\beta,<\beta>)$, the actual subfield image B is transformed into a subfield image B2 as shown in FIG. 7. In FIG. 7, lines 62a, 62b correspond to the lines 61a, 61b on which the transformation has been performed.

Figure 8A:
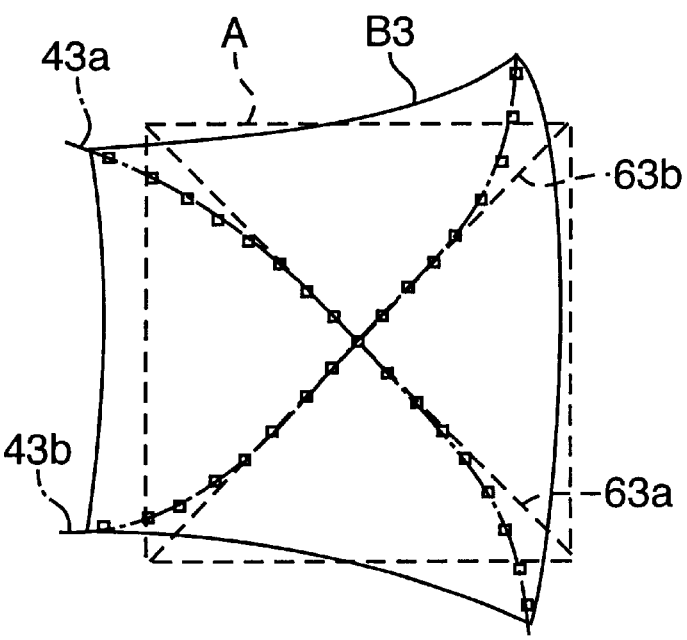
FIGS. 8A–8C illustrate a representative correction of higher-order distortion components according to the invention.

As can be seen from FIG. 7, since the entire subfield image B2 is distorted at the same proportions when the subfield image B is linearly transformed, the test-pattern images 402 are located along curves 42a, 42b. Therefore, the curves 42a, 42b are matched to corresponding quadratic curves 43a, 43b using a least-squares method. Thus, the subfield image B2 transforms into a subfield image B3, shown in FIG. 8A.

Figure 8B:
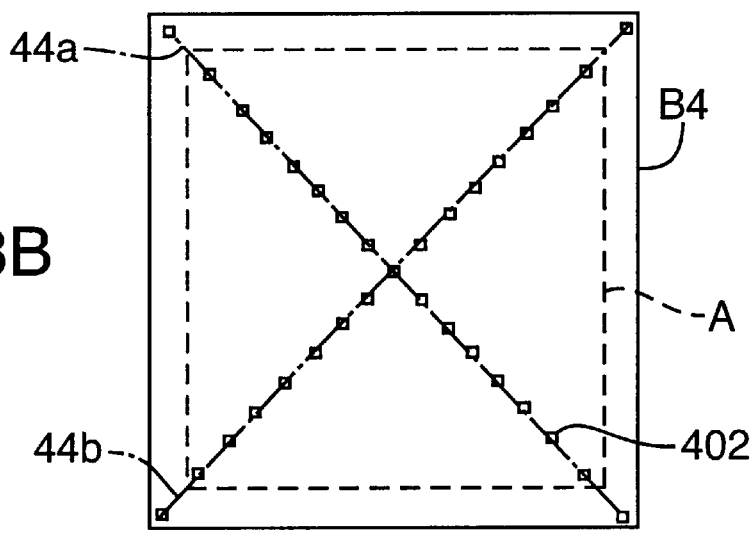
Figure 8C:
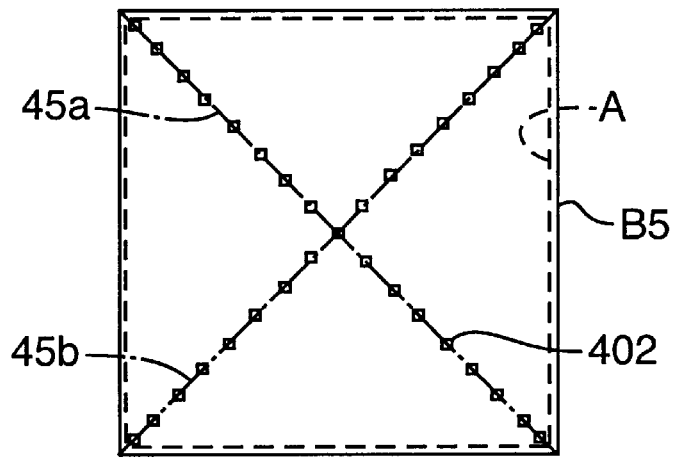

A quadratic transformation is then performed so that the quadratic curves 43a, 43b are matched to diagonals 63a, 63b of the ideal subfield image A (i.e., matched to the diagonals 62a, 62b discussed above). Using the complex coordinates $\beta,<\beta>$, the transformation is performed with the substitution $\beta=\beta+a\beta^2+b<\beta>^2$. After this transformation, the curves 43a, 43b transform to lines 44a, 44b and thus become diagonals of the square subfield image B4 of FIG. 8B. To correct the remaining higher-order magnification error, a quadratic transformation is performed by substituting $\beta=\beta+c\beta<\beta>$, wherein a, b, and c are complex numbers. When the higher-order components of the distortion are thus corrected, a subfield image B5, close to the ideal subfield image A, is obtained, as shown in FIG. 8C, so that the test-pattern images 402 are aligned on the diagonals 45a, 45b of the square subfield image B5.

The coefficients of the linear transformation and quadratic transformation discussed above are stored in the memory 16b for each deflection position, i.e., for each subfield. As discussed above, correction is performed by separating the measured subfield-image distortion into linear components and higher-order components and performing linear transformation and quadratic transformation. However, correction can also be carried out in other ways, e.g., as disclosed in Japanese K8kai laid open patent publication No. HEI 09-129544.

Distortion correction with these transformations is accomplished by adjusting electrical currents supplied to the dynamic correcting system (i.e., the focus-correction coils 21 and the astigmatism compensators 22). Of the subfield-image-distortion components, magnification and rotational components are corrected by adjusting the currents in the focus-correction coils 21; components pertaining to deformation to rectangular or rhomboidal shapes are corrected by adjusting the electrical currents supplied to the astigmatism compensators 22. In addition, for higher-order components, quadratic distortions due to the focus-correction coils 21 and the astigmatism compensators 22 are corrected by adjusting the electrical currents supplied to these components.

Figure 9:
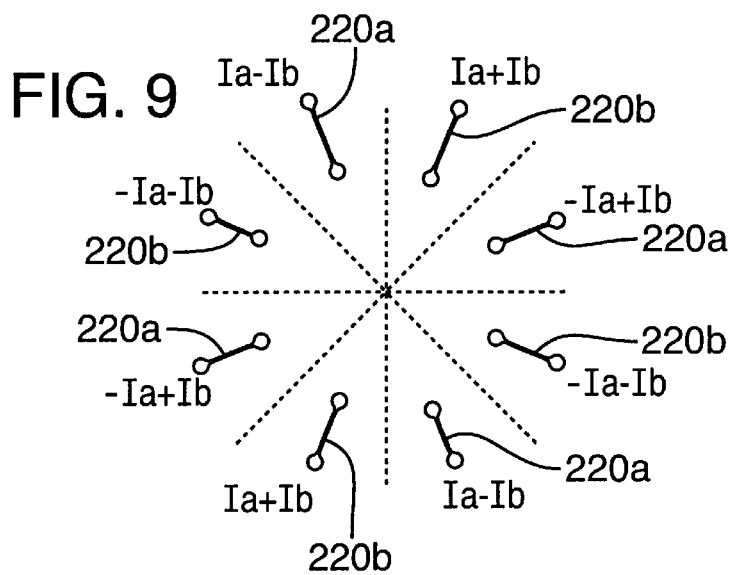
FIG. 9 is a schematic plan view of the astigmatism compensator used in the FIG. 1 embodiment.

With reference to FIG. 9, the astigmatism compensators 22 preferably comprise two independently controllable sets of quadrupoles further comprising coils 220a, 220b, respectively. The coils 220a receive currents $I_a-I_b$, $-I_a+I_b$ and the coils 220b receive currents $I_a+I_b$, $-I_a-I_b$ as shown in FIG. 9. The currents supplied to the astigmatism compensators 22 are generally expressed using the complex current $I_{s,j}=I_{a,j}+iI_{b,j}$. The currents of the two focus-correction coils 21 are expressed as $\Delta I_{c,j}$ (wherein j=1, 2), and the currents of the four astigmatism compensators 22 are expressed as $\Delta I_{s,j}$ (wherein $\Delta I_{s,j}=\Delta I_{a,j}+i\Delta I_{b,j}$ and j=1, 2, 3, 4).

The currents supplied to the focus-correction coils 21 and astigmatism compensators 22 are determined using Equation Set 1-1:

Equation Set 1 – 1

$$f_1(\gamma) \cdot \beta + \beta \sum_{j=1}^{Nc} \left[ \Delta W_{dc1,j}(1) \cdot \Delta I_{c,j} \right] = 0 \quad (1)$$

$$f_2(\gamma) \cdot \langle \beta \rangle + \langle \beta \rangle \sum_{j=1}^{Ns} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{Ns} \left[ \Delta H_{dis,j}(3) \cdot \langle \Delta I_{s,j} \rangle \right] = 0 \quad (3)$$

$$g_2(\gamma) \cdot \beta \langle \beta \rangle + \beta \langle \beta \rangle \langle \gamma \rangle \sum_{j=1}^{Ns} \left[ \Delta H_{dis2,j}(3) \cdot \langle \Delta I_{s,j} \rangle \right] = 0 \quad (4)$$

$$g_3(\gamma) \cdot \langle \beta \rangle^2 + \langle \beta \rangle^2 \gamma \sum_{j=1}^{Ns} \left[ \Delta H_{dis3,j}(3) \cdot \langle \Delta I_{s,j} \rangle \right] = 0 \quad (5)$$

where $f_1(\gamma)$ and $f_2(\gamma)$ are the linear components of the distortion, $g_1(\gamma)$, $g_2(\gamma)$, and $g_3(\gamma)$ are higher-order distortion components, and $\gamma$ is the deflection.

The second terms on the left-hand side of Equation Set 1-1 pertain to corrections made by the dynamic correction system. $\Delta Wdc1,j(1)$ and $\Delta Wdc2,j(1)$ are coefficients of the shift of the electron beam path due to the focus-correction coils 21 and the astigmatism compensators 22, respectively and are proportional to $\beta$ or $\langle\beta\rangle$; $\Delta Hdis1,j(3)$, $\Delta Hdis2,j(3)$, and $\Delta Hdis3,j(3)$ are coefficients of 3rd-order distortion aberrations due to the astigmatism compensators 22. These coefficients are calculated or measured before exposure. Currents for the two focus-correction coils 21 are determined from equation (1) of Equation Set 1-1, and the currents for the four astigmatism compensators 22 are determined with equations (2)–(5) of Equation Set 1-1.

The correction of linear distortion by linear transformation is accomplished by adjusting the currents $\Delta I_{c,j}$ of the focus-correction coils 21 and the currents $\Delta I_{s,j}$ of the astigmatism compensators 22. In addition, to correct the higher-order distortion by quadratic transformation, the currents $\Delta I_{c,j}$, $\Delta I_{s,j}$ are determined using equations (3)–(5) of Equation Set 1-1. The five equations of Equation Set 1-1 involve complex numbers and are separable into five equations corresponding to the real parts and five equations corresponding to the imaginary parts, for a total of ten real equations.

Figure 10:
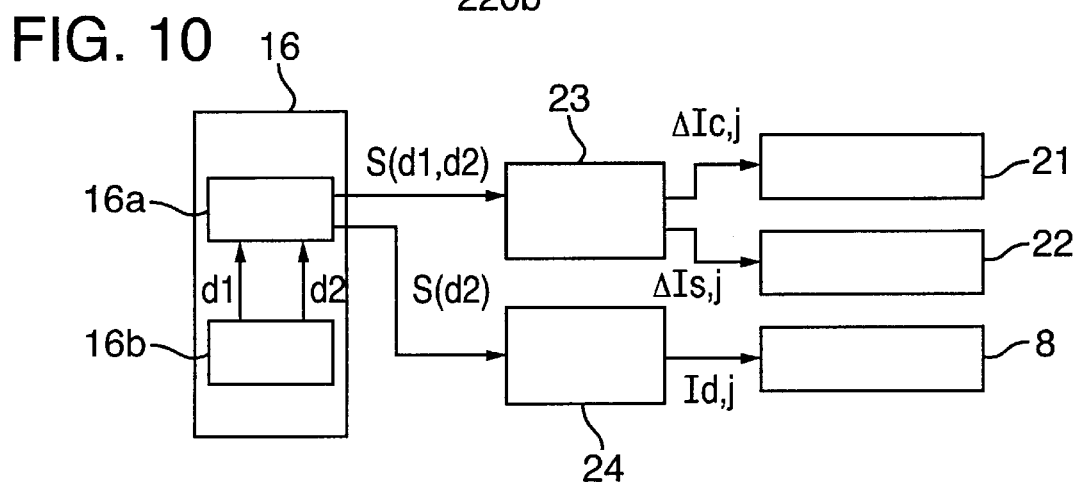
FIG. 10 is a block diagram of a distortion-correction method according to the invention.

With reference to FIG. 10, subfield-distortion-correction data d1 (i.e., the variables of Equation Set 1-1) for each deflection position for the dynamic correcting system and deflection data d2 are stored in the memory 16b. The deflection data d2 pertain to the position of the center of the subfield image. The deflection position is calculated based on the distortion-measurement data.

During exposure of a subfield, the data d1, d2 for the subfield are read from the memory 16b to the arithmetic processing unit 16a. The currents $\Delta Ic,j$, $\Delta Is,j$ for the focus-correction coils 21 and the astigmatism compensators 22 and the currents Id,j (wherein j=1, 2, 3, 4, 5) for the deflectors 8 are calculated. Correction signals S(d1,d2), S(d2) are transmitted to the dynamic-correction controller 23 and the deflection controller 24. The dynamic-correction controller 23 controls the currents of the focus-correction coils 21 ($\Delta Ic,j$) and the currents of the astigmatism compensators 22 ($\Delta Is,j$) based on the signal S(d1,d2). The deflection controller 24 regulates the electrical current in the deflectors 8 (Id,j). In Example Embodiment 1, the currents $\Delta Ic,j$, $\Delta Is,j$ are calculated by the arithmetic processing unit 16a using Equation Set 1-1 and the distortion-correction data d1 entered in the memory 16b. Alternatively, precalculated currents $\Delta Ic,j$, $\Delta Is,j$ can be stored in the memory 16b.

Prior art methods for distortion correction include using predistorted masks and the method of Japanese Kokai patent publication No. HEI 9-129544. These methods have several disadvantages. Predistorted masks compensate for distortion in an electron optical system. Unfortunately, every electron optical system exhibits different distortions, and a mask that is correctly predistorted for one electron optical system is not generally satisfactorily predistorted for other electron optical systems. In the method of Japanese patent publication Kôkai No. HEI 9-129544, the average of the maximum value and minimum value of distortion within a subfield image is used to characterize and correct distortion in that subfield. In Example Embodiment 1, both linear distortions and the higher-order distortions are corrected with a dynamic-correction system using a quadratic transformation, and distortions can be more completely corrected.

In Example Embodiment 1, the positions of the test-pattern images 402 of the various test patterns 302 are measured using an alignment mark M on the wafer stage 12, but each test-pattern image 402 can be exposed onto the wafer 11, a test pattern developed, and the test patterns measured. In addition, the evaluation mask 30 comprises multiple subfields, but a single subfield 31 containing test patterns 302 can be used for all subfields by translating a mask stage 6 supporting the mask 5.

In Example Embodiment 1, the dynamic correcting system comprises electromagnetic focus-correction coils and astigmatism compensators. Alternatively, the dynamic correcting system can also use electrostatic focus-correctors and electrostatic astigmatism compensators. In the latter case, equations similar to those in Equation Set 1-1 are used to determine voltages, not currents. However, an electromagnetic focus-correction coil must be used to correct rotational error since the Lorentz force of an electrostatic field does not rotate the electron beam EB.

With the apparatus and methods of Example Embodiment 1, distortion in each subfield image is determined before exposure and distortions are corrected with a dynamic correction system, so that high-precision pattern transfer is achieved with low distortion. Distortions due to manufacturing errors can also be corrected.

Example Embodiment 2

In an illustrative embodiment, 3rd-order and 5th-order aberrations are dynamically corrected using a dynamic correcting system comprising multiple focus-correction coils and multiple astigmatism compensators. Aberrations are corrected by adjusting electrical currents, without moving components of the dynamic correcting system or the CPB optical system. Aberrations that are proportional to the 3rd powers of $\alpha$, $\beta$, or $\gamma$ are referred to in Example Embodiment 2 as "3rd-order aberrations"; aberrations proportional to the 5th power of the $\alpha$, $\beta$, or $\gamma$ are referred to as "5th-order aberrations." In Example Embodiment 2, aberrations proportional to the second and higher powers of the deflection are reduced.

Figure 13:
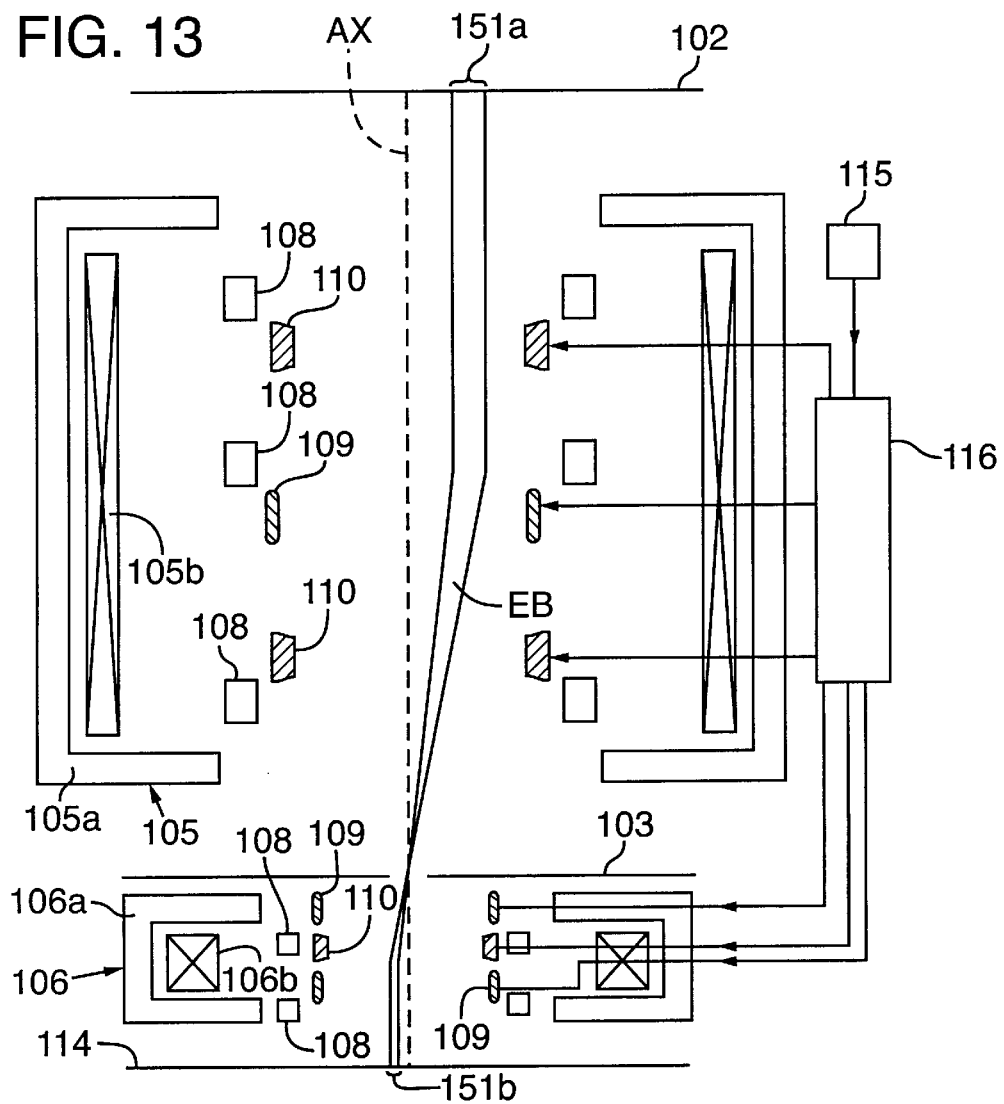
FIG. 13 is a schematic elevational view of a second representative embodiment of a CPB pattern-transfer apparatus according to the invention.

With reference to FIG. 13, an electron beam EB from an illumination optical system (not shown but understood to be located upstream of the mask 102) propagates parallel to an optical axis AX and irradiates an exemplary subfield 151a of a mask 102. Projection lenses 105, 106 image the mask subfield 151a with a specified magnification onto a corresponding transfer subfield 151b on a sensitized wafer 104 or other substrate. The projection lenses 105, 106, comprise respective pole pieces 105a, 106a and lens coils 105b, 106b. An aperture plate 103 transmits only a portion of the electron beam EB transmitted by the mask 102 to the wafer 104.

A dynamic correction system is provided comprising a controller 116, focus correction coils 109, and astigmatism compensators 110. The controller 116 controls the focus-correction coils 109 and the astigmatism compensators 110 based on correction data stored in a memory 115. Deflectors 108 are provided to deflect the electron beam EB from the mask subfield 151a to the transfer subfield 151b. In FIG. 13, three focus-correction coils 109 and three astigmatism compensators 110 are shown. However, a number Nc of focus-correction coils 109 and a number Ns of astigmatism compensators 110 are determined according to the number of aberrations to be corrected. The focus-correction coils are driven by electrical currents Icj (j=1, 2, ... , Nc), and the astigmatism compensators are driven by electrical currents Isj (j=1, 2, ... , Ns).

Each of the astigmatism compensators 110 comprises two independently controllable sets of quadrupoles, wherein currents (Ia−Ib), (Ia+Ib), (−Ia+Ib), and (−Ia−Ib) are supplied to coils 120, as shown above in FIG. 9. For convenience, the currents Ia, Ib are expressed using the complex current Isj=Ia,j+i·Ib,j, where i is $(-1)^{1/2}$.

To correct an aberration using the dynamic correction system, electrical currents are provided that are proportional to the square of the deflection, i.e., $\gamma<\gamma>$. The currents Icj, Isj can be written as $Ic^{(2)},j$ and $Is^{(2)},j$ so that the $\gamma$-dependence is explicit:

$$Ic^{(2)},j = C2,j\ \gamma<\gamma>$$

$$Is^{(2)},j = S2,j\ \gamma^2$$

wherein C2,j and S2,j are proportionality constants; C2,j is a real number; and S2,j is a complex number.

In an example of aberration correction, the dynamic correction of 3rd-order aberrations (i.e., aberrations proportional to the second or higher powers of the deflection $\gamma$, such as deflection field curvature, deflection astigmatism, deflection distortion, and hybrid distortion) is explained. To correct these aberrations, the currents $Ic^{(2)},j$ and $Is^{(2)},j$ are adjusted to satisfy Equation Set 2-1:

Equation Set 2 – 1

$$Mfc(3) \cdot \alpha\gamma\langle\gamma\rangle + \alpha\sum_{j=1}^{Nc} \{\Delta Mfc, c, j(3) \cdot Ic^{(2)}, j\} = 0 \quad (1)$$

$$Mas(3) \cdot \langle\alpha\rangle\gamma^2 + \langle\alpha\rangle\sum_{j=1}^{Ns} \{\Delta Mas, s, j(3) \cdot Is^{(2)}, j\} = 0 \quad (2)$$

$$Mdis(3) \cdot \gamma^2\langle\gamma\rangle + \gamma\sum_{j=1}^{Nc} \{\Delta Mdis, c, j(3) \cdot Ic^{(2)}, j\} + \quad (3)$$

$$\langle\gamma\rangle\sum_{j=1}^{Ns} \{\Delta Mdis, s, j(3) \cdot Is^{(2)}, j\} = 0$$

$$Hdis, 1(3) \cdot \beta\gamma\langle\gamma\rangle + \beta\sum_{j=1}^{Nc} \{\Delta Hdis, c, j(3) \cdot Ic^{(2)}, j\} = 0 \quad (4)$$

$$Hdis, 2(3) \cdot \langle\beta\rangle\gamma^2 + \langle\beta\rangle\sum_{j=1}^{Ns} \{\Delta Hdis, s, j(3) \cdot Is^{(2)}, j\} = 0 \quad (5)$$

Variable Definitions

| | Variable Definitions |
|---|---|
| $\alpha$ | aperture half-angle |
| $\beta$ | coordinates within the image of the subfield |
| $\gamma$ | beam deflection | and the remaining terms of Equation Set 2-1 pertaining to $3^{rd}$-order aberrations are listed in Table 2-1.

TABLE 2-1

Third-order Aberrations.

| Third-order Aberration Coefficients | |
|---|---|
| Mfc(3) | deflection field curvature |
| Mas(3) | deflection astigmatism |
| Mdis(3) | deflection distortion |
| Hdis,1(3),Hdis,2(3) | hybrid distortion |
| Aberration-Correction Coefficients for the Focus-Correction Coils | |
| ΔMfc,c,j(3), | deflection field curvature |
| ΔMdis,c,j(3), | deflection distortion |
| ΔHdis,c,j(3) | hybrid distortion |

TABLE 2-1-continued

Third-order Aberrations.

Aberration-Correction Coefficients for the Astigmatism Compensators

| ΔMas,s,j(3), | deflection astigmatism |
| ΔMdis,s,j(3), | deflection distortion |
| ΔHdis,s,j(3) | hybrid distortion |

The quantities α,β,γ can be written in terms of complex numbers:

$$\alpha = x' + iy'$$

$$\beta = x + iy$$

$$\gamma = X + iY$$

wherein coordinates x,y are rectilinear coordinates within the subfield image measured with respect to X=0, Y=0; x',y' are rectilinear coordinates centered on and perpendicular to the axis AX; and X, Y are coordinates of the center of the subfield image on the wafer 104.

Equation Set 2-1 involves complex numbers and can therefore be separated into equations containing only real numbers, resulting in a total of nine equations. Equation (1) in Equation Set 2-1 pertains to deflection field curvature, equation (2) in Equation Set 2-1 pertains to deflection astigmatism, equation (3) in Equation Set 2-1 pertains to deflection distortion, and equations (4) and (5) in Equations 2-1 pertain to hybrid distortion. The first term on the left-hand side of each of the equations in Equation Set 2-1 is the aberration generated by the projection lenses 105, 106 and deflectors 108. The second term on the left-hand side of each equation in Equation Set 2-1 is an aberration-correction term. The remaining terms on the left-hand side of the equation in Equation Set 2-1 are aberration-correction terms corresponding to the dynamic correcting system. The aberration-correction coefficients are determined in advance for either the focus-correction coils 109 or the astigmatism compensators 110, or both.

For example, to correct a measured field curvature Mfc, c,j(3), a current Ic(2),j is supplied to the jth focus-correction coil so that ΔMfc,c,j(3)·Ic$^{(2)}$ is determined. Alternatively, a known ΔMfc,c,j(3) can be used to determine the aberration coefficient Mfc,c,j(3). Then, the currents Ic$^{(2)}$j, Is$^{(2)}$j for the focus-correction coils 109 and astigmatism compensators 110 are set so that each of the aberrations produced by the lenses 105, 106 and the deflectors 108 and the aberration-correction terms produced by the dynamic correcting system cancel.

In Equation Set 2-1, Mfc(3) and ΔMfc(3) are real numbers; all the other coefficients are complex numbers.

With further reference to Equation Set 2-1, a dynamic correcting system that corrects or cancels 3rd-order aberrations is obtained if Nc and Ns are large enough so that Equation Set 2-1 can be solved for the currents Ic$^{(2)}$,j, Is$^{(2)}$,j. The currents of the focus-correction coils 109 and the astigmatism compensator 110 are then adjusted in accordance with the calculated values.

The number and type of compensators required for aberration correction is listed in Table 2-2. The number of compensators in Table 2-2 is the minimum required for correcting each of the listed aberrations. For example, at least two focus-correction coils are required to correct the deflection distortion of equation (3) of Equation Set 2-1 using only focus-correction coils, while only one astigma tism compensator is required. In addition, both focus-correction coils and astigmatism compensators can be used.

TABLE 2-2

| Aberration | Number and Type of Compensators |
|---|---|
| Deflection field curvature | One Focus-Correction Coil |
| Deflection Astigmatism | One Astigmatism Compensator |
| Deflection Distortion | Two Focus-Correction Coils or One Astigmatism Compensator |
| Hybrid Distortion 1 (from equation (4) of Equation Set 2-1) | Two Focus-Correction Coils |
| Hybrid Distortion 2 (from equation (5) of Equation Set 2-1) | One Astigmatism Compensator |

CPB pattern transfer throughput increases as the allowed beam deflection increases. Unfortunately, increasing the deflection increases aberrations such as 5th-order deflection aberrations and 3rd-order aberrations. 5th-order hybrid distortion results in distorted subfield images; consequently, adjacent subfield images do not align properly. Lack of proper alignment is unacceptable in high-resolution pattern transfer. Therefore, correction of 5th-order aberrations is necessary.

With respect to 5th-order aberrations, correction of aberrations proportional to the second and higher powers of the deflection is accomplished by adjusting the currents of the dynamic correction system to Ic$^{(2)}$,j; Ic$^{(4)}$,j; Is$^{(2)}$,j; and Is$^{(4)}$,j, thereby satisfying Equation Set 2-2.

Equation Set 2-2

$$Mx, 1(5) \cdot \alpha^3 \langle \gamma \rangle^2 + \alpha^3 \sum_{j=1}^{Ns} \{\Delta Mx, 1s, j(5) \cdot \langle Is^{(2)}, j \rangle\} = 0 \quad (1)$$

$$Mx, 2(5) \cdot \alpha^2 \langle \alpha \rangle \gamma \langle \gamma \rangle + \alpha^2 \langle \alpha \rangle \sum_{j=1}^{Nc} \{\Delta Mx, 2c, j(5) \cdot Ic^{(2)}, j\} = 0 \quad (2)$$

$$Mx, 3(5) \cdot \alpha \langle \alpha \rangle^2 \gamma^2 + \alpha \langle \alpha \rangle^2 \sum_{j=1}^{Ns} \{\Delta Mx, 3s, j(5) \cdot Is^{(2)}, j\} = 0 \quad (3)$$

$$Mcoma, 1(5) \cdot \alpha^2 \gamma \langle \gamma \rangle^2 + \alpha^2 \langle \gamma \rangle \sum_{j=1}^{Nc} \{\Delta Mcoma, ic, j\{5\} \cdot Ic^{(2)}, j\} + \quad (4)$$

$$\alpha^2 \gamma \sum_{j=1}^{Ns} \{\Delta Mcoma, 1s, j(5) \cdot \langle Is^{(2)}, j \rangle\} = 0$$

$$Mcoma, 2(5) \cdot \alpha \langle \alpha \rangle \gamma^2 \langle \gamma \rangle + \alpha \langle \alpha \rangle \gamma \sum_{j=1}^{Nc} \{\Delta Mcoma, 2c, j(5) \cdot Ic^{(2)}, j\} + \quad (5)$$

$$\alpha \langle \alpha \rangle \langle \gamma \rangle \sum_{j=1}^{Ns} \{\Delta Mcoma, 2s, j(5) \cdot Is^{(2)}, j\} = 0$$

$$Mcoma, 3(5) \cdot \langle \alpha \rangle^2 \gamma^3 + \langle \alpha \rangle^2 \gamma \sum_{j=1}^{Ns} \{\Delta Mcoma, 3s, j(5) \cdot Is^{(2)}, j\} = 0 \quad (6)$$

$$Hcoma, 1(5) \cdot \alpha^2 \langle \beta \rangle \gamma \langle \gamma \rangle + \alpha^2 \langle \beta \rangle \sum_{j=1}^{Nc} \{\Delta Hcoma, 1c, j(5) \cdot Ic^{(2)}, j\} = 0 \quad (7)$$

$$Hcoma, 2(5) \cdot \alpha^2 \beta \langle \gamma \rangle^2 + \alpha^2 \beta \sum_{j=1}^{Ns} \{\Delta Hcoma, 2s, j(5) \cdot \langle Ic^{(2)}, j \rangle\} = 0 \quad (8)$$

$$Hcoma, 3(5) \cdot \alpha \langle\alpha\rangle\langle\beta\rangle \gamma^2 + \alpha\langle\alpha\rangle\langle\beta\rangle \sum_{j=1}^{Ns} \{\Delta Hcoma, 3s, j(5) \cdot Is^{(2)}, j\} = 0 \quad (9)$$

$$Hcoma, 4(5) \cdot \alpha\langle\alpha\rangle\beta\gamma\langle\gamma\rangle + \alpha\langle\alpha\rangle\beta \sum_{j=1}^{Nc} \{\Delta Hcoma, 4c, j(5) \cdot Ic^{(2)}, j\} = 0 \quad (10)$$

$$Hcoma, 5(5) \cdot \langle\alpha\rangle^2 \beta\gamma^2 + \langle\alpha\rangle^2 \beta \sum_{j=1}^{Ns} \{\Delta Hcoma, 5s, j(5) \cdot Is^{(2)}, j\} = 0 \quad (11)$$

$$Mfc(5) \cdot \alpha\gamma^2\langle\gamma\rangle^2 + \alpha\gamma\langle\gamma\rangle \sum_{j=1}^{Nc} \{\Delta Mfc, c, j(5) \cdot Ic^{(2)}, j\} + \quad (12)$$
$$\alpha\gamma^2 \sum_{j=1}^{Ns} \{\Delta Mfc, s1, j(5) \cdot \langle Is^{(2)}, j\rangle\} +$$
$$\alpha\langle\gamma\rangle^2 \sum_{j=1}^{Ns} \{\Delta Mfc, s2, j(5) \cdot Is^{(2)}, j\} +$$
$$\alpha \sum_{j=1}^{Nc} \{\Delta Mfc, c, j(3) \cdot Ic^{(4)}, j\} = 0$$

$$Hfc, 1(5) \cdot \alpha\langle\beta\rangle\gamma^2\langle\gamma\rangle + \alpha\langle\beta\rangle\gamma \sum_{j=1}^{Nc} \{\Delta Hfc, 1c, j(5) \cdot Ic^{(2)}, j\} + \quad (13)$$
$$\alpha\langle\beta\rangle\langle\gamma\rangle \sum_{j=1}^{Ns} \{\Delta Hfc, 1s, j(5) \cdot Is^{(2)}, j\} = 0$$

$$Hfc, 2(5) \cdot \alpha\beta\gamma\langle\gamma\rangle^2 + \alpha\beta\langle\gamma\rangle \sum_{j=1}^{Nc} \{\Delta Hfc, 2c, j(5) \cdot Ic^{(2)}, j\} + \quad (14)$$
$$\alpha\beta\gamma \sum_{j=1}^{Ns} \{\Delta Hfc, 2s, j(5) \cdot \langle Is^{(2)}, j\rangle\} = 0$$

$$Hfc, 3(5) \cdot \alpha\langle\beta\rangle^2 \gamma^2 + \alpha\langle\beta\rangle^2 \sum_{j=1}^{Ns} \{\Delta Hfc, 3s, j(5) \cdot Is^{(2)}, j\} = 0 \quad (15)$$

$$Hfc, 4(5) \cdot \alpha\beta\langle\beta\rangle\gamma\langle\gamma\rangle + \alpha\beta\langle\beta\rangle \sum_{j=1}^{Nc} \{\Delta Hfc, 4c, j(5) \cdot Ic^{(2)}, j\} = 0 \quad (16)$$

$$Hfc, 5(5) \cdot \alpha\beta^2\langle\gamma\rangle^2 + \alpha\beta^2 \sum_{j=1}^{Ns} \{\Delta Hfc, 5s, j(5) \cdot \langle Is^{(2)}, j\rangle\} = 0 \quad (17)$$

$$Mas(5) \cdot \langle\alpha\rangle\gamma^3\langle\gamma\rangle + \langle\alpha\rangle\gamma^2 \sum_{j=1}^{Nc} \{\Delta Mas, c, j(5) \cdot Ic^{(2)}, j\} + \quad (18)$$
$$\langle\alpha\rangle\gamma\langle\gamma\rangle \sum_{j=1}^{Ns} \{\Delta Mas, s, j(5) \cdot Is^{(2)}, j\} +$$
$$\langle\alpha\rangle \sum_{j=1}^{Ns} \{\Delta Mas, s, j(3) \cdot Is^{(4)}, j\} = 0$$

$$Has, 1(5) \cdot \langle\alpha\rangle\langle\beta\rangle\gamma^3 + \langle\alpha\rangle\langle\beta\rangle\gamma \sum_{j=1}^{Ns} \{\Delta Has, 1s, j(5) \cdot Is^{(2)}, j\} = 0 \quad (19)$$

$$Has, 2(5) \cdot \langle\alpha\rangle\beta\gamma^2\langle\gamma\rangle + \langle\alpha\rangle\beta\gamma \sum_{j=1}^{Nc} \{\Delta Has, 2c, j(5) \cdot Ic^{(2)}, j\} + \quad (20)$$
$$\langle\alpha\rangle\beta\langle\gamma\rangle \sum_{j=1}^{Ns} \{\Delta Has, 2s, j(5) \cdot Is^{(2)}, j\} = 0$$

$$Has, 3(5) \cdot \langle\alpha\rangle\langle\beta\rangle\gamma^2 + \langle\alpha\rangle\langle\beta\rangle \sum_{j=1}^{Ns} \{\Delta Has, 3s, j(5) \cdot Is^{(2)}, j\} = 0 \quad (21)$$

$$Has, 4(5) \cdot \langle\alpha\rangle\beta^2\gamma\langle\gamma\rangle + \langle\alpha\rangle\beta^2 \sum_{j=1}^{Nc} \{\Delta Has, 4c, j(5) \cdot Ic^{(2)}, j\} = 0 \quad (22)$$

$$Mdis(5) \cdot \gamma^3\langle\gamma\rangle^2 + \gamma^2\langle\gamma\rangle \sum_{j=1}^{Nc} \{\Delta Mdis, c, j(5) \cdot Ic^{(2)}, j\} + \quad (23)$$
$$\gamma^3 \sum_{j=1}^{Ns} \{\Delta Mdis, s1, j(5) \cdot \langle Is^{(2)}, j\rangle\} +$$
$$\gamma\langle\gamma\rangle^2 \sum_{j=1}^{Ns} \{\Delta Mdis, s2, j(5) \cdot Is^{(2)}, j\} +$$
$$\gamma \sum_{j=1}^{Nc} \{\Delta Mdis, c, j(3) \cdot Ic^{(4)}, j\} +$$
$$\langle\gamma\rangle \sum_{j=1}^{Ns} \{\Delta Mdis, s, j(3) \cdot Is^{(4)}, j\} = 0$$

$$Hdis, 1(5) \cdot \langle\beta\rangle\gamma^3\langle\gamma\rangle + \langle\beta\rangle\gamma^2 \sum_{j=1}^{Nc} \{\Delta Hdis, 1c, j(5) \cdot Ic^{(2)}, j\} + \quad (24)$$
$$\langle\beta\rangle\gamma\langle\gamma\rangle \sum_{j=1}^{Ns} \{\Delta Hdis, 1s, j(5) \cdot Is^{(2)}, j\} +$$
$$\langle\beta\rangle \sum_{j=1}^{Ns} \{\Delta Hdis, s, j(3) \cdot Is^{(4)}, j\} = 0$$

$$Hdis, 2(5) \cdot \beta\gamma^2\langle\gamma\rangle^2 + \beta\gamma\langle\gamma\rangle \sum_{j=1}^{Nc} \{\Delta Hdis, 2c, j(5) \cdot Ic^{(2)}, j\} + \quad (25)$$
$$\beta\gamma^2 \sum_{j=1}^{Ns} \{\Delta Hdis, 2s1, j(5) \cdot \langle Is^{(2)}, j\rangle\} +$$
$$\beta\langle\gamma\rangle^2 \sum_{j=1}^{Ns} \{\Delta Hdis, 2s2, j(5) \cdot Is^{(2)}, j\} +$$
$$\langle\beta\rangle \sum_{j=1}^{Nc} \{\Delta Hdis, c, j(3) \cdot Ic^{(4)}, j\} = 0$$

$$Hdis, 3(5) \cdot \langle\beta\rangle^2\gamma^3 + \langle\beta\rangle^2\gamma \sum_{j=1}^{Ns} \{\Delta Hdis, 3s, j(5) \cdot Is^{(2)}, j\} = 0 \quad (26)$$

$$Hdis, 4(5) \cdot \beta\langle\beta\rangle\gamma^2\langle\gamma\rangle + \beta\langle\beta\rangle\gamma \sum_{j=1}^{Nc} \{\Delta Hdis, 4c, j(5) \cdot Ic^{(2)}, j\} + \quad (27)$$
$$\beta\langle\beta\rangle\langle\gamma\rangle \sum_{j=1}^{Ns} \{\Delta Hdis, 4s, j(5) \cdot Is^{(2)}, j\} = 0$$

$$Hdis, 5(5) \cdot \beta^2\gamma\langle\gamma\rangle^2 + \beta^2\langle\gamma\rangle \sum_{j=1}^{Nc} \{\Delta Hdis, 5c, j(5) \cdot Ic^{(2)}, j\} + \quad (28)$$
$$\beta^2\gamma \sum_{j=1}^{Ns} \{\Delta Hdis, 5s, j(5) \cdot \langle Is^{(2)}, j\rangle\} = 0$$

$$Hdis, 6(5) \cdot \beta^3\langle\gamma\rangle^2 + \beta^3 \sum_{j=1}^{Ns} \{\Delta Hdis, 6s, j(5) \cdot \langle Is^{(2)}, j\rangle\} = 0 \quad (29)$$

$$Hdis, 7(5) \cdot \beta^2\langle\beta\rangle\gamma\langle\gamma\rangle + \beta^2\langle\beta\rangle \sum_{j=1}^{Nc} \{\Delta Hdis, 7c, j(5) \cdot Ic^{(2)}, j\} = 0 \quad (30)$$

-continued $$Hdis, 8(5) \cdot \beta \langle \beta \rangle^2 \gamma^2 + \beta \langle \beta \rangle^2 \sum_{j=1}^{Ns} \{\Delta Hdis, 8s, j(5) \cdot Is^{(2)}, j\} = 0 \quad (31)$$

In Equation Set 2-2, equations (1)–(3) pertain to intrinsic 5th-order aberrations, equations (4)–(6) pertain to deflection coma, equations (7)–(11) pertain to hybrid deflection coma, equation (12) pertains to deflection field curvature, equations (12)–(17) pertain to hybrid deflection field curvature, equation (18) pertains to deflection astigmatism, equations (19)–(22) pertain to hybrid deflection astigmatism, equation (23) pertains to deflection distortion, and equations (24)–(31) pertain to hybrid deflection distortion. The first term on the left-hand side of each of the equations of Equation Set 2-2 represents an aberration generated by the projection lenses 105, 106 and deflectors 108. The remaining terms on the left-hand side are aberration-correction terms produced by the focus-correction coils 109 and the astigmatism compensator 110. Equation Set 2-2 involves complex numbers and can be written as a set of equations involving only real numbers, corresponding to the real and imaginary parts of each of the equations of Equation Set 2-2. The parameters of Equation Set 2-2 are summarized in Table 2-3.

TABLE 2-3

Fifth-order Aberrations.

| | |
|---|---|
| Mx,1(5)-Mx,3(5) | coefficients of the |
| Mcoma,1(5)-Mcoma,3(5) | 5th-order |
| Hcoma,1(5)-Hcoma,5(5) | aberrations |
| Mfc(5) | |
| Hfc,1(5)-Hfc,5(5) | |
| Mas(5) | |
| Has,1(5)-Has,4(5) | |
| Mdis(5) | |
| Hdis,1(5)-Hdis,8(5) | |
| ΔMx,2c,j(5) | 5th-order |
| ΔMcoma,1c,h(5), ΔMcoma,2c,j(5) | aberration |
| ΔHcoma,1c,j(5), ΔHcoma,4c,j(5) | correction |
| ΔMfc,c,j(5) | coefficients for |
| ΔHfc,1c,j(5), ΔHfc,2c,j(5), ΔHfc,4c,j(5) | the 5th-order |
| ΔMas,c,j(5) | aberrations for the |
| ΔHas,2c,j(5), ΔHas,4c,j(5) | focus-correction |
| ΔMdis,c,j(5) | coils |
| ΔHdis,1c,j(5), ΔHdis,2c,j(5), ΔHdis,4c,j(5) | |
| ΔHdis,5c,j(5), ΔHdis,7c,j(5) | |
| ΔMx,1s,j(5), ΔMx,3s,j(5) | 5th-order |
| ΔMcoma,1s,j(5)-ΔMcoma,3s,j(5) | aberration |
| ΔHcoma,2s,j(5), ΔHcoma,3s,j(5) | correction |
| ΔHcoma,5s,j(5) | coefficients for |
| ΔMfc,s1,j(5), ΔMfc,s2,j(5) | the 5th-order |
| ΔHfc,1s,j(5), ΔHfc,2s,j(5), ΔHfc,3s,j(5) | aberrations for the |
| ΔHfc,5s,j(5) | astigmatism |
| ΔMas,s,j(5) | compensators |
| ΔHas,1s,j(5)-ΔHas,3s,j(5) | |
| ΔMdis,s1,j(5), ΔMdis,s2,j(5) | |
| ΔHdis,1s,j(5), ΔHdis,2s1,j(5) ΔHdis,2s2,j(5) | |
| ΔHdis,3s,j(5)-ΔHdis,6s,j(5) | |
| ΔHdis,8s,j(5) | |

The correction of 5th-order aberrations with the dynamic correction system is carried out by providing currents proportional to the square of the deflection (i.e., γ<γ>) to the various compensators. The currents related to the 3rd-order aberration correction coefficients Mfc,c,j(3); Mas,s,j(3); <Mas,s,j(3)>; Mdis,c,j(3); <Mdis,c,j(3)>; Mdis,s,j(3); <Mdis,s,j(3)>; Hdis,c,j(3); <Hdis,c,j(3)>; Hdis,s,j(3); and <Hdis,s,j(3)> in Equation Set 2-2 are proportional to the 4th power of the deflection (γ²<γ>²) and can be written as:

$$Ic^{(4)}j = C4, j\gamma^2 \langle \Upsilon \rangle^2 \quad (j = 1, \ldots, Nc)$$

$$Ic^{(4)}, j = S4, j\gamma^3 \langle \Upsilon \rangle \quad (j = 1, \ldots, Ns)$$

wherein C4,j, S4,j are proportionality constants; C4,j is a real number; and S4,j is a complex number.

The 3rd-order aberration-correction coefficients ΔMfc,c,j(3); ΔMas,s,j(3); ΔMdis,c,j(3); ΔMdis,s,j(3); ΔHdis,s,j(3); and ΔHdis,c,j(3) used to correct the 5th-order aberrations corresponding to Mfc(5), Mas(5), Mdis(5), Hdis,1(5), Hdis,2(5) are the same coefficients used to correct 3rd-order aberrations. Therefore, 3rd-order aberrations and 5th-order aberrations can be corrected using common compensators.

For example, consider the correction of 3rd-order deflection distortion and 5th-order deflection distortion. At least two focus-correction coils or one astigmatism compensator are required to correct 3rd-order deflection distortion. If two focus-correction coils are used, then the respective currents Ic(2),1, Ic(2),2 are:

$$Ic(2),1 = C2,1\, \gamma \langle \gamma \rangle$$

$$Ic(2),2 = C2,2\, \gamma \langle \gamma \rangle$$

In addition, 5th-order deflection distortion can be corrected with two focus-correction coils. The correction can be carried out using the second term of equation (23) of Equation Set 2-2; however, in this example the fifth term is used. The respective currents Ic$^{(4)}$,1 and Ic$^{(4)}$,2 for the focus-correction coils for the correction of 5th-order deflection distortion are:

$$Ic^{(4)},1 = C4, \gamma \langle \gamma \rangle^2$$

$$Ic^{(4)},2 = C4, \gamma^2 \langle \gamma \rangle^2$$

Consequently, the correction of both 3rd-order deflection distortion and 5th-order deflection distortion using two focus-correction coils requires currents that are given by:

$$Ic,1 = Ic^{(2)},1 + Ic^{(4)},1 = C2,1\gamma\langle\gamma\rangle + C4,1\gamma\langle\gamma\rangle^2$$

$$Ic,2 = Ic^{(2)},2 + Ic^{(4)},2 = C2,2\gamma\langle\gamma\rangle + C4,2\gamma\langle\gamma\rangle^2$$

wherein C2,j; C4,j; S2,j; and S4,j are proportionately constants, C2,j and C4,j are real, and S2,j and S4,j are complex.

The number of compensators required for dynamic correction systems for 5th-order aberrations is listed in Table 2-4. The number of dynamic compensators for the correction of 3rd-order aberrations is also included in Table 2-4.

TABLE 2-4

| No. | Aberration | No. of Astigmatism Compensators | No. of Focus-correction Coils | No. | Aberration | No. of Astigmatism Compensators | No. of Focus-correction Coils |
|---|---|---|---|---|---|---|---|
| 1 | $M_{x,1}(5)\alpha^3<\gamma>^2$ | 1 | 0 | 24 | $M_{as}(5)<\alpha>\gamma^3<\gamma>$ | 1 | 0 |
| 2 | $M_{x,2}(5)\alpha^2<\alpha>\gamma<\gamma>$ | 0 | 2 | 25 | $H_{as,1}(5)\alpha^2<\alpha><\beta>\gamma^3$ | 1 | 0 |
| 3 | $M_{x,3}(5)\alpha<\alpha>^2\gamma^2$ | 1 | 0 | 26 | $H_{as,2}(5)<\alpha>\beta\gamma^2<\gamma>$ | 1 | 0 |
| 4 | $M_{coma,1}(5)\alpha^2\gamma<\gamma>^2$ | 1 | 0 | 27 | $H_{as,2}(5)<\alpha>\beta\gamma^2<\gamma>$ | 0 | 2 |
| 5 | $M_{coma,1}(5)\alpha^2\gamma<\gamma>^2$ | 0 | 2 | 28 | $H_{as,3}(5)<\alpha>\beta<\beta>\gamma^2$ | 1 | 0 |
| 6 | $M_{coma,2}(5)\alpha<\alpha>\gamma^2<\gamma>$ | 1 | 0 | 29 | $H_{as,4}(5)<\alpha>\beta^2\gamma<\gamma>$ | 0 | 2 |
| 7 | $M_{coma,2}(5)\alpha<\alpha>\gamma^2<\gamma>$ | 0 | 2 | 30 | $M_{dis}(3)\gamma^2<\gamma>$ | 1 | 0 |
| 8 | $M_{coma,3}(5)<\alpha>^2\gamma^3$ | 1 | 0 | 31 | $M_{dis}(3)\gamma^2<\gamma>$ | 0 | 2 |
| 9 | $H_{coma,1}(5)\alpha^2<\beta>\gamma<\gamma>$ | 0 | 2 | 32 | $M_{dis}(5)\gamma^3<\gamma>^2$ | 1 | 0 |
| 10 | $H_{coma,2}(5)\alpha^2\beta<\gamma>^2$ | 1 | 0 | 33 | $M_{dis}(5)\gamma^3<\gamma>^2$ | 0 | 2 |
| 11 | $H_{coma,3}(5)\alpha<\alpha><\beta>\gamma^2$ | 1 | 0 | 34 | $H_{dis,2}(3)<\beta>\gamma^2$ | 1 | 0 |
| 12 | $H_{coma,4}(5)\alpha<\alpha>\beta\gamma<\gamma>$ | 0 | 2 | 35 | $H_{dis,1}(5)<\beta>\gamma^3<\gamma>$ | 1 | 0 |
| 13 | $H_{coma,5}(5)<\alpha>^2\beta\gamma^2$ | 1 | 0 | 36 | $H_{dis,1}(3)\beta\gamma<\gamma>$ | 0 | 2 |
| 14 | $M_{fc}(3)\alpha\gamma<\gamma>$ | 0 | 1 | 37 | $H_{dis,2}(5)\beta\gamma^2<\gamma>^2$ | 0 | 2 |
| 15 | $M_{fc}(5)\alpha\gamma^2<\gamma>^2$ | 0 | 1 | 38 | $H_{dis,3}(5)<\beta>^2\gamma^3$ | 1 | 0 |
| 16 | $H_{fc,1}(5)\alpha<\beta>\gamma^2<\gamma>$ | 1 | 0 | 39 | $H_{dis,4}(5)\beta<\beta>\gamma^2<\gamma>$ | 1 | 0 |
| 17 | $H_{fc,1}(5)\alpha<\beta>\gamma^2<\gamma>$ | 0 | 2 | 40 | $H_{dis,4}(5)\beta<\beta>\gamma^2<\gamma>$ | 0 | 2 |
| 18 | $H_{fc,2}(5)\alpha\beta\gamma<\gamma>^2$ | 1 | 0 | 41 | $H_{dis,5}(5)\beta^2\gamma<\gamma>^2$ | 1 | 0 |
| 19 | $H_{fc,2}(5)\alpha\beta\gamma<\gamma>^2$ | 0 | 2 | 42 | $H_{dis,5}(5)\beta^2\gamma<\gamma>^2$ | 0 | 2 |
| 20 | $H_{fc,3}(5)\alpha<\beta>^2\gamma^2$ | 1 | 0 | 43 | $H_{dis,6}(5)\beta^3<\gamma>^2$ | 1 | 0 |
| 21 | $H_{fc,4}(5)\alpha\beta<\beta>\gamma<\gamma>$ | 0 | 2 | 44 | $H_{dis,7}(5)\beta^2<\beta>\gamma<\gamma>$ | 0 | 2 |
| 22 | $H_{fc,5}(5)\alpha\beta^2<\gamma>^2$ | 1 | 0 | 45 | $H_{dis,8}(5)\beta<\beta>^2\gamma^2$ | 1 | 0 |
| 23 | $M_{as}(3)<\alpha>\gamma^2$ | 1 | 0 | | | | |

The 5th-order field curvature coefficient Mfc(5) is expressed as a complex number. But, since the terms for some of the aberrations that occur in practice are real numbers, they can be corrected with at least one focus-correction coil. In addition, when correcting 5th-order aberrations, in most cases, the same dynamic compensators can be used since they also correct 3rd-order aberrations. As shown in Table 2-4, the aberration proportional to Hfc,1(5) (shown as No. 16 and No. 17 in Table 2-4) can be corrected using one astigmatism compensator or two focus-correction coils.

To correct 3rd-order and 5th-order aberrations, equations in Equation Set 2-2 for 3rd-order aberrations and equations in Equation Set 2-2 for 5th-order aberrations are solved for the currents $Ic^{(2)},j$; $Ic^{(4)},j$; $Is^{(2)},j$; $Is^{(4)},j$. The results are stored in the memory 115. During exposure, the controller 116 reads current data from the memory 115 according to the deflection and adjusts the currents to the focus-correction coils 9 and the astigmatism compensators 10.

By adjusting the currents to the focus-correction coils 109 and the astigmatism compensators 110, the 3rd-order and 5th-order aberrations proportional to the square and higher powers of the deflection γ are corrected. In addition, even if the calculated aberrations and the actual aberrations differ due to fabrication errors and/or assembly errors, the aberration change is easily corrected by adjusting the currents Ic,j and Is,j.

The γ-dependence of the aberrations can be made explicitly by defining functions of γ, <γ>. The aberrations to be corrected are described as:

Equation Set 2-3

$f(\gamma,<\gamma>)$ $f_i(\gamma,<\gamma>)\cdot X_i$ $f_{i,j}(\gamma,<\gamma>)\cdot X_i X_j$ $f_{i,j,k}(\gamma,<\gamma>)\cdot X_i X_j X_k$ The functions f, $f_i$, $f_{i,j}$, and $f_{i,j,k}$ are functions of the deflection γ and its complex conjugate <γ>. Also, X1=α, X2=<α>, X3=β, and X4=<β>. In addition, i, j, and k are integers from 1 to 4 that fulfill the condition $i \geq j \geq k$, except for (i,j,k)=(2, 2,2), (4,2,2), (4,4,2), or (4,4,4). Using these definitions, the currents applied to the coils and lenses of the dynamic correction system are not necessarily proportional to the 2nd or 4th power of the deflection γ, <γ> as in Equation Sets 2-1 and 2-2, and the aberrations can be sufficiently canceled by modifying them as functions of the deflection γ according to Equation Set 2-3. In practice, the dynamic correction system is constructed to reduce only the most significant aberrations.

Several exemplary dynamic correction systems with different numbers of focus-correction coils and astigmatism compensators are described.

Example 2-1.

If the dynamic correction system comprises six focus-correction coils and seven astigmatism compensators, then 3rd-order deflection plane distortion (Mfc(3)), deflection astigmatism (Mas(3)), and hybrid distortion (Hdis,1(3), Hdis,2(3)); and 5th-order deflection field curvature (Mfc (5)), deflection astigmatism (Mas(5)), and hybrid distortion (Hdis,1(5), Hdis,2(5)) can be corrected. The currents for the focus-correction coils and the astigmatism compensators are determined from Equation Set 2-1 (specifically, equations (1), (2), (4), and (5)) and Equation Set 2-2 (specifically, equations (12), (18), and (23)–(31)).

The equations containing the 3rd-order aberration-correction coefficients (equations (18) and (23)–(25) of Equation Set 2-2) can be solved exactly as equations with a term involving the 4th power of γ without introducing any additional focus-correction coils or astigmatism compensators. In addition, equation (14) of Equation Set 2-2 can be neglected because the corresponding aberration is small.

Example 2-2

If the dynamic correction system comprises four focus-correction coils and five astigmatism compensators, then 3rd-order deflection field curvature (Mfc(3)), deflection astigmatism (Mas(3)), and hybrid distortion (Hdis,1(3), Hdis,2(3)); and 5th-order deflection field curvature (Mfc (5)), deflection astigmatism (Mas(5)), and hybrid distortion (Hdis,1(5)–Hdis,5(5)) can be corrected. The currents for the various focus-correction coils and astigmatism compensators are determined by equations (1)–(2), (4), and (5) of Equation Set 2-1, and equations (12), (18), and (24)–(28) of Equation Set 2-2.

Example 2-3

If the dynamic correction system comprises four focus-correction coils and nine astigmatism compensators, then 3rd-order deflection field curvature (Mfc(3)), deflection astigmatism (Mas(3)), and hybrid distortion (Hdis,1(3), Hdis,2(3)); and 5th-order deflection field curvature (Mfc (5)), hybrid field curvature (Hfc,1(5), Hfc,2(5)), deflection astigmatism (Mas(5)), hybrid astigmatism (Has,1(5), Has,2 (5)), and hybrid distortion (Hdis,1(5)–Hdis,5(5)) can be corrected. The currents for the focus-correction coils and astigmatism compensators are determined by equations (1), (2), (4), and (5) of Equation Set 2-1 and equations (12)–(15), (18)–(20), and (24)–(28) of Equation Set 2-2.

Example 2-4

If the dynamic correction system comprises four focus-correction coils and twelve astigmatism compensators, then 3rd-order deflection field curvature (Mfc(3)), deflection astigmatism (Mas(3)), and hybrid distortion (Hdis,1(3), Hdis,2(3)); and 5th-order deflection coma (Mcoma,1(5)-Mcoma,3(5)), deflection field curvature (Mfc(5)), hybrid field curvature (Hfc,1(5), Hfc,2(5)), deflection astigmatism (Mas(5)), hybrid astigmatism (Has,1(5), Has,2(5)), and hybrid distortion (Hdis,1(5)-Hdis,5(5)) can be corrected. The currents are determined by equations (1)–(2) and (4)–(5) of Equation Set 2-1, and equations (4)–(6), (12)–(15), (18)–(20), and (24)–(28) of Equation Set 2-2.

Example 2-5

With reference to FIG. 1, a dynamic correction system comprises three focus-correction coils and three astigmatism compensators and corrects 3rd-order deflection field curvature (Mfc(3)), deflection astigmatism (Mas(3)), deflection distortion (Mdis(3)), and hybrid distortion (Hdis,1(3), Hdis, 2(3)). The currents are determined by equations (4)–(5) of Equation Set 2-1, and equations (1)–(3) of Equation Set 2-2. The solution to these equations can be written as:

$$[I] = -G^{-1} \cdot \{M\}$$

where [I] is the column vector (Ic,1, Ic,2, Ic,3, Is,1, <Is,1>, Is,2, <Is,2>, Is,3, <Is,3>); {M} is the column vector (Mfc(3) $\alpha\gamma<\gamma>$, Mas(3) $<\alpha>\gamma^2$, Mas(3) $\alpha<\gamma>^2$, Mdis(3) $\gamma^2<\gamma>$, Mdis (3) $<\gamma>^2\gamma$, Hdis,1(3) $\beta\gamma<\gamma>$, <Hdis,1(3)><$\beta$><$\gamma$>$\gamma$, Hdis,2(3) <$\beta$>$\gamma^2$, <Hdis,2(3)>$\beta$<$\gamma$>$^2$) ; and $G^{-1}$ is the inverse matrix of a nine row by nine column matrix G, wherein:

$G1,j=\alpha Mfc,c,j(3)$, $G1,j+3=G1,j+6=0$ $G2,2+2j=<\alpha>Mas,s,j(3)$, $G2,j=G2,3+2j=0$ $G3,3+2j=<G2,2+2j>$, $G3,j=G3,2+2j=0$ $G4,j=\gamma\Delta Mdis,c,j(3)$, $G4,2+2j=\gamma\Delta Mdis,s,j(3)$, $G4,3+2k=0$ $G5,j=<G4,j>$, $G5,3+2j=<G4,2+2j>$, $G5,2+2j=0$ $G6,j=\beta\Delta Hdis1c,j(3)$, $G6,j+3=G6,j+6=0$ $G7,j=<G6,j>$, $G7,j+3=G7,j+6=0$ $G8,2+2j=<\beta>\Delta Hdis,2s,j(3)$, $G8,j=G8,3+2j=0$ $G9,3+2j=<G8,2+2j>$, $G9,j=G9,2+2j=0$ wherein $1 \leq j \leq 3$.

The aberrations at the edges of a 10-mm deflection field for a reticle-wafer distance of 400 mm, electron beam aperture half-angle $\alpha$=6 mrad, subfield size of 250 μm, and electron-beam acceleration voltage of 100 kV, associated with (Mfc(3), Mas(3), Mdij(3), Hdis,1(3), and Hdis,2(3)) are corrected by dynamic correction as has been calculated.

Figure 14A:
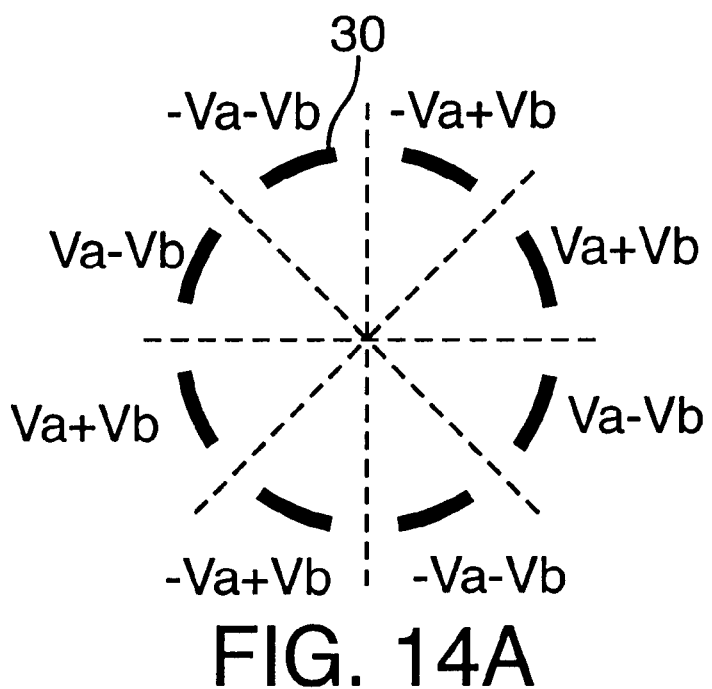
FIGS. 14A–14B are schematic views of an electrostatic astigmatism compensator as used in a CPB pattern-transfer apparatus according to the invention.
Figure 14B:
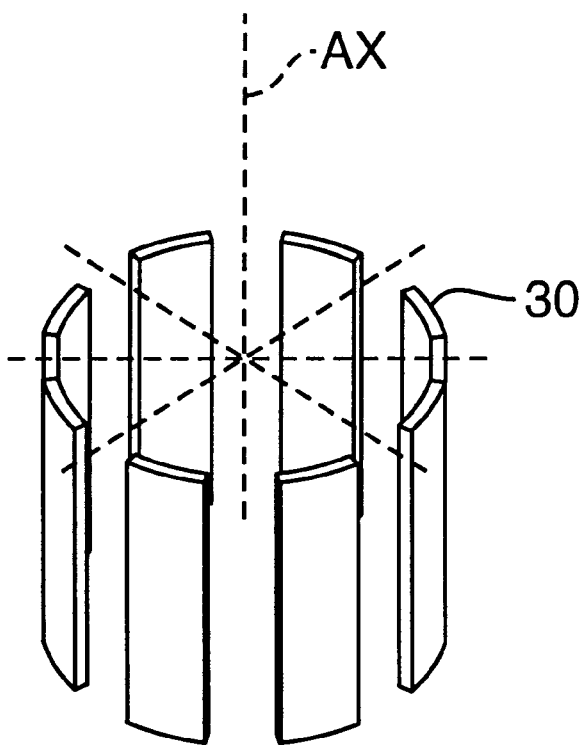

The dynamic correcting systems of the example embodiments are constructed with magnetic focus-correction coils and astigmatism compensators but electrostatic focus correctors and astigmatism compensators can be used. In the latter case, voltages V are substituted for the currents in equations, such as in Equation Sets 2-1, 2-2. With reference to FIGS. 14A–14B, an electrostatic astigmatism compensator comprises eight electrodes 30 driven by voltages (±Va, ±Vb) as indicated. The applied voltages can be expressed as a complex voltage Vs=Va+iVb.

Example Embodiment 3

In Example Embodiment 3, rotation, magnification, and focus errors are corrected in a CPB pattern-transfer apparatus according to the invention, and the aberrations generated in conjunction with these corrections are, in turn, corrected by providing $n \geq 4$ correcting lenses and adjusting these lenses. First, correction of rotation, magnification, and focus-position errors with n independent correcting lenses $L_1, \ldots, L_n$ is described.

Rotation, magnification and focus-error corrections $\Delta\theta$, $\Delta m$, and $\Delta z$ can be estimated using Equation Set 3-1, where $I_1, \ldots, I_n$ are currents in respective correction lenses $L_1, \ldots, L_n$, and a (1,j), a(2,j), a(3,j) are quantities that characterize the lens $L_j$:

Equation Set 3-1

$$\Delta\theta=a(1,1)I_1+a(1,2)I_2+\ldots+a(1,n)I_n \quad (1)$$

$$\Delta m=a(2,1)I_1+a(2,2)I_2+\ldots+a(2,n)I_n \quad (2)$$

$$\Delta z=a(3,1)I_1+a(3,2)I_2+\ldots+a(3,n)I_n \quad (3)$$

The corrections $\Delta\theta$, $\Delta m$, $\Delta z$ are dependent upon the currents $I_1, \ldots, I_n$.

Rotation, magnification, and focus errors can be independently corrected with three correcting lenses (n=3) with currents $I_1$, $I_2$, $I_3$ uniquely determined by Equation Set 3-1. If n>3, the currents $I_1$, $I_2$, $I_3$ are not uniquely determined so that rotation, magnification, and focus errors can be corrected with three correcting lenses, while aberration correction is performed with the remaining (n−3) correcting lenses.

The aberrations introduced by the n correcting lenses $L_1, \ldots, L_n$ having respective currents $I_1, \ldots, I_n$, are listed in Equation Set 3-2, below. Only deflection field curvature, $\Delta$Mfc, deflection astigmatism, $\Delta$Mas, deflection distortion, $\Delta$Mdi, and components of the hybrid distortion proportional to the square of the deflection amplitude, $\Delta$Hdis1, $\Delta$Hdis2, are included:

Equation Set 3-2

$$\Delta Mfc = \Delta Mfc1 I_1 + \Delta Mfc2 I_2 + \ldots + \Delta Mfcn I_n \quad (1)$$

$$\Delta Mas = \Delta Mas1 I_1 + \Delta Mas2 I_2 + \ldots + \Delta Masn I_n \quad (2)$$

$$\Delta Mdis = \Delta Mdis1 I_1 + \Delta Mdis2 I_2 + \ldots + \Delta Mdisn I_n \quad (3)$$

$$\Delta Hdis1 = \Delta Hdis1,1 I_1 + \Delta Hdis1,2 I_2 + \ldots + \Delta Hdis1,n I_n \quad (4)$$

$$\Delta Hdis2 = \Delta Hdis2,1 I_1 + \Delta Hdis2,2 I_2 + \ldots + \Delta Hdis2,n I_n \quad (5)$$

In Equation Set 3-2, the coefficients $\Delta Mfc1, \ldots, \Delta Mfcn$ are real numbers and the coefficients involving $\Delta Mas$, $\Delta Mdis$, $\Delta Hdis1$, and $\Delta Hdis2$ are complex numbers. If Equation Set 3-2 is written in terms of real numbers, nine equations are obtained.

The currents $I_1, \ldots, I_n$ are adjusted to satisfy Equation Set 3-2. The rotation, magnification, and focus errors of the subfield image are eliminated while suppressing the generation of additional aberrations by adjusting the currents $I_1, \ldots, I_n$ so that the correction amounts $\Delta\theta$, $\Delta m$, and $\Delta z$ are obtained and so that $\Delta Mfc=0$, $\Delta Mas=0$, $\Delta Mdis=0$, $\Delta Hdis1=0$, and $\Delta Hdis2=0$. This is done by solving Equation Set 3-3:

Equation Set 3-3

$$\Delta\theta = a(1,1)I_1 + a(1,2)I_2 + \ldots + a(1,n)I_n \quad (1)$$

$$\Delta m = a(2,1)I_1 + a(2,2)I_2 + \ldots + a(2,n)I_n \quad (2)$$

$$\Delta z = a(3,1)I_1 + a(3,2)I_2 + \ldots + a(3,n)I_n \quad (3)$$

$$0 = \Delta Mfc = \Delta Mfc1 I_1 + \Delta Mfc2 I_2 + \ldots + \Delta Mfcn I_n \quad (4)$$

$$0 \Delta Mas = \Delta Mas1 I_1 + \Delta Mas2 I_2 + \ldots + \Delta Masn I_n \quad (5)$$

$$0 \Delta Mdis = \Delta Mdis1 I_1 + \Delta Mdis2 I_2 + \ldots + \Delta Mdisn I_n \quad (6)$$

$$0 \Delta Hdis1 = \Delta Hdis1,1 I_1 + \Delta Hdis1,2 I_2 + \ldots + \Delta Hdis1,n I_n \quad (7)$$

$$0 \Delta Hdis2 = \Delta Hdis2,1 I_1 + \Delta Hdis2,2 I_2 + \ldots + \Delta Hdis2,n I_n \quad (8)$$

Because Equation Set 3-3 involves twelve linear equations, selecting n=12 permits elimination of all the image errors. All of the aberrations need not be reduced to zero, but selection of aberrations to be reduced to zero can be determined according to the precision required in a particular application.

An exemplary correcting lens system is explained below in which hybrid distortion is eliminated while rotation, magnification, and focus errors are corrected. The currents $I_1, \ldots, I_n$ of the correcting lenses are adjusted to satisfy Equation Set 3-2. Since the coefficients that pertain to hybrid distortion are complex numbers, the coefficients are expressed using four equations in addition to equations for $\Delta\theta$, $\Delta m$, $\Delta z$:

Equation Set 3-4

$$\Delta\theta = a(1,1)I_1 + a(1,2)I_2 + \ldots + a(1,n)I_n$$

$$\Delta m = a(2,1)I_1 + a(2,2)I_2 + \ldots + a(2,n)I_n$$

$$\Delta z = a(3,1)I_1 + a(3,2)I_2 + \ldots + a(3,n)I_n$$

$$0 = \Delta Hd(1,1)I_1 + \Delta Hdis1,2 I_2 + \ldots + \Delta Hdis(1,n)I_n$$

$$0 = \Delta Hdis2,1 I_1 + \Delta Hdis2,2 I_2 + \ldots + \Delta Hdis2,n I_n$$

$$0 = \langle \Delta Hdis1,1 \rangle I_1 + \langle \Delta Hdis1,2 \rangle I_2 + \ldots + \langle \Delta Hdis1,n \rangle I_n$$

$$0 = \langle \Delta Hdis2,1 \rangle I_1 + \langle \Delta Hdis2,2 \rangle I_2 + \ldots + \langle \Delta Hdis2,n \rangle I_n$$

If the number of correcting lenses is n=7, then Equation Set 3-3 has a unique solution for the currents $I_n$. The solution can be expressed as:

$$\{I\} = G^{-1}\{\Delta\}$$

where $\{I\}$ is a column vector whose components are $(I_1, I_2, I_3, I_4, I_5, I_6, I_7)$; $\{\Delta\}$ is a column vector whose components are $(\Delta\theta, \Delta m, \Delta z, 0, 0, 0, 0)$; and $G^{-1}$ is the inverse of a 7×7 matrix G whose components $G_{ij}$ are:

$$G_{ij} = a(i,j) \text{ for } 1 < i < 3$$

$$G_{4j} = Hdis1,j$$

$$G_{5j} = Hdis2,j$$

$$G_{6j} = \langle Hdis1,j \rangle$$

$$G_{7j} = \langle Hdis2,j \rangle$$

where $1 < j < 7$.

Figure 15:
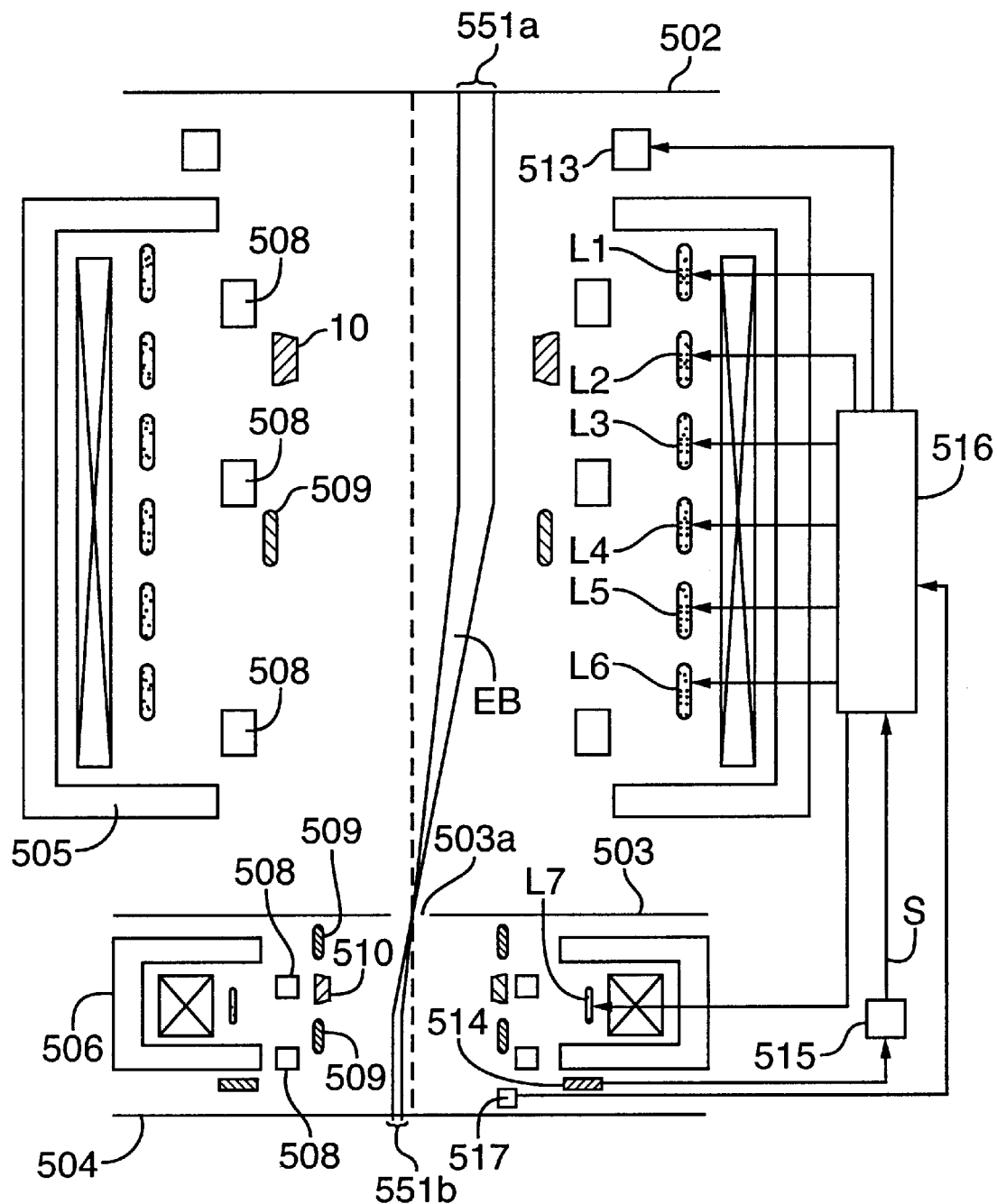
FIG. 15 is a schematic elevational view of a third representative embodiment of a CPB pattern-transfer apparatus according to the invention.

A CPB pattern-transfer apparatus according to this example embodiment in which rotation, magnification, focus-position errors, and hybrid distortion are corrected is shown in FIG. 15. A subfield 551a of a mask 502 is irradiated by an electron beam EB from an illumination optical system (not shown but understood to be located upstream of the mask 502). After transmission by the mask subfield 551a, projection lenses 505, 506 image the mask subfield 551a onto a corresponding transfer subfield 551b on a wafer 504. A deflector 508 deflects the electron beam EB from the subfield 551a to the transfer subfield 551b. Generally, the wafer 504 is sensitized by coating a surface of the wafer 504 with an electron-beam-sensitive resist. The electron beam EB transmitted by the mask 502 is directed through an aperture 503a of an aperture plate 503. A focus-correction coil 509 and an astigmatism compensator 510 are provided to reduce aberrations prior to error correction. Correcting lenses L1, L2, L3, L4, L5, L6, L7 are provided for correcting rotation, magnification, and focus errors as well as correcting the hybrid distortion generated by the correction of these errors. The correcting lenses $L_1, \ldots, L_7$ are controlled by a main control system 516 that controls the overall operation of the CPB apparatus. While seven correcting lenses are shown in FIG. 15, more or fewer correcting lenses can be provided.

An electron detector 514 detects electrons reflected from the wafer 504; the output of the electron detector 514 is processed by a signal processor 515, producing a reflected electron signal S that is supplied to the main control system 516. The rotational error and/or magnification error are found using the signal S. The height of the wafer 504 is measured using a height sensor 517 (also called an autofocus sensor).

Figure 16:
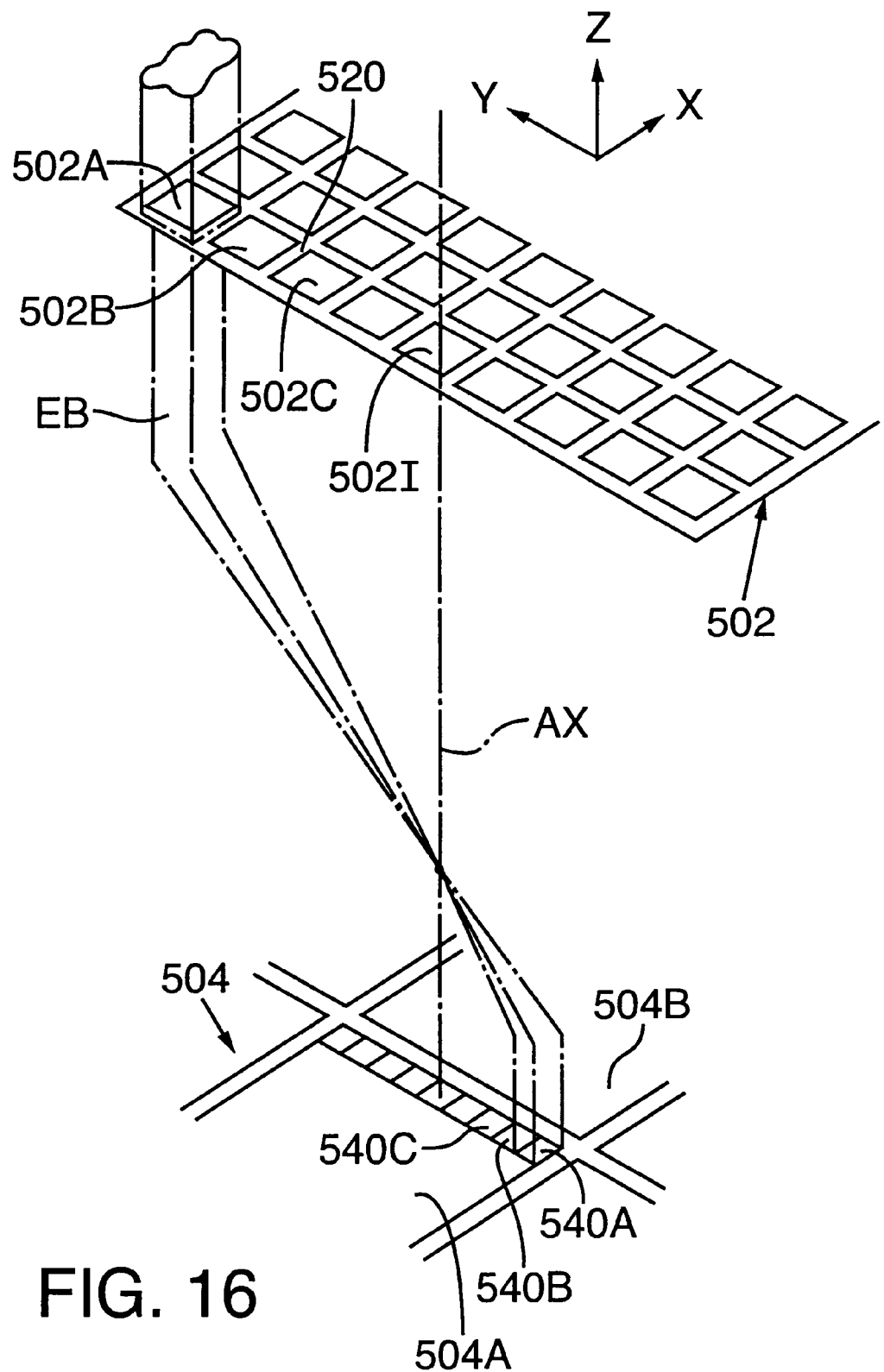
FIG. 16 is a perspective view illustrating sequential transfer of mask subfields using a CPB pattern-transfer apparatus according to the invention.

With reference to FIG. 16, the mask 502 is divided into a plurality of mask subfields 502A, 502B, 502C, that are sequentially irradiated by the electron beam EB. Images of each mask subfield are projected onto corresponding transfer subfields 540A, 540B, 540C, . . . within a chip field 504A. Because the mask subfields 502A, 502B, 502C, . . . are separated by a boundary field 520, the subfield images are joined on the wafer 504 by a deflector 513 that deflects the electron beam EB by an amount corresponding to the width of the boundary field 520. The mask 502 can be a so-called scattering mask or a stencil mask.

Figure 17A:
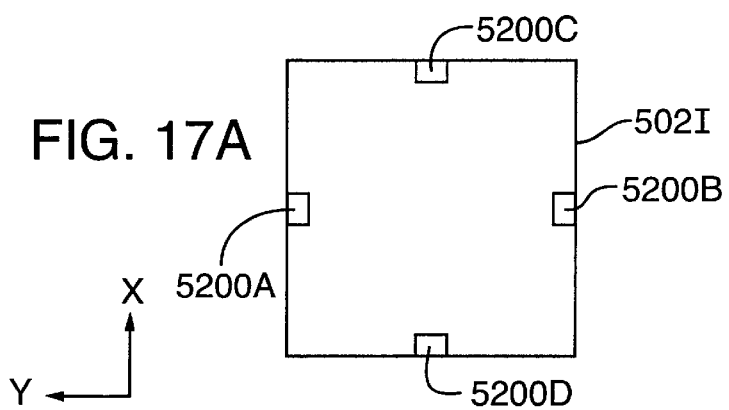
FIG. 17A is a schematic plan view of a representative arrangement of measurement marks on a mask.
Figure 17B:
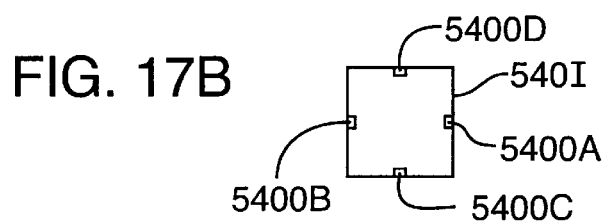
FIG. 17B is a schematic plan view of an image of the measurement marks of FIG. 17A.

The mask 502 also contains a subfield 502I. With reference to FIG. 17A, transparent measurement marks 5200A, 5200B, 5200C, 5200D are provided at the centers of each side of the mask subfield 502I to permit measurement of the magnification and rotational angle of the subfield image relative to a corresponding transfer subfield pattern 540I on the wafer 504. The subfield pattern 540I contains marks 5400A, 5400B, 5400C, 5400D, situated at the center of each side and corresponding to the marks 5200A–5200D of the mask subfield 502I. One pair of marks 5200A, 5200B is situated a specified distance apart along a line parallel to the Y axis, while another pair of marks 5200C, 5200D is situated a specified distance apart along a line parallel to the X-axis. Marks 5400A–5400D are either grooves or raised marks and can be coated with a thin film of a heavy metal.

As shown in FIG. 17A, marks 5200A–5200D contact respective sides of the mask subfield 502I, and each comprises a square through-hole. The electron beam EB irradiates the mask subfield 502I and the image is projected onto the transfer subfield 540I.

Figure 18A:
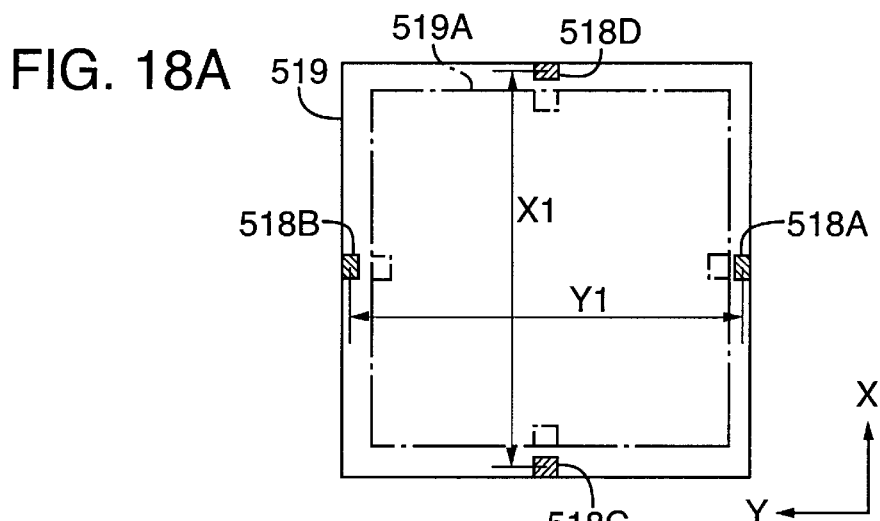
Figure 18B:
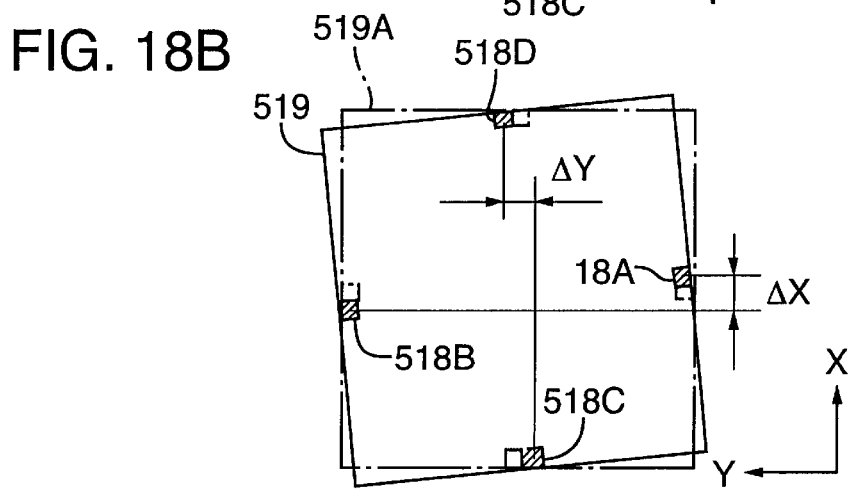
Figure 19A:
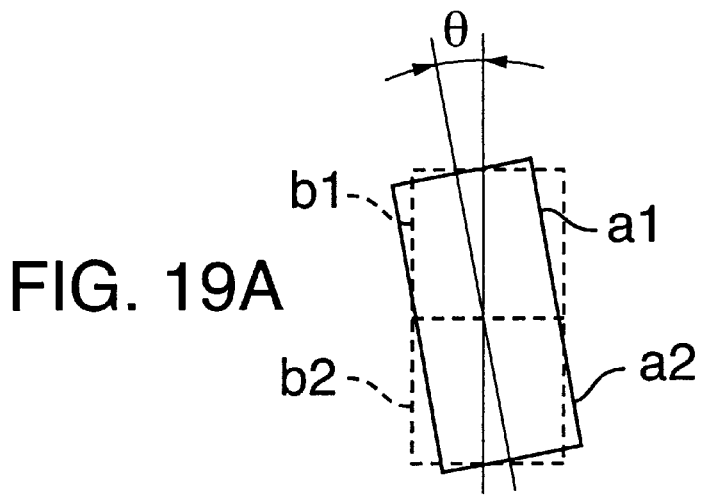
FIG. 19A is a schematic plan view of a subfield image exhibiting a rotational error.
Figure 19B:
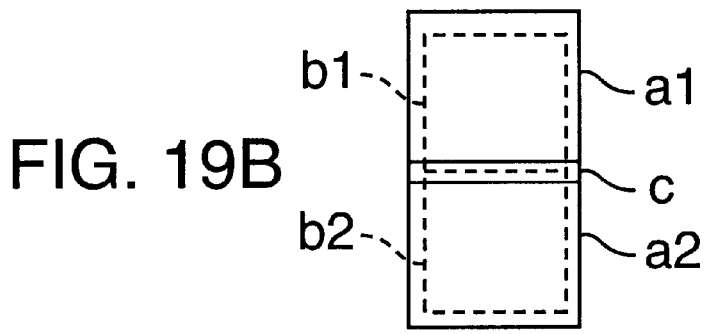
FIG. 19B is a schematic plan view of a subfield image exhibiting a magnification error.
Figure 19C:
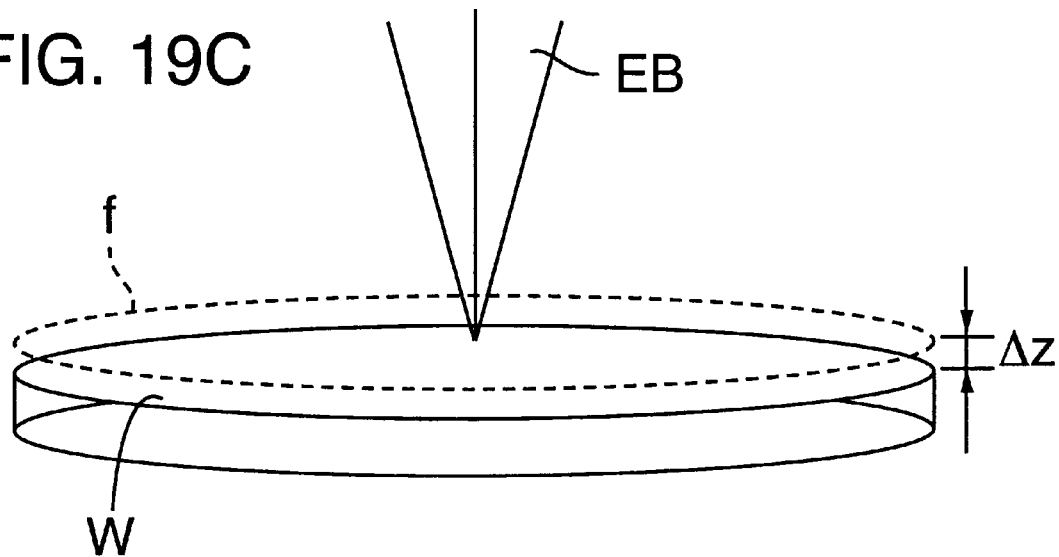
FIG. 19C is a schematic perspective view of a focus error.

With reference to FIGS. 18A–18B, the marks 5200A–5200D are projected as respective images 518A–518D along sides of a square subfield image 519. The positions of the images 518A–518D (and thus of marks 5400A–5400D) are measured by irradiating each of marks 5200A–5200D with the electron beam EB and then using the so-called mark-detection method, as will be described next.

If there is a magnification error or rotation error in the subfield image 19, then the mark images 518A–518D are shifted from the subfield image 519 and from the marks 5400A–5400D. A magnification error in the subfield image 519 is illustrated in FIG. 18A. An image 519A is an ideal image (i.e., an image without magnification or rotation error). A distance Y1 between the centers of the mark images 518A, 518B and parallel to the Y-axis, and a distance X1 between the centers of the images 518C, 518D and parallel to the X-axis, are measured. The magnification in the Y- and X-directions are calculated by comparing the distances X1, Y1 with corresponding distances with respect to the marks 5400A–5400D. The magnification error is then obtained from the calculated magnification and the design (ideal) magnification.

With reference to FIG. 18B, the subfield image 519 is rotated relative to the ideal image 519A. A position shift $\Delta X$ parallel to the X-direction of the centers of the images 518A, 518B and a positional shift $\Delta Y$ parallel to the Y-direction of the centers of the images 18C, 18D are measured. The rotational angle $\theta y$ of the Y-axis is then found by dividing the positional shift $\Delta X$ by the distance in the Y-direction between the two mark images 518A, 518B; the rotational angle $\theta x$ of the X-axis is found by dividing the positional shift $\Delta Y$ by the distance in the X-direction between the images 518C, 518D. The rotational error for each axis is then found by subtracting the design (ideal) rotation from the measured rotational angles $\theta y$ and $\theta x$.

A measurement procedure is as follows. First, the electron beam EB irradiates the mark 5200A of the subfield 502I. The transmitted electron beam EB is deflected by deflector 513 and scans the mark 5400A on the wafer. Electrons reflected from the mark 5400A are detected by the electron detector 514. The signal is processed by the signal processor 515 and communicated to the main control system 516. The irradiation position of the electron beam EB is controlled so that, while image 5200A is scanned, the marks 5200–5200D are not irradiated by the electron beam EB.

Similarly, the mark 5400B of the transfer subfield 540I is scanned by the electron-beam image of marks 5200B of the subfield 52I, mark 5400C of the projection subfield 540I is scanned by the electron-beam image of mark 5200C, and mark 5400D of the projection subfield 540I is scanned by the electron-beam image of mark 5200D, and the various relative positions of mark-image 518A and mark 5400A, mark image 518B and mark 5400B, mark image 518C and mark 5400C, and mark image 518D and mark 5400D are measured. The magnification error and rotation error are then calculated by the main control system 16 based on these measured values.

After the magnification error and/or rotation error are calculated, the main controller 516 adjusts the currents $I_1$, . . . , $I_7$, of the correcting lenses $L_1$, . . ., $L_7$ to minimize or reduce the magnification error and/or the rotation error, without introducing hybrid distortion, i.e., while satisfying Equation Set 3-3.

While the CPB apparatus of Example Embodiment 3 uses magnetic lenses, similar corrections can be done with electrostatic lenses. If electrostatic lenses are used, the currents I in the equations are replaced with voltages. In addition, the rotation error and/or magnification error are measured using the signal S, but can be measured in other ways as well.

Incidentally, it is known that according to aberration theory of electron optical systems when an electron beam is deflected, new deflection aberrations are generated in addition to aberrations arising from the focusing lenses, thereby increasing the defocusing and distortion of the image compared to when deflection is not performed. For example, an electron beam that is deflected passes along a different trajectory away from the optical axis compared to before deflection. The imaging power of a condenser lens changes with increasing distance from the optical axis in that the imaging power generally gets stronger with greater deflection. Because of this, with a deflected electron beam, deflection field curvature is generated which converges the focal point at a point closer to the reticle from the wafer surface than would otherwise be the case if the electron beam had not been deflected. This causes the image to be defocused on the wafer surface.

In addition, since deflecting the electron beam causes the electron beam to pass outside the center of the lens, the magnetic field or electrical field received from the lens is not rotationally symmetrical around the axis of the electron beam. This causes the imaging power of the lens to differ according to the azimuth angle within the electron beam. As a result, the focal position of the lens differs depending on the azimuth angle within the electron beam, generating so-called deflection astigmatism.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A charged-particle-beam pattern-transfer apparatus that projects a pattern from a subfield of a mask onto a transfer region of a wafer or other substrate, comprising:

a correction system situated on an optical axis between the mask and the wafer and that corrects at least one of rotational error, magnification error, and focus error in an image of the subfield projected onto the wafer; and a number of error-correcting lenses greater than or equal to a number of aberrations generated by the correction system and corrected by the error-correcting lenses.

2. The apparatus of claim 1, wherein the correction system and the error-correcting lenses are adjusted to correct at least one of rotational error, magnification error, and focus error in an image of the subfield projected onto the wafer by adjusting a current supplied to the correction system or the error-correcting lenses.

3. The apparatus of claim 2, wherein the number of error-correcting lenses is (m+2n), wherein m is a number of errors to be corrected and n is a number of aberrations to be corrected, exclusive of deflection field curvature.

4. The apparatus of claim 2, comprising a number of image-correcting lenses that is at least [m+1+2(n−1)], wherein m is a number of errors to be corrected and n is a number of aberrations to be corrected, including deflection field curvature.

5. The apparatus of claim 1, comprising a number of error-correcting lenses that is at least (m+2n), wherein m is a number of errors to be corrected and n is a number of aberrations to be corrected, exclusive of deflection field curvature.

6. The apparatus of claim 1, comprising a number of image-correcting lenses that is at least [m+1+2(n−1)], wherein m is a number of errors to be corrected and n is a number of aberrations to be corrected, including deflection field curvature.

7. A charged-particle-beam pattern-transfer apparatus that projects a pattern from a subfield of a mask onto a transfer region of a wafer or other substrate, comprising a correcting lens system situated on an optical axis between the mask and the wafer and including a first lens and a second lens, and a total number of lenses equal to the number of errors corrected, the first lens correcting at least one of rotational error, magnification error, and focal position error and the second lens correcting at least one aberration generated by the first lens, whereby the errors and aberrations are corrected by adjusting the first and second correcting lenses.

8. A charged-particle-beam pattern-transfer apparatus that projects a pattern from a subfield of a mask onto a corresponding transfer region of a wafer or other substrate with a charged particle beam, the apparatus deflecting the charged particle beam to irradiate the subfield and the corresponding transfer region, the apparatus comprising a dynamic correction system situated on an optical axis between the mask and the wafer and that corrects 3rd-order aberrations proportional to the square or cube of the deflection and 5th-order aberrations proportional to the 2nd to 5th powers of the deflection, the dynamic correction system comprising, for a selected aberration, at least a number of focus-correction coils or astigmatism compensators as listed for the selected aberration as follows:

TABLE 2-4

| No. | Aberration | No. of Astigmatism Compensators | No. of Focus-correction Coils | No. | Aberration | No. of Astigmatism Compensators | No. of Focus-correction Coils |
|---|---|---|---|---|---|---|---|
| 1 | $M_{x,1}(5)\alpha^3<\gamma>^2$ | 1 | 0 | 24 | $M_{as}(5)<\alpha>\gamma^3<\gamma>$ | 1 | 0 |
| 2 | $M_{x,2}(5)\alpha^2<\alpha>\gamma<\gamma>$ | 0 | 2 | 25 | $H_{as,1}(5)<\alpha><\beta>\gamma^3$ | 1 | 0 |
| 3 | $M_{x,3}(5)\alpha<\alpha>^2\gamma^2$ | 1 | 0 | 26 | $H_{as,2}(5)<\alpha>\beta\gamma^2<\gamma>$ | 1 | 0 |
| 4 | $M_{coma,1}(5)\alpha^2\gamma<\gamma>^2$ | 1 | 0 | 27 | $H_{as,2}(5)<\alpha>\beta\gamma^2<\gamma>$ | 0 | 2 |
| 5 | $M_{coma,1}(5)\alpha^2\gamma<\gamma>^2$ | 0 | 2 | 28 | $H_{as,3}(5)<\alpha>\beta<\beta>\gamma^2$ | 1 | 0 |
| 6 | $M_{coma,2}(5)\alpha<\alpha>\gamma^2<\gamma>$ | 1 | 0 | 29 | $H_{as,4}(5)<\alpha>\beta^2\gamma<\gamma>$ | 0 | 2 |
| 7 | $M_{coma,2}(5)\alpha<\alpha>\gamma^2<\gamma>$ | 0 | 2 | 30 | $M_{dis}(3)\gamma^2<\gamma>$ | 1 | 0 |
| 8 | $M_{coma,3}(5)<\alpha>^2\gamma^3$ | 1 | 0 | 31 | $M_{dis}(3)\gamma^2<\gamma>$ | 0 | 2 |
| 9 | $H_{coma,1}(5)\alpha^2<\beta>\gamma<\gamma>$ | 0 | 2 | 32 | $M_{dis}(5)\gamma^3<\gamma>^2$ | 1 | 0 |
| 10 | $H_{coma,2}(5)\alpha^2\beta<\gamma>^2$ | 1 | 0 | 33 | $M_{dis}(5)\gamma^3<\gamma>^2$ | 0 | 2 |
| 11 | $H_{coma,3}(5)\alpha<\alpha><\beta>\gamma^2$ | 1 | 0 | 34 | $H_{dis,2}(3)<\beta>\gamma^2$ | 1 | 0 |
| 12 | $H_{coma,4}(5)\alpha<\alpha>\beta\gamma<\gamma>$ | 0 | 2 | 35 | $H_{dis,1}(5)<\beta>\gamma^3<\gamma>$ | 1 | 0 |
| 13 | $H_{coma,5}(5)<\alpha>^2\beta\gamma^2$ | 1 | 0 | 36 | $H_{dis,1}(3)\beta\gamma<\gamma>$ | 0 | 2 |
| 14 | $M_{fc}(3)\alpha\gamma<\gamma>$ | 0 | 1 | 37 | $H_{dis,2}(5)\beta\gamma^2<\gamma>^2$ | 0 | 2 |
| 15 | $M_{fc}(5)\alpha\gamma^2<\gamma>^2$ | 0 | 1 | 38 | $H_{dis,3}(5)<\beta>^2\gamma^3$ | 1 | 0 |
| 16 | $H_{fc,1}(5)\alpha<\beta>\gamma^2<\gamma>$ | 1 | 0 | 39 | $H_{dis,4}(5)\beta<\beta>\gamma^2<\gamma>$ | 1 | 0 |
| 17 | $H_{fc,1}(5)\alpha<\beta>\gamma^2<\gamma>$ | 0 | 2 | 40 | $H_{dis,4}(5)\beta<\beta>\gamma^2<\gamma>$ | 0 | 2 |
| 18 | $H_{fc,2}(5)\alpha\beta\gamma<\gamma>^2$ | 1 | 0 | 41 | $H_{dis,5}(5)\beta^2\gamma<\gamma>^2$ | 1 | 0 |
| 19 | $H_{fc,2}(5)\alpha\beta\gamma<\gamma>^2$ | 0 | 2 | 42 | $H_{dis,5}(5)\beta^2\gamma<\gamma>^2$ | 0 | 2 |
| 20 | $H_{fc,3}(5)\alpha<\beta>^2\gamma^2$ | 1 | 0 | 43 | $H_{dis,6}(5)\beta^3<\gamma>^2$ | 1 | 0 |
| 21 | $H_{fc,4}(5)\alpha\beta<\beta>\gamma<\gamma>$ | 0 | 2 | 44 | $H_{dis,7}(5)\beta^2<\beta>\gamma<\gamma>$ | 0 | 2 |
| 22 | $H_{fc,5}(5)\alpha\beta^2<\gamma>^2$ | 1 | 0 | 45 | $H_{dis,8}(5)\beta<\beta>^2\gamma^2$ | 1 | 0 |
| 23 | $M_{as}(3)<\alpha>\gamma^2$ | 1 | 0 | | | | | wherein parameters are defined as follows:

| Variable Definitions | |
|---|---|
| A | aperture half-angle |
| B | coordinates within a subfield image subfield |
| Γ | beam deflection |
| | Third-order Aberration Coefficients |
| Mfc(3) | deflection image plane distortion |
| Mas(3) | deflection astigmatism |
| Mdis(3) | deflection distortion |
| Hdis,1(3), Hdis,2(3) | hybrid distortion |
| | Fifth-order Aberration Coefficients |
| Mx,1(5)–Mx,3(5) | |
| Mcoma,1(5)–Mcoma,3(5) | |
| Hcoma,1(5)–Hcoma,5(5) | |

-continued

| Variable Definitions |
|---|
| Mfc(5) |
| Hfc,1(5)–Hfc,5(5) |
| Mas(5) |
| Has,1(5)–Has,4(5) |
| Mdis(5) |
| Hdis,1(5)–Hdis,8(5) |

9. A method for projecting a pattern from a subfield of a mask onto a corresponding transfer region of a wafer or other substrate with a charged particle beam, the charged particle beam being deflected to irradiate the subfield and the corresponding transfer region, the method comprising:

(a) creating linear equations for 3rd-order and 5th-order aberrations to be corrected, each of the equations containing at least one of (i) a term corresponding to the aberration to be corrected, (ii) a term corresponding to correction of the aberration with a focus-correction coil and a current supplied to the focus-correction coil, and (iii) a term corresponding to correction of the aberration using an astigmatism compensator and a current supplied to the astigmatism compensator;

(b) determining a number of focus-correction coils Nc and astigmatism compensators Ns such that the equations are satisfied; and (c) adjusting the currents supplied to the focus-correction coils and astigmatism compensators to currents that satisfy the equations.

10. The method of claim 9, further comprising:

providing Nc focus-correction coils and Ns astigmatism compensators;

selecting equations corresponding to the aberrations to be corrected from Equation Set 2-1 for 3rd-order aberrations and Equation Set 2-2 for 5th-order aberrations, wherein Equation Sets 2-1 and 2-2 are:

Equation Set 2-1

$$Mfc(3) \cdot \alpha\gamma\langle\gamma\rangle + \alpha\sum_{j=1}^{Nc} \{\Delta Mfc, c, j(3) \cdot Ic^{(2)}, j\} = 0 \quad (1)$$

$$Mas(3) \cdot \langle\alpha\rangle\gamma^2 + \langle\alpha\rangle\sum_{j=1}^{Ns} \{\Delta Mas, s, j(3) \cdot Is^{(2)}, j\} = 0 \quad (2)$$

$$Mdis(3) \cdot \gamma^2\langle\gamma\rangle + \gamma\sum_{j=1}^{Nc} \{\Delta Mdis, c, j(3) \cdot Ic^{(2)}, j\} + \quad (3)$$
$$\langle\gamma\rangle\sum_{j=1}^{Ns} \{\Delta Mdis, s, j(3) \cdot Is^{(2)}, j\} = 0$$

$$Hdis, 1(3) \cdot \beta\gamma\langle\gamma\rangle + \beta\sum_{j=1}^{Nc} \{\Delta Hdis, c, j(3) \cdot Ic^{(2)}, j\} = 0 \quad (4)$$

$$Hdis, 2(3) \cdot \langle\beta\rangle\gamma^2 + \langle\beta\rangle\sum_{j=1}^{Ns} \{\Delta Hdis, s, j(3) \cdot Is^{(2)}, j\} = 0 \quad (5)$$

Equation Set 2-2

$$Mx, 1(5) \cdot \alpha^3\langle\gamma\rangle^2 + \alpha^3\sum_{j=1}^{Ns} \{\Delta Mx, 1s, j(5) \cdot \langle Is^{(2)}, j\rangle\} = 0 \quad (1)$$

$$Mx, 2(5) \cdot \alpha^2\langle\alpha\rangle\gamma\langle\gamma\rangle + \alpha^2\langle\alpha\rangle\sum_{j=1}^{Nc} \{\Delta Mx, 2c, j(5) \cdot Ic^{(2)}, j\} = 0 \quad (2)$$

$$Mx, 3(5) \cdot \alpha\langle\alpha\rangle^2\gamma^2 + \alpha\langle\alpha\rangle^2\sum_{j=1}^{Ns} \{\Delta Mx, 3s, j(5) \cdot Is^{(2)}, j\} = 0 \quad (3)$$

$$Mcoma, 1(5) \cdot \alpha^2\gamma\langle\gamma\rangle^2 + \alpha^2\langle\gamma\rangle\sum_{j=1}^{Nc} \{\Delta Mcoma, ic, j\{5\} \cdot Ic^{(2)}, j\} + \quad (4)$$
$$\alpha^2\gamma\sum_{j=1}^{Ns} \{\Delta Mcoma, 1s, j(5) \cdot \langle Is^{(2)}, j\rangle\} = 0$$

$$Mcoma, 2(5) \cdot \alpha\langle\alpha\rangle\gamma^2\langle\gamma\rangle + \alpha\langle\alpha\rangle\gamma\sum_{j=1}^{Nc} \{\Delta Mcoma, 2c, j(5) \cdot Ic^{(2)}, j\} + \quad (5)$$
$$\alpha\langle\alpha\rangle\langle\gamma\rangle\sum_{j=1}^{Ns} \{\Delta Mcoma, 2s, j(5) \cdot Is^{(2)}, j\} = 0$$

$$Mcoma, 3(5) \cdot \langle\alpha\rangle^2\gamma^3 + \langle\alpha\rangle^2\gamma\sum_{j=1}^{Ns} \{\Delta Mcoma, 3s, j(5) \cdot Is^{(2)}, j\} = 0 \quad (6)$$

$$Hcoma, 1(5) \cdot \alpha^2\langle\beta\rangle\gamma\langle\gamma\rangle + \alpha^2\langle\beta\rangle\sum_{j=1}^{Nc} \{\Delta Hcoma, 1c, j(5) \cdot Ic^{(2)}, j\} = 0 \quad (7)$$

$$Hcoma, 2(5) \cdot \alpha^2\beta\langle\gamma\rangle^2 + \alpha^2\beta\sum_{j=1}^{Ns} \{\Delta Hcoma, 2s, j(5) \cdot \langle Ic^{(2)}, j\rangle\} = 0 \quad (8)$$

$$Hcoma, \quad (9)$$
$$3(5) \cdot \alpha\langle\alpha\rangle\langle\beta\rangle\gamma^2 + \alpha\langle\alpha\rangle\langle\beta\rangle\sum_{j=1}^{Ns} \{\Delta Hcoma, 3s, j(5) \cdot Is^{(2)}, j\} = 0$$

$$Hcoma, 4(5) \cdot \alpha\langle\alpha\rangle\beta\gamma\langle\gamma\rangle + \alpha\langle\alpha\rangle\beta\sum_{j=1}^{Nc} \{\Delta Hcoma, 4c, j(5) \cdot Ic^{(2)}, j\} = 0 \quad (10)$$

$$Hcoma, 5(5) \cdot \langle\alpha\rangle^2\beta\gamma^2 + \langle\alpha\rangle^2\beta\sum_{j=1}^{Ns} \{\Delta Hcoma, 5s, j(5) \cdot Is^{(2)}, j\} = 0 \quad (11)$$

$$Mfc(5) \cdot \alpha\gamma^2\langle\gamma\rangle^2 + \alpha\gamma\langle\gamma\rangle\sum_{j=1}^{Nc} \{\Delta Mfc, c, j(5) \cdot Ic^{(2)}, j\} + \quad (12)$$
$$\alpha\gamma^2\sum_{j=1}^{Ns} \{\Delta Mfc, s1, j(5) \cdot \langle Is^{(2)}, j\rangle\} +$$
$$\alpha\langle\gamma\rangle^2\sum_{j=1}^{Ns} \{\Delta Mfc, s2, j(5) \cdot Is^{(2)}, j\} +$$
$$\alpha\sum_{j=1}^{Nc} \{\Delta Mfc, c, j(3) \cdot Ic^{(4)}, j\} = 0$$

$$Hfc, 1(5) \cdot \alpha\langle\beta\rangle\gamma^2\langle\gamma\rangle + \alpha\langle\beta\rangle\gamma\sum_{j=1}^{Nc} \{\Delta Hfc, 1c, j(5) \cdot Ic^{(2)}, j\} + \quad (13)$$
$$\alpha\langle\beta\rangle\langle\gamma\rangle\sum_{j=1}^{Ns} \{\Delta Hfc, 1s, j(5) \cdot Is^{(2)}, j\} = 0$$

-continued $$Hfc, 2(5) \cdot \alpha\beta\gamma\langle\gamma\rangle^2 + \alpha\beta\langle\gamma\rangle \sum_{j=1}^{Nc} \{\Delta Hfc, 2c, j(5) \cdot Ic^{(2)}, j\} + \alpha\beta\gamma\sum_{j=1}^{Ns}\{\Delta Hfc, 2s, j(5)\cdot\langle Is^{(2)}, j\rangle\} = 0 \quad (14)$$

$$Hfc, 3(5) \cdot \alpha\langle\beta\rangle^2\gamma^2 + \alpha\langle\beta\rangle^2 \sum_{j=1}^{Ns} \{\Delta Hfc, 3s, j(5) \cdot Is^{(2)}, j\} = 0 \quad (15)$$

$$Hfc, 4(5) \cdot \alpha\beta\langle\beta\rangle\gamma\langle\gamma\rangle + \alpha\beta\langle\beta\rangle \sum_{j=1}^{Nc} \{\Delta Hfc, 4c, j(5) \cdot Ic^{(2)}, j\} = 0 \quad (16)$$

$$Hfc, 5(5) \cdot \alpha\beta^2\langle\gamma\rangle^2 + \alpha\beta^2 \sum_{j=1}^{Ns} \{\Delta Hfc, 5s, j(5)\cdot\langle Is^{(2)}, j\rangle\} = 0 \quad (17)$$

$$Mas(5)\cdot\langle\alpha\rangle\gamma^3\langle\gamma\rangle + \langle\alpha\rangle\gamma^2\sum_{j=1}^{Nc}\{\Delta Mas, c, j(5)\cdot Ic^{(2)}, j\} + \langle\alpha\rangle\gamma\langle\gamma\rangle\sum_{j=1}^{Ns}\{\Delta Mas, s, j(5)\cdot Is^{(2)}, j\} + \langle\alpha\rangle\sum_{j=1}^{Ns}\{\Delta Mas, s, j(3)\cdot Is^{(4)}, j\} = 0 \quad (18)$$

$$Has, 1(5)\cdot\langle\alpha\rangle\langle\beta\rangle\gamma^3 + \langle\alpha\rangle\langle\beta\rangle\gamma\sum_{j=1}^{Ns}\{\Delta Has, 1s, j(5)\cdot Is^{(2)}, j\} = 0 \quad (19)$$

$$Has, 2(5)\cdot\langle\alpha\rangle\beta\gamma^2\langle\gamma\rangle + \langle\alpha\rangle\beta\gamma\sum_{j=1}^{Nc}\{\Delta Has, 2c, j(5)\cdot Ic^{(2)}, j\} + \langle\alpha\rangle\beta\langle\gamma\rangle\sum_{j=1}^{Ns}\{\Delta Has, 2s, j(5)\cdot Is^{(2)}, j\} = 0 \quad (20)$$

$$Has, 3(5)\cdot\langle\alpha\rangle\beta\langle\beta\rangle\gamma^2 + \langle\alpha\rangle\beta\langle\beta\rangle\sum_{j=1}^{Ns}\{\Delta Has, 3s, j(5)\cdot Is^{(2)}, j\} = 0 \quad (21)$$

$$Has, 4(5)\cdot\langle\alpha\rangle\beta^2\gamma\langle\gamma\rangle + \langle\alpha\rangle\beta^2\sum_{j=1}^{Nc}\{\Delta Has, 4c, j(5)\cdot Ic^{(2)}, j\} = 0 \quad (22)$$

$$Mdis(5)\cdot\gamma^3\langle\gamma\rangle^2 + \gamma^2\langle\gamma\rangle\sum_{j=1}^{Nc}\{\Delta Mdis, c, j(5)\cdot Ic^{(2)}, j\} + \gamma^3\sum_{j=1}^{Ns}\{\Delta Mdis, s1, j(5)\cdot\langle Is^{(2)}, j\rangle\} + \gamma\langle\gamma\rangle^2\sum_{j=1}^{Ns}\{\Delta Mdis, s2, j(5)\cdot Is^{(2)}, j\} + \gamma\sum_{j=1}^{Nc}\{\Delta Mdis, c, j(3)\cdot Ic^{(4)}, j\} + \langle\gamma\rangle\sum_{j=1}^{Ns}\{\Delta Mdis, s, j(3)\cdot Is^{(4)}, j\} = 0 \quad (23)$$

$$Hdis, 1(5)\cdot\langle\beta\rangle\gamma^3\langle\gamma\rangle + \langle\beta\rangle\gamma^2\sum_{j=1}^{Nc}\{\Delta Hdis, 1c, j(5)\cdot Ic^{(2)}, j\} + \langle\beta\rangle\gamma\langle\gamma\rangle\sum_{j=1}^{Ns}\{\Delta Hdis, 1s, j(5)\cdot Is^{(2)}, j\} + \langle\beta\rangle\sum_{j=1}^{Ns}\{\Delta Hdis, s, j(3)\cdot Is^{(4)}, j\} = 0 \quad (24)$$

$$Hdis, 2(5)\cdot\beta\gamma^2\langle\gamma\rangle^2 + \beta\gamma\langle\gamma\rangle\sum_{j=1}^{Nc}\{\Delta Hdis, 2c, j(5)\cdot Ic^{(2)}, j\} + \beta\gamma^2\sum_{j=1}^{Ns}\{\Delta Hdis, 2s1, j(5)\cdot\langle Is^{(2)}, j\rangle\} + \beta\langle\gamma\rangle^2\sum_{j=1}^{Ns}\{\Delta Hdis, 2s2, j(5)\cdot Is^{(2)}, j\} + \langle\beta\rangle\sum_{j=1}^{Nc}\{\Delta Hdis, c, j(3)\cdot Ic^{(4)}, j\} = 0 \quad (25)$$

$$Hdis, 3(5)\cdot\langle\beta\rangle^2\gamma^3 + \langle\beta\rangle^2\gamma\sum_{j=1}^{Ns}\{\Delta Hdis, 3s, j(5)\cdot Is^{(2)}, j\} = 0 \quad (26)$$

$$Hdis, 4(5)\cdot\beta\langle\beta\rangle\gamma^2\langle\gamma\rangle + \beta\langle\beta\rangle\gamma\sum_{j=1}^{Nc}\{\Delta Hdis, 4c, j(5)\cdot Ic^{(2)}, j\} + \beta\langle\beta\rangle\langle\gamma\rangle\sum_{j=1}^{Ns}\{\Delta Hdis, 4s, j(5)\cdot Is^{(2)}, j\} = 0 \quad (27)$$

$$Hdis, 5(5)\cdot\beta^2\gamma\langle\gamma\rangle^2 + \beta^2\langle\gamma\rangle\sum_{j=1}^{Nc}\{\Delta Hdis, 5c, j(5)\cdot Ic^{(2)}, j\} + \beta^2\gamma\sum_{j=1}^{Ns}\{\Delta Hdis, 5s, j(5)\cdot\langle Is^{(2)}, j\rangle\} = 0 \quad (28)$$

$$Hdis, 6(5)\cdot\beta^3\langle\gamma\rangle^2 + \beta^3\sum_{j=1}^{Ns}\{\Delta Hdis, 6s, j(5)\cdot\langle Is^{(2)}, j\rangle\} = 0 \quad (29)$$

$$Hdis, 7(5)\cdot\beta^2\langle\beta\rangle\gamma\langle\gamma\rangle + \beta^2\langle\beta\rangle\sum_{j=1}^{Nc}\{\Delta Hdis, 7c, j(5)\cdot Ic^{(2)}, j\} = 0 \quad (30)$$

$$Hdis, 8(5)\cdot\beta\langle\beta\rangle^2\gamma^2 + \beta\langle\beta\rangle^2\sum_{j=1}^{Ns}\{\Delta Hdis, 8s, j(5)\cdot Is^{(2)}, j\} = 0 \quad (31)$$

wherein the parameters in these equations are defined as follows:

Variable Definitions

| Variable Definitions | |
|---|---|
| $\alpha$ | aperture half-angle |
| $\beta$ | coordinates within a subfield image subfield |
| $\gamma$ | beam deflection |

| Third-order Aberrations | |
|---|---|
| Third-order Aberration Coefficients | |
| Mfc(3) | deflection field curvature |
| Mas(3) | deflection astigmatism |
| Mdis(3) | deflection distortion |
| Hdis,1(3), Hdis,2(3) | hybrid distortion |
| Aberration Correction Coefficients for the Focus-correction Coils | |
| $\Delta$Mfc,c,j(3), | deflection field curvature |
| $\Delta$Mdis,c,j(3), | deflection distortion |
| $\Delta$Hdis,c,j(3) | hybrid distortion |

-continued

| Third-order Aberrations | |
|---|---|
| Aberration Correction Coefficients for the Astigmatism Compensators | |
| $\Delta Mas,s,j(3)$, | deflection astigmatism |
| $\Delta Mdis,s,j(3)$, | deflection distortion |
| $\Delta Hdis,s,j(3)$ | hybrid distortion |

| Fifth-order Aberrations. | |
|---|---|
| Mx,1(5)-Mx,3(5) | coefficients of the |
| Mcoma,1(5)-Mcoma,3(5) | 5th-order |
| Hcoma,1(5)-Hcoma,5(5) | Aberrations |
| Mfc(5) | |
| Hfc,1(5)-Hfc,5(5) | |
| Mas(5) | |
| Has,1(5)-Has,4(5) | |
| Mdis(5) | |
| Hdis,1(5)-Hdis,8(5) | |
| $\Delta Mx,2c,j(5)$ | 5th-order |
| $\Delta Mcoma,1c,h(5)$, $\Delta Mcoma,2c,j(5)$ | aberration- |
| $\Delta Hcoma,1c,j(5)$, $\Delta Hcoma,4c,j(5)$ | correction |
| $\Delta Mfc,c,j(5)$ | coefficients for |
| $\Delta Hfc,1c,j(5)$, $\Delta Hfc,2c,j(5)$, $\Delta Hfc,4c,j(5)$ | the 5th-order |
| $\Delta Mas,c,j(5)$ | aberrations for the |
| $\Delta Has,2c,j(5)$, $\Delta Has,4c,j(5)$ | focus-correction |
| $\Delta Mdis,c,j(5)$ | coils |
| $\Delta Hdis,1c,j(5)$, $\Delta Hdis,2c,j(5)$, $\Delta Hdis,4c,j(5)$ | |
| $\Delta Hdis,5c,j(5)$, $\Delta Hdis,7c,j(5)$ | |
| $\Delta Mx,1s,j(5)$, $\Delta Mx,3s,j(5)$ | 5th-order |
| $\Delta Mcoma,1s,j(5)$-$\Delta Mcoma,3s,j(5)$ | aberration- |
| $\Delta Hcoma,2s,j(5)$, $\Delta Hcoma,3s,j(5)$ | correction |
| $\Delta Hcoma,5s,j(5)$ | coefficients for |
| $\Delta Mfc,s1,j(5)$, $\Delta Mfc,s2,j(5)$ | the 5th-order |
| $\Delta Hfc,1s,j(5)$, $\Delta Hfc,2s,j(5)$, $\Delta Hfc,3s,j(5)$ | aberrations for the |
| $\Delta Hfc,5s,j(5)$ | astigmatism |
| $\Delta Mas,s,j(5)$ | compensators |
| $\Delta Has,1s,j(5)$-$\Delta Has,3s,j(5)$ | |
| $\Delta Mdis,s1,j(5)$, $\Delta Mdis,s2,j(5)$ | |
| $\Delta Hdis,1s,j(5)$, $\Delta Hdis,2s1,j(5)$ $\Delta Hdis,2s2,j(5)$ | |
| $\Delta Hdis,3s,j(5)$-$\Delta Hdis,6s,j(5)$ | |
| $\Delta Hdis,8s,j(5)$ | | adjusting currents $Ic(2),j$, $Ic(4),j$ of the Nc focus-correction coils to values that satisfy the equations; and adjusting the currents $Is(2),j$, $Is(4),j$ of the Ns astigmatism compensators to values that satisfy the equations.

11. A charged-particle-beam pattern-transfer apparatus for transferring patterns from a subfield of a mask to a corresponding transfer region of a wafer or other substrate with a charged particle beam, the charged particle beam being deflected as required to irradiate the subfield and the transfer region, the apparatus comprising:

(a) a dynamic correction system including Nc focus-correction coils and Ns astigmatism compensators, the dynamic correction systems correcting 3rd-order aberrations proportional to the squares and cubes of the deflection of the charged particle beam; and (b) a controller that controls the dynamic correction system, wherein Nc and Ns are selected so that Equation Set 2-1 is satisfied and the controller adjusts the currents of each of the focus-correction coils to $Ic^{(2)},j$ and the astigmatism compensators to $Is^{(2)},j$, respectively, wherein $Ic^{(2)},j$ and $Is^{(2)},j$ are solutions of Equation Set 2-1.

Equation-Set 2-1

$$Mfc(3) \cdot \alpha\gamma\langle\gamma\rangle + \alpha\sum_{j=1}^{Nc} \{\Delta Mfc, c, j(3) \cdot Ic^{(2)}, j\} = 0 \quad (1)$$

$$Mas(3) \cdot \langle\alpha\rangle\gamma^2 + \langle\alpha\rangle\sum_{j=1}^{Ns} \{\Delta Mas, s, j(3) \cdot Is^{(2)}, j\} = 0 \quad (2)$$

$$Mdis(3) \cdot \gamma^2\langle\gamma\rangle + \gamma\sum_{j=1}^{Nc} \{\Delta Mdis, c, j(3) \cdot Ic^{(2)}, j\} + \quad (3)$$

$$\langle\gamma\rangle\sum_{j=1}^{Ns} \{\Delta Mdis, s, j(3) \cdot Is^{(2)}, j\} = 0$$

$$Hdis, 1(3) \cdot \beta\gamma\langle\gamma\rangle + \beta\sum_{j=1}^{Nc} \{\Delta Hdis, c, j(3) \cdot Ic^{(2)}, j\} = 0 \quad (4)$$

$$Hdis, 2(3) \cdot \langle\beta\rangle\gamma^2 + \langle\beta\rangle\sum_{j=1}^{Ns} \{\Delta Hdis, s, j(3) \cdot Is^{(2)}, j\} = 0 \quad (5)$$

12. A charged-particle-beam pattern-transfer apparatus for transferring patterns from a subfield of a mask to a corresponding transfer region of a wafer or other substrate with a charged particle beam, the charged particle beam being deflected to irradiate the subfield and the transfer region, the apparatus comprising:

(a) a dynamic correction system including Nc focus-correction coils and Ns astigmatism compensators, the dynamic correction system correcting 5th-order aberrations proportional to the $2^{nd}$ through $5^{th}$ powers of the deflection; and (b) a controller that controls the dynamic correction system, wherein Nc and Ns are selected so that Equation Set 2-2 is satisfied and the controller adjusts the currents of each of the focus-correction coils to $Ic^{(2)},j$ and the astigmatism compensators to $Is^{(2)},j,Is^{(4)},j$ and $Is^{(2)},j, Is^{(4)}$, respectively, wherein the currents are solutions of Equation Set 2-2, wherein Equation Set 2-2 is:

Equation Set 2-2

$$Mx, 1(5) \cdot \alpha^3\langle\gamma\rangle^2 + \alpha^3\sum_{j=1}^{Ns} \{\Delta Mx, 1s, j(5) \cdot \langle Is^{(2)}, j\rangle\} = 0 \quad (1)$$

$$Mx, 2(5) \cdot \alpha^2\langle\alpha\rangle\gamma\langle\gamma\rangle + \alpha^2\langle\alpha\rangle\sum_{j=1}^{Nc} \{\Delta Mx, 2c, j(5) \cdot Ic^{(2)}, j\} = 0 \quad (2)$$

$$Mx, 3(5) \cdot \alpha\langle\alpha\rangle^2\gamma^2 + \alpha\langle\alpha\rangle^2\sum_{j=1}^{Ns} \{\Delta Mx, 3s, j(5) \cdot Is^{(2)}, j\} = 0 \quad (3)$$

$$Mcoma, 1(5) \cdot \alpha^2\gamma\langle\gamma\rangle^2 + \alpha^2\langle\gamma\rangle\sum_{j=1}^{Nc} \{\Delta Mcoma, ic, j\{5\} \cdot Ic^{(2)}, j\} + \quad (4)$$

$$\alpha^2\gamma\sum_{j=1}^{Ns} \{\Delta Mcoma, 1s, j(5) \cdot \langle Is^{(2)}, j\rangle\} = 0$$

$$Mcoma, 2(5) \cdot \alpha\langle\alpha\rangle\gamma^2\langle\gamma\rangle + \alpha\langle\alpha\rangle\gamma\sum_{j=1}^{Nc} \{\Delta Mcoma, 2c, j(5) \cdot Ic^{(2)}, j\} + \quad (5)$$

$$\alpha\langle\alpha\rangle\langle\gamma\rangle\sum_{j=1}^{Ns} \{\Delta Mcoma, 2s, j(5) \cdot Is^{(2)}, j\} = 0$$

$$Mcoma, 3(5) \cdot \langle\alpha\rangle^2 \gamma^3 + \langle\alpha\rangle^2 \gamma \sum_{j=1}^{Ns} \{\Delta Mcoma, 3s, j(5) \cdot Is^{(2)}, j\} = 0 \quad (6)$$

$$Hcoma, 1(5) \cdot \alpha^2 \langle\beta\rangle \gamma \langle\gamma\rangle + \alpha^2 \langle\beta\rangle \sum_{j=1}^{Nc} \{\Delta Hcoma, 1c, j(5) \cdot Ic^{(2)}, j\} = 0 \quad (7)$$

$$Hcoma, 2(5) \cdot \alpha^2 \beta \langle\gamma\rangle^2 + \alpha^2 \beta \sum_{j=1}^{Ns} \{\Delta Hcoma, 2s, j(5) \cdot \langle Ic^{(2)}, j\rangle\} = 0 \quad (8)$$

$$Hcoma, 3(5) \cdot \alpha \langle\alpha\rangle \langle\beta\rangle \gamma^2 + \alpha \langle\alpha\rangle \langle\beta\rangle \sum_{j=1}^{Ns} \{\Delta Hcoma, 3s, j(5) \cdot Is^{(2)}, j\} = 0 \quad (9)$$

$$Hcoma, 4(5) \cdot \alpha \langle\alpha\rangle \beta \gamma \langle\gamma\rangle + \alpha \langle\alpha\rangle \beta \sum_{j=1}^{Nc} \{\Delta Hcoma, 4c, j(5) \cdot Ic^{(2)}, j\} = 0 \quad (10)$$

$$Hcoma, 5(5) \cdot \langle\alpha\rangle^2 \beta \gamma^2 + \langle\alpha\rangle^2 \beta \sum_{j=1}^{Ns} \{\Delta Hcoma, 5s, j(5) \cdot Is^{(2)}, j\} = 0 \quad (11)$$

$$Mfc(5) \cdot \alpha \gamma^2 \langle\gamma\rangle^2 + \alpha \gamma \langle\gamma\rangle \sum_{j=1}^{Nc} \{\Delta Mfc, c, j(5) \cdot Ic^{(2)}, j\} + \alpha \gamma^2 \sum_{j=1}^{Ns} \{\Delta Mfc, s1, j(5) \cdot \langle Is^{(2)}, j\rangle\} + \alpha \langle\gamma\rangle^2 \sum_{j=1}^{Ns} \{\Delta Mfc, s2, j(5) \cdot Is^{(2)}, j\} + \alpha \sum_{j=1}^{Nc} \{\Delta Mfc, c, j(3) \cdot Ic^{(4)}, j\} = 0 \quad (12)$$

$$Hfc, 1(5) \cdot \alpha \langle\beta\rangle \gamma^2 \langle\gamma\rangle + \alpha \langle\beta\rangle \gamma \sum_{j=1}^{Nc} \{\Delta Hfc, 1c, j(5) \cdot Ic^{(2)}, j\} + \alpha \langle\beta\rangle \langle\gamma\rangle \sum_{j=1}^{Ns} \{\Delta Hfc, 1s, j(5) \cdot Is^{(2)}, j\} = 0 \quad (13)$$

$$Hfc, 2(5) \cdot \alpha \beta \gamma \langle\gamma\rangle^2 + \alpha \beta \langle\gamma\rangle \sum_{j=1}^{Nc} \{\Delta Hfc, 2c, j(5) \cdot Ic^{(2)}, j\} + \alpha \beta \gamma \sum_{j=1}^{Ns} \{\Delta Hfc, 2s, j(5) \cdot \langle Is^{(2)}, j\rangle\} = 0 \quad (14)$$

$$Hfc, 3(5) \cdot \alpha \langle\beta\rangle^2 \gamma^2 + \alpha \langle\beta\rangle^2 \sum_{j=1}^{Ns} \{\Delta Hfc, 3s, j(5) \cdot Is^{(2)}, j\} = 0 \quad (15)$$

$$Hfc, 4(5) \cdot \alpha \beta \langle\beta\rangle \gamma \langle\gamma\rangle + \alpha \beta \langle\beta\rangle \sum_{j=1}^{Nc} \{\Delta Hfc, 4c, j(5) \cdot Ic^{(2)}, j\} = 0 \quad (16)$$

$$Hfc, 5(5) \cdot \alpha \beta^2 \langle\gamma\rangle^2 + \alpha \beta^2 \sum_{j=1}^{Ns} \{\Delta Hfc, 5s, j(5) \cdot Is^{(2)}, j\} = 0 \quad (17)$$

$$Mas(5) \cdot \langle\alpha\rangle \gamma^3 \langle\gamma\rangle + \langle\alpha\rangle \gamma^2 \sum_{j=1}^{Nc} \{\Delta Mas, c, j(5) \cdot Ic^{(2)}, j\} + \langle\alpha\rangle \gamma \langle\gamma\rangle \sum_{j=1}^{Ns} \{\Delta Mas, s, j(5) \cdot Is^{(2)}, j\} + \langle\alpha\rangle \sum_{j=1}^{Ns} \{\Delta Mas, s, j(3) \cdot Is^{(4)}, j\} = 0 \quad (18)$$

$$Has, 1(5) \cdot \langle\alpha\rangle \langle\beta\rangle \gamma^3 + \langle\alpha\rangle \langle\beta\rangle \gamma \sum_{j=1}^{Ns} \{\Delta Has, 1s, j(5) \cdot Is^{(2)}, j\} = 0 \quad (19)$$

$$Has, 2(5) \cdot \langle\alpha\rangle \beta \gamma^2 \langle\gamma\rangle + \langle\alpha\rangle \beta \gamma \sum_{j=1}^{Nc} \{\Delta Has, 2c, j(5) \cdot Ic^{(2)}, j\} + \langle\alpha\rangle \beta \langle\gamma\rangle \sum_{j=1}^{Ns} \{\Delta Has, 2s, j(5) \cdot Is^{(2)}, j\} = 0 \quad (20)$$

$$Has, 3(5) \cdot \langle\alpha\rangle \beta \langle\beta\rangle \gamma^2 + \langle\alpha\rangle \beta \langle\beta\rangle \sum_{j=1}^{Ns} \{\Delta Has, 3s, j(5) \cdot Is^{(2)}, j\} = 0 \quad (21)$$

$$Has, 4(5) \cdot \langle\alpha\rangle \beta^2 \gamma \langle\gamma\rangle + \langle\alpha\rangle \beta^2 \sum_{j=1}^{Nc} \{\Delta Has, 4c, j(5) \cdot Ic^{(2)}, j\} = 0 \quad (22)$$

$$Mdis(5) \cdot \gamma^3 \langle\gamma\rangle^2 + \gamma^2 \langle\gamma\rangle \sum_{j=1}^{Nc} \{\Delta Mdis, c, j(5) \cdot Ic^{(2)}, j\} + \gamma^3 \sum_{j=1}^{Ns} \{\Delta Mdis, s1, j(5) \cdot \langle Is^{(2)}, j\rangle\} + \gamma \langle\gamma\rangle^2 \sum_{j=1}^{Ns} \{\Delta Mdis, s2, j(5) \cdot Is^{(2)}, j\} + \gamma \sum_{j=1}^{Nc} \{\Delta Mdis, c, j(3) \cdot Ic^{(4)}, j\} + \langle\gamma\rangle \sum_{j=1}^{Ns} \{\Delta Mdis, s, j(3) \cdot Is^{(4)}, j\} = 0 \quad (23)$$

$$Hdis, 1(5) \cdot \langle\beta\rangle \gamma^3 \langle\gamma\rangle + \langle\beta\rangle \gamma^2 \sum_{j=1}^{Nc} \{\Delta Hdis, 1c, j(5) \cdot Ic^{(2)}, j\} + \langle\beta\rangle \gamma \langle\gamma\rangle \sum_{j=1}^{Ns} \{\Delta Hdis, 1s, j(5) \cdot Is^{(2)}, j\} + \langle\beta\rangle \sum_{j=1}^{Ns} \{\Delta Hdis, s, j(3) \cdot Is^{(4)}, j\} = 0 \quad (24)$$

$$Hdis, 2(5) \cdot \beta \gamma^2 \langle\gamma\rangle^2 + \beta \gamma \langle\gamma\rangle \sum_{j=1}^{Nc} \{\Delta Hdis, 2c, j(5) \cdot Ic^{(2)}, j\} + \beta \gamma^2 \sum_{j=1}^{Ns} \{\Delta Hdis, 2s1, j(5) \cdot \langle Is^{(2)}, j\rangle\} + \beta \langle\gamma\rangle^2 \sum_{j=1}^{Ns} \{\Delta Hdis, 2s2, j(5) \cdot Is^{(2)}, j\} + \langle\beta\rangle \sum_{j=1}^{Nc} \{\Delta Hdis, c, j(3) \cdot Ic^{(4)}, j\} = 0 \quad (25)$$

$$Hdis, 3(5) \cdot \langle\beta\rangle^2 \gamma^3 + \langle\beta\rangle^2 \gamma \sum_{j=1}^{Ns} \{\Delta Hdis, 3s, j(5) \cdot Is^{(2)}, j\} = 0 \quad (26)$$

$$Hdis, 4(5) \cdot \beta \langle\beta\rangle \gamma^2 \langle\gamma\rangle + \beta \langle\beta\rangle \gamma \sum_{j=1}^{Nc} \{\Delta Hdis, 4c, j(5) \cdot Ic^{(2)}, j\} + \beta \langle\beta\rangle \langle\gamma\rangle \sum_{j=1}^{Ns} \{\Delta Hdis, 4s, j(5) \cdot Is^{(2)}, j\} = 0 \quad (27)$$

-continued $$Hdis, 5(5) \cdot \beta^2 \gamma \langle \gamma \rangle^2 + \beta^2 \langle \gamma \rangle \sum_{j=1}^{Nc} \{\Delta Hdis, 5c, j(5) \cdot Ic^{(2)}, j\} + \quad (28)$$

$$\beta^2 \gamma \sum_{j=1}^{Ns} \{\Delta Hdis, 5s, j(5) \cdot \langle Is^{(2)}, j \rangle\} = 0$$

$$Hdis, 6(5) \cdot \beta^3 \langle \gamma \rangle^2 + \beta^3 \sum_{j=1}^{Ns} \{\Delta Hdis, 6s, j(5) \cdot \langle Is^{(2)}, j \rangle\} = 0 \quad (29)$$

$$Hdis, 7(5) \cdot \beta^2 \langle \beta \rangle \gamma \langle \gamma \rangle + \beta^2 \langle \beta \rangle \sum_{j=1}^{Nc} \{\Delta Hdis, 7c, j(5) \cdot Ic^{(2)}, j\} = 0 \quad (30)$$

$$Hdis, 8(5) \cdot \beta \langle \beta \rangle^2 \gamma^2 + \beta \langle \beta \rangle^2 \sum_{j=1}^{Ns} \{\Delta Hdis, 8s, j(5) \cdot Is^{(2)}, j\} = 0 \quad (31)$$

13. A charged-particle-beam pattern-transfer apparatus that projects an image of a subfield of a mask onto a transfer region of a wafer or other substrate using a charged particle beam, the apparatus deflecting the charged particle beam to irradiate the subfield and the transfer region, the apparatus comprising a dynamic correction system situated on an optical axis between the mask and the wafer and including a respective number of each of focus-correction coils and astigmatism compensators determined according to aberrations to be corrected, wherein the dynamic correction system corrects aberrations proportional to powers of the deflection of 2 or larger.

14. An aberration-correction method for a charged-particle-beam pattern-transfer apparatus that transfers patterns from a subfield of a mask onto a transfer region of a wafer or other substrate using a charged particle beam and having a correction system that corrects aberrations produced by deflection of the charged particle beam, the method comprising correcting aberrations at a plurality of deflections to be within a predetermined range by adjusting the correction system according the aberration to be canceled from among the aberrations expressed as functions that show a dependence on an aperture half-angle $\alpha$, a position within the transfer region $\beta$, and a deflection $\gamma$ in the following expressions:

$f(\gamma, \langle \gamma \rangle)$ $f_i(\gamma, \langle \gamma \rangle) \cdot X_i$ $f_{i,j}(\gamma, \langle \gamma \rangle) \cdot X_i \cdot X_j$ $f_{i,j,k}(\gamma, \langle \gamma \rangle) \cdot X_i \cdot X_j \cdot X_k$ wherein $f, f_i, f_{i,j}, f_{i,j,k}$ are functions of $\gamma, \langle \gamma \rangle$, $X1=\alpha$, $X2=\langle \alpha \rangle$, $X3=\beta$, and $X4=\langle \beta \rangle$, and i,j,k are integers from 1 to 4 such that $i \leq j \leq k$ except for $(i,j,k)=(2,2,2), (4,2,2), (4,4,2), (4,4,4)$.

15. A method for transferring patterns from respective subfields of a mask to corresponding transfer regions of a wafer or other substrate using a charged particle beam and a charged-particle-beam optical system by sequentially deflecting the charged particle beam to irradiate a selected mask subfield and a corresponding transfer region, comprising:

(a) projecting a pattern from an evaluation mask, the pattern being projected at a plurality of charged-particle-beam deflections;

(b) measuring distortion in the projected pattern for the plurality of charged-particle-beam deflections;

(c) adjusting the charged-particle-beam optical system to compensate for the measured distortion;

(d) providing a dynamic correction system that includes focus-correction coils and astigmatism compensators and adjusting the focus-correction coils and astigmatism compensators to compensate the measured distortion;

(e) providing a plurality of test patterns on a subfield of the evaluation mask;

(f) measuring distortion by irradiating a plurality of the test patterns and measuring the distortion of the test patterns;

(g) separating the measured distortion into a linear distortion component and a higher-order distortion component;

(h) creating equations for the distortion of the linear distortion component and the higher-order distortion component, the equations each containing (a) an aberration term pertaining to the distortion component and (b) an aberration-correction term for a focus-correction coil proportional to a current supplied to the focus-correction coil, or (c) an aberration-correction term for an astigmatism compensator proportional to a current supplied to the astigmatism compensator;

(i) determining a number of focus-correction coils and astigmatism compensators to be provided so that the equations can be satisfied; and (j) adjusting the currents of the focus-correction coils and astigmatism compensators to currents that satisfy the equations.

16. The method of claim 15, wherein the equations are selected from Equation Set 1-1:

Equation Set 1-1

$$f_1(\gamma) \cdot \beta + \beta \sum_{j=1}^{2} \left[ \Delta W_{dc1,j}(1) \cdot \Delta I_{c,j} \right] = 0 \quad (1)$$

$$f_2(\gamma) \cdot \langle \beta \rangle + \langle \beta \rangle \sum_{j=1}^{4} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{4} \left[ \Delta H_{dis1,j}(3) \langle \Delta I_{s,j} \rangle \right] = 0 \quad (3)$$

$$g_2(\gamma) \cdot \beta \langle \beta \rangle \gamma + \beta \langle \beta \rangle \langle \gamma \rangle \sum_{j=1}^{4} \left[ \Delta H_{dis2,j}(3) \cdot \langle \Delta I_{s,j} \rangle \right] = 0 \quad (4)$$

$$g_3(\gamma) \cdot \langle \beta \rangle^2 \gamma + \langle \beta \rangle^2 \langle \gamma \rangle \sum_{j=1}^{4} \left[ \Delta H_{dis3,j}(3) \cdot \langle \Delta I_{s,j} \rangle \right] = 0 \quad (5)$$

where $f_1(\gamma)$ and $f_2(\gamma)$ are linear components of distortion; $g_1(\gamma)$, $g_2(\gamma)$, and $g_3(\gamma)$ are higher-order components of distortion; and $\gamma$ is deflection; $\Delta Wdc1,j(1)$ and $\Delta Wdc2,j(1)$ are coefficients of a charged particle-beam trajectory caused by the focus-correction coils and the astigmatism compensators, respectively, and proportional to $\beta$ or $\langle \beta \rangle$; $\Delta Hdis1,j(3)$, $\Delta Hdis2,j(3)$, and $\Delta Hdis3,j(3)$ are coefficients of 3rd-order distortion aberrations caused by the astigmatism compensators, the method further comprising providing Nc focus-correction coils and Ns astigmatism compensators for the dynamic correction system, and adjusting respective currents supplied to the Nc focus correction coils Ic,j and the Ns astigmatism compensators Is,j so that Equation Set 1-1 is satisfied.

17. A method for transferring patterns from respective subfields of a mask to corresponding transfer regions of a wafer or other substrate using a charged particle beam and a charged-particle-beam optical system by sequentially deflecting the charged particle beam to irradiate a selected mask subfield and a corresponding transfer region, comprising:

(a) projecting a pattern from an evaluation mask, the pattern being projected at a plurality of charged-particle-beam deflections;

(b) measuring distortion in the projected pattern for the plurality of charged-particle-beam deflections;

(c) adjusting the charged-particle-beam optical system to compensate for the measured distortion;

(d) providing a dynamic correction system that includes focus-correction coils and astigmatism compensators and adjusting the focus-correction coils and astigmatism compensators to compensate the measured distortion;

(e) separating the measured distortion into a linear distortion component and a higher-order distortion component;

(f) creating linear equations for the distortion of the linear distortion component and the higher-order distortion component, the equations each containing (a) an aberration term pertaining to the distortion component and (b) an aberration-correction term for a focus-correction coil proportional to a current supplied to the focus-correction coil, or (c) an aberration-correction term for an astigmatism compensator proportional to a current supplied to the astigmatism compensator;

(g) determining a number of focus-correction coils and astigmatism compensators to be provided so that the equations can be satisfied; and (h) adjusting the currents supplied to the focus-correction coils and astigmatism compensators to currents that satisfy the equations.

18. The method of claim 17, wherein the linear equations are selected from Equation Set 1-1:

Equation Set 1-1

$$f_1(\gamma) \cdot \beta + \beta \sum_{j=1}^{2} \left[ \Delta W_{dc1,j}(1) \cdot \Delta I_{c,j} \right] = 0 \quad (1)$$

$$f_2(\gamma) \cdot \langle\beta\rangle + \langle\beta\rangle \sum_{j=1}^{4} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{4} \left[ \Delta H_{dis1,j}(3) \langle \Delta I_{s,j} \rangle \right] = 0 \quad (3)$$

$$g_2(\gamma) \cdot \beta\langle\beta\rangle\gamma + \beta\langle\beta\rangle\langle\gamma\rangle \sum_{j=1}^{4} \left[ \Delta H_{dis2,j}(3) \cdot \langle \Delta I_{s,j} \rangle \right] = 0 \quad (4)$$

$$g_3(\gamma) \cdot \langle\beta\rangle^2 \gamma + \langle\beta\rangle^2 \langle\gamma\rangle \sum_{j=1}^{4} \left[ \Delta H_{dis3,j}(3) \cdot \langle \Delta I_{s,j} \rangle \right] = 0 \quad (5)$$

where $f_1(\gamma)$ and $f_2(\gamma)$ are linear components of distortion; $g_1(\gamma)$, $g_2(\gamma)$, and $g_3(\gamma)$ are higher-order components of distortion; $\gamma$ is deflection; $\Delta Wdc1,j(1)$ and $\Delta Wdc2,j(1)$ are coefficients of a charged particle-beam trajectory caused by the focus-correction coils and the astigmatism compensators, respectively and proportional to $\beta$ or $\langle\beta\rangle$; $\Delta Hdis1,j(3)$, $\Delta Hdis2,j(3)$, and $\Delta Hdis3,j(3)$ are coefficients of 3rd-order distortion aberrations caused by the astigmatism compensators, the method further comprising providing Nc focus-correction coils and Ns astigmatism compensators for the dynamic correction system, and adjusting respective currents of the Nc focus-correction coils Ic,j and the Ns astigmatism compensators Is,j so that Equation Set 1-1 is satisfied.

19. A charged-particle-beam pattern-transfer apparatus that transfers patterns from subfields of a mask to corresponding transfer regions of a wafer or other substrate with a charged particle beam and a charged-particle-beam optical system by sequentially deflecting the charged particle beam to irradiate a selected subfield and a corresponding transfer region, the apparatus comprising:

(a) a memory that stores distortion data corresponding to one or more subfields; and (b) a dynamic correction system situated on an optical axis between the mask and the wafer and that corrects transferred patterns based on the distortion data stored in the memory, wherein the dynamic correcting system includes two focus-correction coils and four astigmatism compensators; and (c) a controller that adjusts currents of the focus-correction coils and astigmatism compensators to Ic,j and Is,j, respectively, that satisfy Equation Set 1-1:

Equation Set 1-1

$$f_1(\gamma) \cdot \beta + \beta \sum_{j=1}^{2} \left[ \Delta W_{dc1,j}(1) \cdot \Delta I_{c,j} \right] = 0 \quad (1)$$

$$f_2(\gamma) \cdot \langle\beta\rangle + \langle\beta\rangle \sum_{j=1}^{4} \left[ \Delta W_{dc2,j}(1) \cdot \Delta I_{s,j} \right] = 0 \quad (2)$$

$$g_1(\gamma) \cdot \beta^2 + \beta^2 \gamma \sum_{j=1}^{4} \left[ \Delta H_{dis1,j}(3) \langle \Delta I_{s,j} \rangle \right] = 0 \quad (3)$$

$$g_2(\gamma) \cdot \beta\langle\beta\rangle\gamma + \beta\langle\beta\rangle\langle\gamma\rangle \sum_{j=1}^{4} \left[ \Delta H_{dis2,j}(3) \cdot \langle \Delta I_{s,j} \rangle \right] = 0 \quad (4)$$

$$g_3(\gamma) \cdot \langle\beta\rangle^2 \gamma + \langle\beta\rangle^2 \langle\gamma\rangle \sum_{j=1}^{4} \left[ \Delta H_{dis3,j}(3) \cdot \langle \Delta I_{s,j} \rangle \right] = 0 \quad (5)$$

where $f_1(\gamma)$ and $f_2(\gamma)$ are linear components of distortion; $g_1(\gamma)$, $g_2(\gamma)$, and $g_3(\gamma)$ are higher-order components of distortion; $\gamma$ is deflection; $\Delta Wdc1,j(1)$ and $\Delta Wdc2,j(1)$ are coefficients of a charged particle beam trajectory caused by the focus correction coils and the astigmatism compensators, respectively, and proportional to $\beta$ or $\langle\beta\rangle$; $\Delta Hdis1,j(3)$, $\Delta Hdis2,j(3)$, and $\Delta Hdis3,j(3)$ are coefficients of 3rd-order distortion aberrations caused by the astigmatism compensators.

* * * * *

UNITED STATES PATENT AND TRADEMARK OFFICE
CERTIFICATE OF CORRECTION

PATENT NO. : 6,222,197 B1
DATED : April 24, 2001
INVENTOR(S) : Shin-Ichi Kojima

It is certified that error appears in the above-identified patent and that said Letters Patent is hereby corrected as shown below:

Title page,
Item [75], Inventors, "Shin-Ich" should be -- Shin-Ichi --.

Column 5,
Line 35, equation (4) should read:

$$-- Mcona,1(5) \cdot \alpha^2 \gamma <\gamma>^2 + \alpha^2 <\gamma> \sum_{j=1}^{Nc} \{\Delta Mcona, Ic, j(5) \cdot Ic^{(2)}, j\}$$
$$+ \alpha^2 \gamma \sum_{j=1}^{Ns} \{\Delta Mcona, Is, j(5) \cdot <Is^{(2)}, j>\} = 0 --$$

Column 8,
Line 55, "$\Delta Hdis,2s1, j(5)$  $\Delta Hdis,2s2, j(5)$" should be -- $\Delta Hdis,2s1, j(5), \Delta Hdis,2s2, j(5)$ --
Line 59, "NC" should be -- Nc --.

Column 9,
Line 5, "Ic($^2$), j" should be -- $Ic^{(2)}$, j --.

Column 12,
Line 40, "$f_{i,j,k}(\gamma, <\gamma>) \cdot X_I \cdot X_j \cdot X_k$" should be -- $f_{i,j,k}(\gamma,<\gamma>) \cdot X_i \cdot X_j \cdot X_k$ --.
Line 57, "is provide" should be -- is provided --.
Line 61, "are provide on subfield" should be -- are provided on a subfield --.

Column 16,
Line 12, "cPB" should be -- CPB --.

Figure 11:
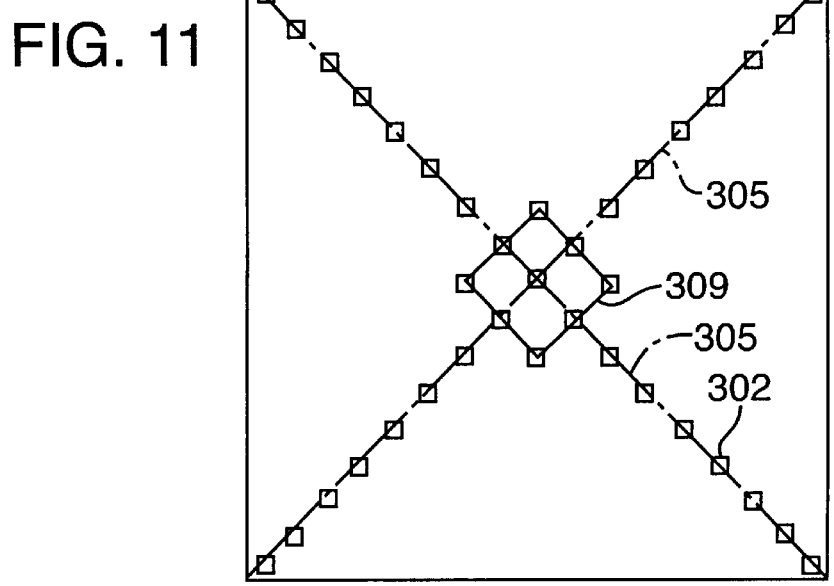
FIG. 11 is schematic plan view of a second representative embodiment of an evaluation mask according to the invention.
Figure 12:
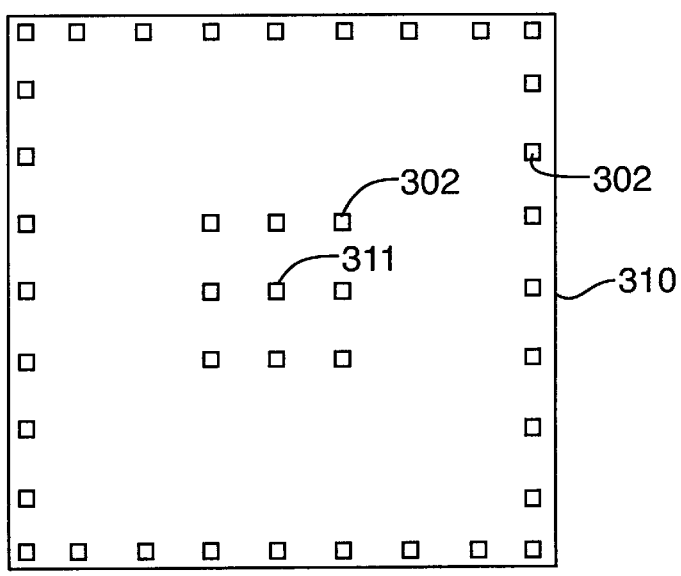
FIG. 12 is a schematic plan view of a third representative embodiment of an evaluation mask according to the invention.

Column 17,
Line 62, "reference FIG. 11" should be -- reference to FIG. 11 --.

Column 19,
Line 11, "K8kai" should be -- Kôkai --.

Column 20,
Line 42, "kokai" should be -- Kôkai --.

UNITED STATES PATENT AND TRADEMARK OFFICE
CERTIFICATE OF CORRECTION

PATENT NO. : 6,222,197 B1
DATED : April 24, 2001
INVENTOR(S) : Shin-Ichi Kojima

It is certified that error appears in the above-identified patent and that said Letters Patent is hereby corrected as shown below:

Column 44,
Line 56, equation (4) should read:

$$-M_{coma,1}\{5\} \cdot \alpha^2 \gamma \langle \gamma \rangle^2 + \alpha^2 \langle \gamma \rangle \sum_{j=1}^{Nc} \{\Delta M_{coma,Ic,j}\{5\} \cdot Ic^{(2)},j\} + \alpha^2 \gamma \sum_{j=1}^{Ns} \{\Delta M_{coma,Is,j}\{5\} \cdot \langle Is^{(2)'},j\rangle\} = 0 -$$

Column 47,
Line 52, "$f_{i,j,k}(\gamma, \langle\gamma\rangle) \cdot X_l \cdot X_j \cdot X_k$" should be -- $f_{i,j,k}(\gamma,\langle\gamma\rangle) \cdot X_i \cdot X_j \cdot X_k$ --.

Signed and Sealed this

Eighteenth Day of January, 2005

JON W. DUDAS
*Director of the United States Patent and Trademark Office*